US008417490B1

(12) United States Patent
Preston et al.

(10) Patent No.: US 8,417,490 B1
(45) Date of Patent: *Apr. 9, 2013

(54) SYSTEM AND METHOD FOR THE CONFIGURATION OF AN AUTOMOTIVE VEHICLE WITH MODELED SENSORS

(75) Inventors: Dan Preston, Bainbridge Island, WA (US); Joseph David Preston, Bainbridge Island, WA (US); Rick Scott Blum, Bainbridge Island, WA (US); Thomas August Manos, Bainbridge Island, WA (US); Kenneth Schofield, Holland, MI (US)

(73) Assignee: Eagle Harbor Holdings, LLC, Bainbridge Island, WA (US)

( * ) Notice: Subject to any disclaimer, the term of this patent is extended or adjusted under 35 U.S.C. 154(b) by 258 days.

This patent is subject to a terminal disclaimer.

(21) Appl. No.: 12/777,608

(22) Filed: May 11, 2010

Related U.S. Application Data

(60) Provisional application No. 61/177,015, filed on May 11, 2009.

(51) Int. Cl.
*G06F 17/50* (2006.01)
*G06F 9/445* (2006.01)

(52) U.S. Cl.
USPC ............. 703/2; 703/13; 703/22; 701/114; 717/138; 717/151

(58) Field of Classification Search .............. 703/2, 13, 703/22; 701/29, 114, 200; 717/138, 151
See application file for complete search history.

(56) References Cited

U.S. PATENT DOCUMENTS

| 2,995,318 A | 8/1961 | Cocharo |
| 4,303,978 A | 12/1981 | Shaw |
| 4,528,563 A | 7/1985 | Takeuchi |
| 4,591,976 A | 5/1986 | Webber |
| 4,829,434 A | 5/1989 | Karmel |
| 4,907,159 A | 3/1990 | Mauge |

(Continued)

FOREIGN PATENT DOCUMENTS

| DE | 3125161 | 1/1983 |
| DE | 42379787 | 5/1994 |

(Continued)

OTHER PUBLICATIONS

Stolowitz Ford Cowger LLP, Listing of Related Cases, Mar. 15, 2011.

(Continued)

*Primary Examiner* — Thai Phan
(74) *Attorney, Agent, or Firm* — Stolowitz Ford Cowger, LLP

(57) ABSTRACT

A system and methods are disclosed for providing integrated software development environment for the design, verification and validation of advanced automotive safety systems. The system allows automotive software to be developed on a host computer using a collection of computer programs running simultaneously as processes and synchronized by a central process. The software disclosed uses separate synchronized processes, permitting signals from disparate sources to be generated by a simulation running on the host computer or from actual sensors and data bus signals coming from and going to actual vehicle hardware which is connected to their bus counterparts in the host computer on a real-time basis. The methods disclosed are for providing an Algorithm Prototyping, Analysis and Test through an integrated framework for dynamic data modeling and application development.

8 Claims, 46 Drawing Sheets

Car/Sensor Integration With Configuration Tools Flow Diagram

U.S. PATENT DOCUMENTS

| | | |
|---|---|---|
| 5,008,678 A | 4/1991 | Herman |
| 5,031,330 A | 7/1991 | Stuart |
| 5,045,937 A | 9/1991 | Myrick |
| 5,111,401 A | 5/1992 | Everett, Jr. |
| 5,115,245 A | 5/1992 | Wen |
| 5,245,909 A | 9/1993 | Corrigan |
| 5,287,199 A | 2/1994 | Zoccolillo |
| 5,303,297 A | 4/1994 | Hillis |
| 5,339,086 A | 8/1994 | DeLuca |
| 5,341,301 A | 8/1994 | Shirai |
| 5,438,361 A | 8/1995 | Coleman |
| 5,471,214 A | 11/1995 | Faibish |
| 5,506,963 A | 4/1996 | Ducateau |
| 5,532,706 A | 7/1996 | Reinhardt |
| 5,552,773 A | 9/1996 | Kuhnert |
| 5,555,503 A | 9/1996 | Kyrtsos et al. |
| 5,572,201 A | 11/1996 | Graham |
| 5,579,219 A | 11/1996 | Mori et al. |
| 5,581,462 A | 12/1996 | Rogers |
| 5,585,798 A | 12/1996 | Yoshioka |
| 5,617,085 A | 4/1997 | Tsutsumi |
| 5,646,612 A | 7/1997 | Byon |
| 5,749,060 A | 5/1998 | Graf |
| 5,751,211 A | 5/1998 | Nishimura |
| 5,761,320 A | 6/1998 | Farinelli |
| 5,786,998 A | 7/1998 | Neeson |
| 5,794,164 A | 8/1998 | Beckert et al. |
| 5,872,508 A | 2/1999 | Taoka |
| 5,898,392 A | 4/1999 | Bambini |
| 5,907,293 A | 5/1999 | Tognazzini |
| 5,915,214 A | 6/1999 | Reece |
| 5,943,427 A | 8/1999 | Massie |
| 5,948,040 A | 9/1999 | DeLorme et al. |
| 5,951,620 A | 9/1999 | Ahrens et al. |
| 5,956,250 A | 9/1999 | Gudat et al. |
| 5,959,536 A | 9/1999 | Chambers |
| 5,963,092 A | 10/1999 | VanZalinge |
| 5,964,822 A | 10/1999 | Alland |
| 5,966,658 A | 10/1999 | Kennedy, III |
| 5,969,598 A | 10/1999 | Kimura |
| 5,977,906 A | 11/1999 | Ameen |
| 5,983,092 A | 11/1999 | Whinnett |
| 5,983,161 A | 11/1999 | Lemelson |
| 6,009,330 A | 12/1999 | Kennedy, III |
| 6,009,403 A | 12/1999 | Sato |
| 6,028,537 A | 2/2000 | Suman |
| 6,028,548 A | 2/2000 | Farmer |
| 6,032,089 A | 2/2000 | Buckely |
| 6,054,950 A | 4/2000 | Fontana |
| 6,060,989 A | 5/2000 | Gehlot |
| 6,061,709 A | 5/2000 | Bronte |
| 6,075,467 A | 6/2000 | Ninagawa |
| 6,097,285 A | 8/2000 | Curtin |
| 6,128,608 A | 10/2000 | Barnhill |
| 6,144,336 A | 11/2000 | Preston |
| 6,148,261 A | 11/2000 | Obradovich |
| 6,150,961 A | 11/2000 | Alewine |
| 6,154,123 A | 11/2000 | Kleinberg |
| 6,161,071 A | 12/2000 | Shuman |
| 6,163,711 A | 12/2000 | Juntunen |
| 6,166,627 A | 12/2000 | Reeley |
| 6,167,253 A | 12/2000 | Farris |
| 6,169,894 B1 | 1/2001 | McCormick |
| 6,175,728 B1 | 1/2001 | Mitama |
| 6,175,782 B1 | 1/2001 | Obradovich |
| 6,181,922 B1 | 1/2001 | Iwai |
| 6,181,994 B1 | 1/2001 | Colson |
| 6,182,006 B1 | 1/2001 | Meek |
| 6,185,491 B1 | 2/2001 | Gray |
| 6,198,996 B1 | 3/2001 | Berstis |
| 6,202,027 B1 | 3/2001 | Alland |
| 6,203,366 B1 | 3/2001 | Muller |
| 6,204,804 B1 | 3/2001 | Andersson |
| 6,226,389 B1 | 5/2001 | Lemelson, III |
| 6,233,468 B1 | 5/2001 | Chen |
| 6,236,652 B1 | 5/2001 | Preston |
| 6,240,365 B1 | 5/2001 | Bunn |
| 6,243,450 B1 | 6/2001 | Jansen |
| 6,252,544 B1 | 6/2001 | Hoffberg |
| 6,275,231 B1 | 8/2001 | Obradovich |
| D448,366 S | 9/2001 | Youngers |
| 6,292,109 B1 | 9/2001 | Murano |
| 6,292,747 B1 | 9/2001 | Amro |
| 6,294,987 B1 | 9/2001 | Matsuda |
| 6,297,732 B2 | 10/2001 | Hsu |
| 6,298,302 B2 | 10/2001 | Walgers |
| 6,314,326 B1 | 11/2001 | Fuchu |
| 6,326,903 B1 | 12/2001 | Gross |
| 6,327,536 B1 | 12/2001 | Tsuji |
| 6,362,748 B1 | 3/2002 | Huang |
| 6,374,286 B1 | 4/2002 | Gee |
| 6,377,860 B1 | 4/2002 | Gray |
| 6,382,897 B2 | 5/2002 | Mattio |
| 6,389,340 B1 | 5/2002 | Rayner |
| 6,401,029 B1 | 6/2002 | Kubota |
| 6,405,132 B1 | 6/2002 | Breed |
| 6,408,174 B1 | 6/2002 | Steijer |
| 6,417,782 B1 | 7/2002 | Darnall |
| 6,421,429 B1 | 7/2002 | Merritt |
| 6,429,789 B1 | 8/2002 | Kiridena |
| 6,429,812 B1 | 8/2002 | Hoffberg |
| 6,430,164 B1 | 8/2002 | Jones |
| 6,442,485 B2 | 8/2002 | Evans |
| 6,445,308 B1 | 9/2002 | Koike |
| 6,452,484 B1 | 9/2002 | Drori |
| 6,484,080 B2 | 11/2002 | Breed |
| 6,487,717 B1 | 11/2002 | Brunemann et al. |
| 6,493,338 B1 | 12/2002 | Preston |
| 6,496,107 B1 | 12/2002 | Himmelstein |
| 6,496,117 B2 | 12/2002 | Gutta |
| 6,496,689 B1 | 12/2002 | Keller |
| 6,505,100 B1 | 1/2003 | Stuempfle |
| 6,515,595 B1 | 2/2003 | Obradovich |
| 6,522,875 B1 | 2/2003 | Dowling |
| 6,542,812 B1 | 4/2003 | Obradovich et al. |
| 6,559,773 B1 | 5/2003 | Berry |
| 6,567,069 B1 | 5/2003 | Bontrager et al. |
| 6,571,136 B1 | 5/2003 | Staiger |
| 6,584,403 B2 | 6/2003 | Bunn |
| D479,228 S | 9/2003 | Sakaguchi et al. |
| 6,614,349 B1 | 9/2003 | Proctor et al. |
| 6,615,137 B2 | 9/2003 | Lutter |
| 6,616,071 B2 | 9/2003 | Kitamura |
| 6,622,083 B1 | 9/2003 | Knockeart |
| 6,629,033 B2 | 9/2003 | Preston |
| 6,641,087 B1 | 11/2003 | Nelson |
| 6,647,270 B1 | 11/2003 | Himmelstein |
| 6,647,328 B2 | 11/2003 | Walker |
| 6,670,912 B2 | 12/2003 | Honda |
| 6,675,081 B2 | 1/2004 | Shuman |
| 6,681,121 B1 | 1/2004 | Preston |
| 6,690,681 B1 | 2/2004 | Preston |
| 6,707,421 B1 | 3/2004 | Drury et al. |
| 6,708,100 B2 | 3/2004 | Russell |
| 6,714,139 B2 | 3/2004 | Saito |
| 6,718,187 B1 | 4/2004 | Takagi et al. |
| 6,725,031 B2 | 4/2004 | Watler |
| 6,734,799 B2 | 5/2004 | Munch |
| 6,738,697 B2 | 5/2004 | Breed |
| 6,771,208 B2 | 8/2004 | Lutter |
| 6,771,629 B1 | 8/2004 | Preston |
| 6,778,073 B2 | 8/2004 | Lutter |
| 6,778,924 B2 | 8/2004 | Hanse |
| 6,782,315 B2 | 8/2004 | Lu |
| 6,785,551 B1 | 8/2004 | Richard |
| 6,792,351 B2 | 9/2004 | Lutter |
| 6,816,458 B1 | 11/2004 | Kroon |
| 6,895,238 B2 | 5/2005 | Newell |
| 6,895,240 B2 | 5/2005 | Laursen |
| 6,901,057 B2 | 5/2005 | Rune |
| 6,906,619 B2 | 6/2005 | Williams |
| 6,920,129 B2 | 7/2005 | Preston |
| 6,925,368 B2 | 8/2005 | Funkhouser et al. |
| 6,937,732 B2 | 8/2005 | Ohmura |
| 6,952,155 B2 | 10/2005 | Himmelstein |
| 6,972,669 B2 | 12/2005 | Saito |
| 6,973,030 B2 | 12/2005 | Pecen |

| | | |
|---|---|---|
| 6,980,092 B2 | 12/2005 | Turnbull |
| 6,993,511 B2 | 1/2006 | Himmelstein |
| 7,000,469 B2 | 2/2006 | Foxlin |
| 7,006,950 B1 | 2/2006 | Greiffenhagen |
| 7,024,363 B1 | 4/2006 | Comerford |
| 7,079,993 B2 | 7/2006 | Stephenson |
| 7,089,206 B2 | 8/2006 | Martin |
| 7,092,723 B2 | 8/2006 | Himmelstein |
| 7,120,129 B2 | 10/2006 | Ayyagari |
| 7,123,926 B2 | 10/2006 | Himmelstein |
| 7,146,260 B2 | 12/2006 | Preston |
| 7,151,768 B2 | 12/2006 | Preston |
| 7,158,956 B1 | 1/2007 | Himmelstein |
| 7,164,662 B2 | 1/2007 | Preston |
| 7,171,189 B2 | 1/2007 | Bianconi |
| 7,178,049 B2 | 2/2007 | Lutter |
| 7,187,947 B1 | 3/2007 | White |
| 7,206,305 B2 | 4/2007 | Preston |
| 7,207,042 B2 | 4/2007 | Smith |
| 7,215,965 B2 | 5/2007 | Fournier et al. |
| 7,221,669 B2 | 5/2007 | Preston |
| 7,239,949 B2 | 7/2007 | Lu |
| 7,249,266 B2 | 7/2007 | Margalit |
| 7,257,426 B1 | 8/2007 | Witkowski |
| 7,263,332 B1 | 8/2007 | Nelson |
| 7,269,188 B2 | 9/2007 | Smith |
| 7,272,637 B1 | 9/2007 | Himmelstein |
| 7,274,988 B2 | 9/2007 | Mukaiyama |
| 7,277,693 B2 | 10/2007 | Chen |
| 7,283,567 B2 | 10/2007 | Preston |
| 7,283,904 B2 | 10/2007 | Benjamin |
| 7,286,522 B2 | 10/2007 | Preston |
| 7,317,696 B2 | 1/2008 | Preston |
| 7,343,160 B2 | 3/2008 | Morton |
| 7,375,728 B2 | 5/2008 | Donath |
| 7,379,707 B2 | 5/2008 | DiFonzo |
| 7,411,982 B2 | 8/2008 | Smith |
| 7,418,476 B2 | 8/2008 | Salesky |
| 7,450,955 B2 | 11/2008 | Himmelstein |
| 7,506,020 B2 | 3/2009 | Ellis |
| 7,508,810 B2 | 3/2009 | Moinzadeh |
| 7,509,134 B2 | 3/2009 | Fournier et al. |
| 7,587,370 B2 | 9/2009 | Himmelstein |
| 7,594,000 B2 | 9/2009 | Himmelstein |
| 7,596,391 B2 | 9/2009 | Himmelstein |
| 7,599,715 B2 | 10/2009 | Himmelstein |
| 7,614,055 B2 | 11/2009 | Buskens et al. |
| 7,664,315 B2 | 2/2010 | Woodfill |
| 7,733,853 B2 | 6/2010 | Moinzadeh et al. |
| 7,747,281 B2 | 6/2010 | Preston |
| 7,848,763 B2 | 12/2010 | Fournier et al. |
| 7,924,934 B2 | 4/2011 | Birmingham |
| 7,966,111 B2 | 6/2011 | Moinzadeh et al. |
| 7,979,095 B2 | 7/2011 | Birmingham |
| 7,983,310 B2 | 7/2011 | Hirano et al. |
| 8,014,942 B2 | 9/2011 | Moinzadeh et al. |
| 8,036,201 B2 | 10/2011 | Moinzadeh et al. |
| 8,036,600 B2 | 10/2011 | Garrett et al. |
| 8,068,792 B2 | 11/2011 | Preston |
| 8,108,092 B2 * | 1/2012 | Phillips et al. .................. 701/23 |
| 2001/0009855 A1 | 7/2001 | L'Anson |
| 2002/0012329 A1 | 1/2002 | Atkinson |
| 2002/0022927 A1* | 2/2002 | Lemelson et al. |
| 2002/0070852 A1* | 6/2002 | Trauner |
| 2002/0095501 A1 | 7/2002 | Chiloyan et al. |
| 2002/0105423 A1 | 8/2002 | Rast |
| 2002/0144010 A1 | 10/2002 | Younis |
| 2002/0144079 A1 | 10/2002 | Willis et al. |
| 2003/0060188 A1 | 3/2003 | Gidron |
| 2003/0158614 A1 | 8/2003 | Friel |
| 2003/0212996 A1 | 11/2003 | Wolzien |
| 2004/0162064 A1 | 8/2004 | Himmelstein |
| 2004/0164228 A1 | 8/2004 | Fogg |
| 2005/0009506 A1 | 1/2005 | Smolentzov |
| 2005/0070221 A1 | 3/2005 | Upton |
| 2005/0130656 A1 | 6/2005 | Chen |
| 2005/0153654 A1 | 7/2005 | Anderson |
| 2005/0251328 A1* | 11/2005 | Merwe et al. .................. 701/200 |
| 2005/0260984 A1 | 11/2005 | Karabinis |
| 2005/0275505 A1* | 12/2005 | Himmelstein |
| 2005/0278712 A1 | 12/2005 | Buskens et al. |
| 2006/0293829 A1* | 12/2006 | Cornwell et al. ............. 701/114 |
| 2007/0115868 A1 | 5/2007 | Chen |
| 2007/0115897 A1* | 5/2007 | Chen |
| 2007/0260372 A1* | 11/2007 | Langer ........................... 701/29 |
| 2007/0260373 A1* | 11/2007 | Langer et al. ................... 701/29 |
| 2008/0092140 A1 | 4/2008 | Doninger et al. |
| 2009/0090592 A1* | 4/2009 | Mordukhovich et al. .... 192/58.2 |

FOREIGN PATENT DOCUMENTS

| | | |
|---|---|---|
| DE | 19922608 | 11/2000 |
| DE | 19931161 | 1/2001 |
| EP | 0 441 576 | 8/1991 |
| EP | 841648 | 5/1998 |
| EP | 1 355 128 | 10/2003 |
| JP | 10-076115 | * 10/1999 |
| JP | 2000207691 | * 7/2000 |
| WO | WO9624229 | 8/1996 |
| WO | WO9908436 | 2/1999 |
| WO | WO9957662 | 11/1999 |
| WO | WO9965183 | 12/1999 |
| WO | WO 0029948 | 5/2000 |
| WO | WO0040038 | 7/2000 |
| WO | WO0130061 | 4/2001 |
| WO | WO0158110 | 8/2001 |

OTHER PUBLICATIONS

A. Das, R. Fierro, V. Kumar, J. Ostrowski, J. Spletzer, and C. Taylor, "A Framework for Vision Based Formation Control", IEEE Transactions on Robotics and Automation, vol. 18, Nov. 5, 2001, pp. 1-13.
Ada 95 Transition Support—Lessons Learned, Sections 3, 4, and 5, CACI, Inc.—Federal, Nov. 15, 1996, 14 pages.
AMIC. Architecture specification release 1, 2001; 35 pages.
Bluetooth Doc; Advance Audio Distribution Profile Specification; Adopted version 1.0; dated May 22, 2003; 75 pages.
Bluetooth Doc; Audio/Video Remote Control Profile; Version 1.0 Adopted; dated May 22, 2003; 52 pages.
Bluetooth Hands-free Profile 1.5 Nov. 25, 2005.
Bluetooth Specification version 1.1; Feb. 22, 2001; 452 pages.
Boeing News Release, "Boeing Demonstrates JSF Avionics Multi-Sensor Fusion", Seattle, WA, May 9, 2000, pp. 1-2.
Boeing Statement, "Chairman and CEO Phil Condit on the JSF Decision", Washington, D.C., Oct. 26, 2001, pp. 1-2.
Counterair: The Cutting Edge, Ch. 2 "The Evolutionary Trajectory The Fighter Pilot—Here to Stay?" AF2025 v3c8-2, Dec. 1996, pp. 1-7.
Counterair: The Cutting Edge, Ch. 4 "The Virtual Trajectory Air Superiority without an "Air" Force?" AF2025 v3c8-4, Dec. 1996, pp. 1-12.
Embedded Bluetooth Migrates to Lisbon and Seattle; 11 pages; Jan. 23, 2008.
Green Hills Software, Inc., "The AdaMULTI 2000 Integrated Development Environment," Copyright 2002, printed Jul. 9, 2002; 7 pages.
H. Chung, L. Ojeda, and J. Borenstein, "Sensor Fusion for Mobile Robot Dead-reckoning with a Precision-calibrated Fiber Optic Gyroscope", 2001 IEEE International Conference on Robotics and Automation, Seoul, Korea, May 21-26, 2001, pp. 1-6.
Hitachi Automated Highway System (AHS), Automotive Products, Hitachi, Ltd., Copyright 1994-2002, 8 pages.
IEEE Standard for Information Technology—POSIX Based Supercomputing Application Environment Profile; Jun. 14, 1995, 72 pages.
ISIS Project: Sensor Fusion, Linkoping University Division of Automatic Control and Communication Systems in cooperation with SAAB (Dynamics and Aircraft), 2001, 18 pages.
J. Takezaki, N. Ueki, T. Minowa, H. Kondoh, "Support System for Safe Driving—A Step Toward ITS Autonomous Driving—", Hitachi Review, vol. 49, Nov. 3, 2000, pp. 1-8.
Joint Strike Fighter Terrain Database, ets-news.com "Simulator Solutions" 2002, 3 pages.
Luttge, Karsten; "E-Charging API: Outsource Charging to a Payment Service Provider"; IEEE; 2001 (pp. 216-222).

M. Chantler, G. Russel, and R. Dunbar, "Probabilistic Sensor Fusion for Reliable Workspace Sensing", Fourth IARP workshop on Underwater Robotics, Genoa, Nov. 1992, pp. 1-14.
MSRC Redacted Proposal, 3.0 Architecture Development, Aug. 29, 2002; pp. 1-43.
MyGig User Guide.
Powerpoint Presentation by Robert Allen—Boeing Phantom Works entitled "Real-Time Embedded Avionics System Security and COTS Operating Systems", Open Group Real-Time Forum, Jul. 18, 2001, 16 pages.
Product description of Raytheon Electronic Systems (ES), Copyright 2002, pp. 1-2.
Product description of Raytheon RT Secure, "Development Environment", Copyright 2001, pp. 1-2.
Product description of Raytheon RT Secure, "Embedded Hard Real-Time Secure Operating System", Copyright 2000, pp. 1-2.
Product description of Raytheon RT Secure, Copyright 2001, pp. 1-2
S.G. Goodridge, "Multimedia Sensor Fusion for Intelligent Camera Control and Human-Computer Interaction", Dissertation submitted to the Graduate Faculty of North Carolina State University in partial fulfillment of the requirements for the degree of Doctor of Philosophy in Electrical Engineering, Raleigh, NC, 1997, pp. 1-5.
Specification of the Bluetooth System v1.0.B; Dec. 1, 1999.
Specification of the Bluetooth System v1.1.B; Feb. 22, 2001.
TNO FEL Annual Review 1998: Quality works, Observation Systems Division; "The Whole is More Than the Sum of its Parts"; 16 pages.
Vehicle Dynamics Lab, University of California, Berkeley, funded by BMW, current members: D. Caveney and B. Feldman, "Adaptive Cruise Control", at least as early as 2002, printed Jul. 2, 2002; 17 pages.

Stirling A: "Mobile Multimedia platforms" Vehicular Technology Conferene Fall 2000. IEEE VTS Fall VTC2000. 52nd Vehicular Technology Conference (CAT. No. 00CH37152).
Nusser R. et al.: "Bluetooth-based wireless connectivity in an automotive environment" Vehicular Technoloty Conference Fall 2000. IEEE VTS Fall VTC2000 52nd Vehicular Techonlogy Conference (Cat. No. 00CH37152).
Martins e f v et al. "design of an OS9 operating system extension for a message-passing multiprocesor" Microprocessors and Microsystems, IPC Business Press LT. London, BG, vol. 21, No. 9, Apr. 1, 1998, pp. 533-543.
Gutierrez Garcia JJ et al. "Minimizing the effects of jitter in distributed hard real-time systems" Journal of Systems Architecture, Elsevier Science Publishers BV., Amsterdam, NL, vol. 41, No. 6/7. Dec. 15, 1996, pp. 431-447.
International Search Report for PCT/US02/020402; Mailing date Apr. 3, 2003.
International Search Report for PCT/US02/020403; Mailing date Jan. 27, 2003.
International Search Report for PCT/US02/016364; Mailing date Feb. 14, 2003.
International Search Report for PCT/US02/016371; Mailing date Aug. 18, 2003.
Stolowitz Ford Cowger Listing of Related Cases May 10, 2010.
Stolowitz Ford Cowger LLP, Listing of Related Cases, Feb. 4, 2011.*
U.S. Appl. No. 12/698,960, filed Feb. 2, 2010, Method and Apparatus for the Alignment of Multi-Aperture Systems, Patent No. 8,001,860.
U.S. Appl. No. 12/698,960, Feb. 2, 2010, Method and Apparatus for the Alignment of Multi-Aperture Systems, Patent No. 8,001,860.
Stolowitz Ford Cowger LLP Listing of Related Cases Oct. 12, 2011.
MyGig User Guide; Mar. 11, 2008.

* cited by examiner

Block Diagram Of The SACore IMM For APAT

Validation Region For Two Tracks And Five Measurements

| θ | Events | $\delta_1$ | $\delta_2$ | $\tau_1$ | $\tau_2$ | $\tau_3$ | $\varphi$ | $\gamma$ |
|---|---|---|---|---|---|---|---|---|
| 1 | $\theta_{01}, \theta_{02}, \theta_{03}$ | 0 | 0 | 0 | 0 | 0 | 3 | $3!(1-P_D)^2/V^3$ |
| 2 | $\theta_{11}, \theta_{02}, \theta_{03}$ | 1 | 0 | 1 | 0 | 0 | 2 | $2!P_D(1-P_D)\Lambda_{11}/V^2$ |
| 3 | $\theta_{01}, \theta_{12}, \theta_{03}$ | 1 | 0 | 0 | 1 | 0 | 2 | $2!P_D(1-P_D)\Lambda_{12}/V^2$ |
| 4 | $\theta_{01}, \theta_{22}, \theta_{03}$ | 0 | 1 | 0 | 1 | 0 | 2 | $2!P_D(1-P_D)\Lambda_{22}/V^2$ |
| 5 | $\theta_{01}, \theta_{02}, \theta_{23}$ | 0 | 1 | 0 | 0 | 1 | 2 | $2!P_D(1-P_D)\Lambda_{23}/V^2$ |
| 6 | $\theta_{11}, \theta_{22}, \theta_{03}$ | 1 | 1 | 1 | 1 | 0 | 1 | $P_D^2\Lambda_{11}\Lambda_{22}/V$ |
| 7 | $\theta_{11}, \theta_{02}, \theta_{23}$ | 1 | 1 | 1 | 0 | 1 | 1 | $P_D^2\Lambda_{11}\Lambda_{23}/V$ |
| 8 | $\theta_{01}, \theta_{12}, \theta_{23}$ | 1 | 1 | 0 | 1 | 1 | 1 | $P_D^2\Lambda_{12}\Lambda_{23}/V$ |

Figure 3

Feasible Joint Association Events For Figure 2

APAT Overview

APAT Model

APAT Model

APAT Process

APAT Process

Radar/Vision - 10 Hz/0 Hz Cross Range & Down Range Error

Radar/Vision - 10 Hz/3 Hz Cross Range & Down Range Error

Radar/Vision - 10 Hz/10 Hz Cross Range & Down Range Error

Radar/Vision - 10 Hz/25 Hz Cross Range & Down Range Error

Performance Improvements Aggregated

Performance Improvement

Performance Optimization

Converting From Polar To Cartesian Coordinates t1 - obtain target raw data
t1 to t2 - process the data received at t1
t2/t1 - output the sensor data at t2 that is valid at t1; obtain new raw data
t2 to t3 - process the data received at t2
t3/t2 - output the sensor data at t3 that is valid at t2; obtain new raw data Out-of-sequence-measurements Joint Probabilistic Data Association IMM Filters IMM Filter Switching Passing Car Right Curve - Car Ahead & Left True Trajectory Data Right Curve - Car Ahead & Left True Relative Trajectory Data IMM Filter Switching Right Curve - Car Ahead & Left

|  | Long range | Medium range |
| --- | --- | --- |
| Max range | 200 meters | 60 meters |
| Min range | 1 meters | .5 meters |
| Horizontal FOV | 20 degrees | 90 degrees |
| Max range rate | 50 m/sec | 50 m/sec |
| Min range rate | -100 m/sec | -100 m/sec |
| Update interval | 50 millisecs | 50 millisecs |
| Range error 1-sigma | .2 meters | .1 meters |
| Angle error 1-sigma | .2 degrees | .4 degrees |
| Rrate error 1-sigma | .0025 m/sec | .0025 m/sec |

Figure 23

Simulated Radar Sensor Values (Table)

Host vehicle – straight ahead at 25 m/sec Target.

1. Approaching two lanes to the left at 25 m/sec.

2. Passing one lane to left at 35 m/sec.

3. Crossing from left to right at 25 m/sec.

4. Start ahead of host 100 meters. Slow down till 20 meters ahead and then speed up and turn off to the right.

5. Pass and cut in front of host and then cut back to left lane.

Host vehicle: Right 90 degree turn at 5 degs/sec and 25 m/sec.

Target: Ahead of host 25 meters and one lane left and making right 90 degree turn; Approaches host on the 90 degree curve at 25 m/sec one lane to the left.

Figure 24

Approaching Car True Relative Trajectory Data

Approaching Car True Relative Trajectory Data

Approaching Car - Radar Only Down Range Position Data (meters)

Approaching Car - Radar Only Down Range Velocity/Acceleration Data

Approaching Car - Radar Only Cross Range Postition Data (meters)

Approaching Car - Radar Only Cross Range Velocity/Acceleration Data

Car/Sensor Integration Flow Diagram

Car/Sensor Integration With Configuration Tools Flow Diagram

Sensor Modeling Process

Car Model And Source Code Creation

TestSensor.ini
[SENSOR_ID]
SOURCE_NAME = "TestSensor"
SOURCE_LOC = "C:\\Program Files\\configuratorfiles\\sensors"
NUMBER = 1
MFR =
MODEL = "TestSensor"
VER = "NEW"
DRIVER_NAME = "TestSensor"

[SENSOR_TYPE]
TYPE = 1
BUS = 2

[SENSOR_BUS]
NUM = 1
ADDR_RNG = 1
PROTOCOL = 1
BAUD = 1000000
TIMEQUANTA = 1
CAN_NUM_ADDR_DATA_RANGES = 1
CAN_ADDR_DATA_MIN_0 = 0
CAN_ADDR_DATA_MAX_0 = 65535
CAN_ADDR_DATA_MIN_1 = 268435456
CAN_ADDR_DATA_MAX_1 = 536870911
CAN_ADDR_DATA_MIN_2 = 0
CAN_ADDR_DATA_MAX_2 = 0
CAN_ADDR_DATA_MIN_3 = 0
CAN_ADDR_DATA_MAX_3 = 0

[SENSOR_CHARACTERISTICS]
CURVE_FIT_ORDER_PN = 0
NUM_ACCURACIES = 1
ASSOC_SENSORS = 1
MAX_TARGETS = 10
FRAME_RATE = 0.1
DATA_TIME_LAG = 0
XPOS_INIT_SIGMA_NOM = 0
YPOS_INIT_SIGMA_NOM = 0
XVEL_INIT_SIGMA_NOM = 0
YVEL_INIT_SIGMA_NOM = 0
XXCL_INIT_SIGMA_NOM = 0
YXCL_INIT_SIGMA_NOM = 0
RR_UPDATE = 160
AR_UPDATE = 160
COORD_TYPE = 0
ERROR_ANGLE = 0
ERROR_ANGLE_RATE = 0

Figure 35

Partial Sensor Model

TrajjTestCarConfigFile.ini
[CAR]
SOURCE_NAME = "TrajjTestCarConfigFile.ini"
SOURCE_LOC = "C:\\Program Files\\configuratorFiles\\cars"
CAR_NUM_SENSORS = 3
CAR_HEIGHT = 2
CAR_MEAS_ORIGIN_Z = 0.5
CAR_LR_X = -4.5
CAR_LR_Y = -1
CAR_RR_X = -4.5
CAR_RR_Y = 1
CAR_LF_X = 0
CAR_LF_Y = -1
CAR_RF_X = 0
CAR_RF_Y = 1
CAR_LR_WH_X = -3.5
CAR_LR_WH_Y = -1
CAR_RR_WH_X = -3.5
CAR_RR_WH_Y = 1
CAR_LF_WH_X = -1
CAR_LF_WH_Y = -1
CAR_RF_WH_X = -1
CAR_RF_WH_Y = 1

[SENSOR_1]
SOURCE_NAME = "TestSensor.ini"
SOURCE_LOC = "C:\\Program Files\\configuratorFiles\\sensors"
MFR =
MODEL = "TrajTest"
VER = "New"
ID = 0
X = -1.507075471698113
Y = -5.551115123125783e-17
Z = 0.5
YAW = 0
PITCH = 0
ROLL = 0

[SENSOR_2]
SOURCE_NAME = "TrajTest.ini"
SOURCE_LOC = "c:\\configuratorFiles\\sensors"
MFR =
MODEL = "TrajTest"
VER = "New"
ID = 1
X = -0.1061320754716985
Y = -0.09259259259259263
Z = 0.5

Figure 36
Partial Car Model init.m - C:\Program Files\configuratorFiles\mathtabfiles\init.m %****************************************
%*
%* init.m created 9:49:6 on 28-Feb-2008,
%* using the following automobile configuration file:
%*
%* TrajjTestCarConfigFile.ini
%*
%* and the following sensor configuration files:
%*
%* C:\Program Files\configuratorFiles\sensors\TestSensor.ini
%* c:\configuratorFiles\sensors\TrajTest.ini
%* c:\configuratorFiles\sensors\TrajTest.ini
%*
%*
%**************************************** function [ ] = init( )

% These variables are used to initiate the fusion filter global sensor_id sensor_xaxis sensor_yaxis sensor_zaxis
global sensor_boresight sensor_pitch sensor_roll
global sensor_number total_sensor_tracks data_time_lag
global posx_sigma_init_sensor posy_sigma_init_sensor velx_sigma_init_sensor
global vely_sigma_init_sensor accx_sigma_init_sensor accy_sigma_init_sensor
global max_range_truck max_range_car max_range_ped max_range_sign
global num_accuracies range_sigma_coeff range_rate_sigma_coeff
global angle_sigma_coeff angle_rate_sigma_coeff width_sigma_coeff
global range_max range_min max_range_rate min_range_rate
global yaw_angle_max yaw_angle_min max_angle_rate min_angle_rate
global sensor_est_rate sensor_coord_type sensor_rrate_update sensor_arate_update
global angle_sigma_sensor_deg angle_rel_sigma_sensor_deg
global ang_rate_sigma_sensor_deg ang_rate_rel_sigma_sensor_deg
global r_sigma_sensor r_rel_sigma_sensor
global r_rate_sigma_sensor r_rate_rel_sigma_sensor
global dr_sigma_sensor dr_rel_sigma_sensor
global dr_rate_sigma_sensor dr_rate_rel_sigma_sensor
global cr_sigma_sensor cr_rel_sigma_sensor
global cr_rate_sigma_sensor cr_rate_rel_sigma_sensor To Figure 37B

Figure 37A
Partial MatLab Source File

From Figure 37A

```
sensor_id = [ 1 2 3 ];
sensor_xaxis = [ -1.507 -0.106 -0.106 ];
sensor_yaxis = [ -0.000 -0.093 0.093 ];
sensor_zaxis = [ 0.500 0.500 0.500 ];
sensor_boresight = [ 0.000 0.000 0.000 ];
sensor_pitch = [ 0.000 0.000 0.000 ];
sensor_roll = [ 0.000 0.000 0.000 ];
total_sensor_tracks = [ 10 1 1 ];
posx_sigma_init_sensor = [ 0.000 0.000 0.000 ];
posy_sigma_init_sensor = [ 0.000 0.000 0.000 ];
velx_sigma_init_sensor = [ 0.000 0.000 0.000 ];
vely_sigma_init_sensor = [ 0.000 0.000 0.000 ];
accx_sigma_init_sensor = [ 0.000 0.000 0.000 ];
accy_sigma_init_sensor = [ 0.000 0.000 0.000 ];
sensor_est_rate = [ 0.100 0.100 0.100 ];
sensor_coord_type = [ 1 1 1 ];
sensor_rrate_update = [ 160.000 160.000 160.000 ];
sensor_arate_update = [ 160.000 160.000 160.000 ];
angle_sigma_sensor_deg = [ 0.000 0.000 0.000 ];
angle_rel_sigma_sensor_deg = [ 0.000 0.000 0.000 ];
ang_rate_sigma_sensor_deg = [ 0.000 0.000 0.000 ];
ang_rate_rel_sigma_sensor_deg = [ 0.000 0.000 0.000 ];
r_sigma_sensor = [ 0.000 0.000 0.000 ];
r_rel_sigma_sensor = [ 0.000 0.000 0.000 ];
```

Figure 37B
Partial MatLab Source File

```
////////////////////////////////////////////////////////////////////////////////////////////////
////////////////////////////////////////////////////////////////////////////////////////////////
//
// Notice:  This file was automatically
// generated and should not be added to,
// deleted from, or otherwise modified.
//
// This header file is targeted for use with multiple
// application and embedded software systems.
// All Rights Reserved.
//
////////////////////////////////////////////////////////////////////////////////////////////////
//
// TrajjTestCarConfigFile.h created 09:48:55 on 28-Feb-2008 using...,
//
// C:\Program Files\Configurator\configurator\source\car.dll
// created: 10:24:18 on 30-Jan-2008
// and
// C:\Program Files\Configurator\configurator\source\configurator.exe
// created: 10:26:12 on 30-Jan-2008
//
// using the following automobile configuration file:
//
// C:\Program Files\configuratorFiles\cars\TrajjTestCarConfigFile.ini
// created: 09:48:39 on 28-Feb-2008
//
// and the following sensor configuration files:
//
// C:\Program Files\configuratorFiles\sensors\TestSensor.ini
// c:\configuratorFiles\sensors\TrajTest.ini
// c:\configuratorFiles\sensors\TrajTest.ini
//
//
////////////////////////////////////////////////////////////////////////////////////////////////
//////////////////////////////////////////////////////////////////////////////////////////////// define CT_MAX_SENSORS            11
define CT_NUM_SENSORS            3
#define CT_MAX_NUM_ACCURACIES     4
#define CT_MAX_PATH_LEN           260
```

To Figure 38B

Figure 38A
Partial ANSI C Source File

From Figure 38A

```c
//START_INCLUDE_HERE//
typedef unsigned char          BYTE;

static int gSensorType = 0;
enum {//enumerates types of sensor applications, used with with CT_SENSOR_TYPE
    CT_NULL_SENS,
    CT_TARGET,
    CT_INERTIAL,
    CT_NAVIGATION,
    CT_MAX_SENS_TYPE
} CT_SENS_TYPE;

enum {// sensor technologies utilized in this tool
    CT_NULL_TECHNOLOGY,
    CT_VISION,
    CT_LIDAR,
    CT_RADAR,
    CT_ULTRA_SOUND,
    MAX_TECHNOLOGY
} CT_TECHNOLOGY;

static int gBusType = 0;
enum {// bus technologies used in this application
    CT_NULL_BUS,
    CT_ETHERNET,
    CT_CAN,
    CT_FLEXRAY,
    CT_MAX_BUS
} CT_BUS_TYPES;

pragma pack (4)  //make following structs compatible with GreenHills compiler typedef struct  {//modifier for variables with a range of values
    double max;
    double min;
    double nom;
} CT_RANGE;

typedef struct  {//sensor - kinematics
    CT_RANGE posx;
    CT_RANGE posy;
    CT_RANGE velx;
```

Figure 38B
Partial ANSI C Source File

APAT Overview

APAT Model

APAT Model

APAT Process

APAT Process

SYSTEM AND METHOD FOR THE CONFIGURATION OF AN AUTOMOTIVE VEHICLE WITH MODELED SENSORS

The present application claims priority to Provisional Patent Application Ser. No. 61/177,015 filed May 11, 2009 which is incorporated by reference in its entirety.
This application incorporates by reference U.S. Pat. Nos.
- 6,629,033 Issued Sep. 30, 2003 Titled—OPEN COMMUNICATION SYSTEM FOR REAL-TIME MULTIPROCESSOR APPLICATIONS;
- 6,771,208 Issued Aug. 3, 2004 Titled—MULTI SENSOR SYSTEM;
- 7,146,260 Issued Dec. 5, 2006 Titled—METHOD AND APPARATUS FOR DYNAMIC CONFIGURATION OF MULTIPROCESSOR SYSTEM;
- 6,792,351 Issued Sep. 14, 2004 Titled—METHOD AND APPARATUS FOR MULTI-VEHICLE COMMUNICATION;
- 6,778,073 Issued Aug. 17, 2004 Titled—METHOD AND APPARATUS FOR MANAGING AUDIO DEVICES;
- 6,615,137 Issued Sep. 2, 2003 Titled—METHOD AND APPARATUS FOR TRANSFERRING INFORMATION BETWEEN VEHICLES;
- 7,178,049 Issued Feb. 13, 2007 Titled—METHOD FOR MULTI-TASKING MULTIPLE JAVA VIRTUAL MACHINES;
- 7,337,650 Issued Mar. 4, 2008 Titled—SYSTEM AND METHOD FOR ALIGNING SENSORS ON A VEHICLE.

COPYRIGHT NOTICE

Contained herein is material that is subject to copyright protection. The copyright owner has no objection to the facsimile reproduction by anyone of the patent document or the patent disclosure, as it appears in the United States Patent and Trademark Office patent file or records, but otherwise reserves all rights to the copyright whatsoever. The following notice applies to the software, screenshots and data as described below and in the drawings hereto and All Rights Reserved.

TECHNICAL FIELD OF THE INVENTION

This invention relates generally to statistical modeling and analysis of automotive safety systems, sensors and application requirements for both performance and cost tradeoffs. This invention relates specifically to the process of designing, building, testing and analyzing system data in a hierarchy of statistical models, driven by the need to implement advanced safety features for the transportation industry.

BACKGROUND

Next generation automotive systems will include numerous electronic systems such as; passive safety systems for airbag deployment and anti-skid braking features; active safety for collision warning and collision avoidance features; and convenience features for Blind Spot Detection (B SD) and Adaptive Cruise Control (ACC). Today the transportation industry is rapidly moving toward solutions that support and enable these systems and new features with the ultimate goal of profitably and developing a more survivable vehicle at costs their customers are willing to pay.

These new systems will require information about the environment, targets in the environment and our relationship to them. This information will be generated from multiple sources to include data from a new class of sensor, termed non-contact sensor, and include non-contact sensors like radar, optical, laser, ultrasonic, etc. These non-contact sensors will generate data about the environment including range measurements and target classification. These systems are similar to those found on advanced tactical fighter aircraft today.

The process of manufacturing a vehicle is not much different today then is was 50 years ago; features are specified for a desired model and year; parts designed; competitively purchased; assembled; and shipped as a complete vehicle. If another feature is desired, it is integrated into the design and bolted on as a complete feature; this approach is referred to as "federated" systems. A key tenant to low cost systems in the future will be a deliberate movement away from federated features and systems, to fully integrated systems design and integrated systems.

Now with a focus on active safety systems, the sensors required to support the features identified above are to some extent common; an optical sensor that supports one optical application could be used for a second optical application; two sensors could be used for one application. In either case, simply sharing data from sensors or other sources to improve knowledge of the environment is incorrectly termed "sensor-fusion" or "multi sensor-fusion" by the transportation industry suppliers.

Those skilled in the art of state estimation, robotics, advanced defense avionics understand academically that sensor-fusion is the art of combining sensory data or data derived from disparate sources such that the resulting information is in some sense "better" than would be possible when these sources were used individually. This process is predicated on the covariance (or the measure of how much two variables vary together) of non-independent sources. The term "better" in the case above can mean more accurate, more complete, more dependable, or refer to the result of an emerging view or state estimation.

The data sources for a fusion process are not specified to originate from identical sources or sensors which may or may not be spatially and temporally aligned. Further one can distinguish direct fusion, indirect fusion and fusion of the outputs of the former two. Direct fusion is the fusion of sensor data from a set of heterogeneous or homogeneous sensors, soft sensors, and history values of sensor data, while indirect fusion uses information sources like a prior knowledge about the environment and human input. Sensor fusion is also known as "multi-sensor data fusion" and is a subset of information fusion through an implementation of the probability theory.

Probability theory is the mathematical study of phenomena characterized by randomness or uncertainty. More precisely, probability is used for modeling situations when the result of a measurement, realized under the same circumstances, produces different results. Mathematicians and actuaries think of probabilities as numbers in the closed interval from 0 to 1 assigned to "events" whose occurrence or failure to occur is random. Two crucial concepts in the theory of probability are those of a random variable and of the probability distribution of a random variable.

Implementing the features described above with affordable instruments requires reliable real-time estimates of system state. Unfortunately, the complete state is not always observable. State Estimation takes all the data obtained and uses it to determine the underlying behavior of the system at any point in time. It includes fault detection, isolation and continuous system state estimation.

There are two parts to state estimation: modeling and algorithms. The overall approach is to use a model to predict the behavior of the system in a particular state, and then compare that behavior with the actual measurements from the instruments to determine which state or states is the most likely to produce the observed system behavior.

This is not well understood or currently implemented in the transportation industry; the approach understood and practiced is logical decisions in linear and deterministic systems. If use cases require higher confidences in measurements, instrument specifications are tightened resulting in the undesired effect of cost and schedule increases. The environment we live and operate in is neither linear nor deterministic; use cases are infinite; and the perverse variability of the targets and potential maneuvers cannot be modeled. The variability of the problem identified above includes aspects other than just spatial (i.e. range and bearing to a target); temporal relationships are part of the fundamental intellectual structure (together with space and number) within which events must be sequenced, quantify the duration of events, quantify the intervals between them, and compare the kinematics of objects.

The automotive industry today implements features in such a way that all aspects are contained within the system (federated) and therefore reasonably controlled. Sharing information like target reports with other features is anticipated and desired; however measurements reported with respect to the integrated system will be historical in nature and received asynchronously. Timing errors can induce more error in the system than a bad measurement. These and other issues can be addressed with the introduction of a suite of modeling tools based on re-thinking the approach of federated systems and focusing on an integrated systems solution based on state estimation.

Central to the successful implementation of the advanced safety systems discussed above is ensuring ability for the system to cope with and recover from emergency situations. If one or more emergency conditions arise, systems of the future must quickly initiate and successfully execute procedures to mitigate the condition and then recover; these procedures must be perfoiined under tight timing constraints, e.g., pre-crash systems.

This patent describes a system and methods necessary to implement a design methodology that will facilitate and support advanced safety systems design, test, verification, and validation; with emphasis on reliable fault tolerant operation. The implementation of this system and methods is termed "Algorithm Prototyping Analysis and Test" or APAT.

As it stands today, there is much art published documenting the research and development in the area of procedure analysis and design. However, there are no systematic and rigorous methodologies for designing procedures to be used in advanced safety systems for the transportation industry. This is currently viewed as a serious shortcoming, since these high-risk and complex systems employ procedures and action sequences that can and do impact life or death results.

In the future it will be the responsibility of the onboard computers to automatically initiate and execute procedures and recovery sequences. Therefore modeling, analysis, verification, and design of these highly critical methods, procedures and recovery sequences are required and are thus the focus of this patent.

In a discussion of Prior Art, U.S. Pat. No. 7,006,950, Statistical Modeling and Performance Characterization of a Real-time Dual Camera Surveillance System, Greiffenhagen, et al.; the invention relates to a method for visually detecting and tracking an object through a space. The method derives statistical models for errors, including quantifying an indexing step performed by an indexing module, and tuning system parameters. Further the method applies a likelihood model for candidate hypothesis evaluation and object parameters estimation for locating the object. This invention relates specifically to computer vision systems, more particularly to a system having computationally efficient real-time object detection, tracking, and zooming capabilities. The need arises for methods of modeling more than 1 data source against features that require an infinitely variable combination of instruments and measurements.

In a discussion of Prior Art, U.S. Pat. No. 6,028,548, Vehicle Collision Radar with Randomized FSK Waveform, Farmer; describes an automotive radar for improved immunity to jamming from other automotive radars utilizing common modeling methods such as Auto Regressive Modeling (ARMA) and Minimum Variance Spectral Estimation which are just two such methods that would be applicable. It is recognized in the art that modeling sequences implemented as tools or embedded systems will yield desired results. As with U.S. Pat. No. 7,006,950, the modeling sequences identified are based on the improvement of federated devices.

In a discussion of Prior Art, U.S. Pat. No. 7,079,993, Automated Generator of Optimal Models for the Statistical Analysis of Data, Stephenson, et al; describes an automated process for producing accurate statistical models from sample data tables designed to solve for optimal parameters of each statistical model considered, computes test statistics and degrees of freedom in the model, and uses these test statistics and degrees of freedom to establish a complete ordering of the statistical models. Stephenson further describes how the process arrives at a statistical model that is highest in the ordering and is thus deemed most suitable to model the sample data table. These techniques are basically described in the general art of data or information fusion and modeling. It would not be obvious that general and well published statistical techniques should be applied to the art of automotive safety systems design.

With respect to systems design, methods and tools must be developed to support the inevitable evolution about to happen in the global transportation industry, an evolution from federated systems to fully integrated. The transportation industry is not ready nor are they aware of the steps required. As it stands today, there is much art published documenting the research and development in the area of procedure analysis and design. However, there are no systematic and rigorous methodologies for designing procedures to be used in advanced safety systems for the transportation industry. This is currently viewed as a serious shortcoming, since these high-risk and complex systems employ procedures and action sequences that can and do impact life or death results.

This patent describes a system and methods necessary to implement a design methodology that will facilitate and support advanced safety systems design, test, verification, and validation. Therefore, a need exists for a system and method for modeling sensor system inputs in a synthetic environment against truth tables to achieve optimal performance and cost parameters for the design and implementation of advanced automotive safety systems.

SUMMARY OF THE INVENTION

Although the best understanding of the present invention will be had from a through reading of the specification and claims presented below, this summary is provided in order to acquaint the reader with some of the new and useful features of the present invention. Of course, this summary is not intended to be a complete litany of all of the features of the present invention, nor is it intended in any way to limit the breadth of the claims, which are presented at the end of the detailed description of this application.

In the preferred embodiment, a system and methods are disclosed for providing an Algorithm Prototyping, Analysis and Test (APAT) through an integrated framework for dynamic data modeling and application development. The system provides a data model that first extends the capabilities of the physical data model and then translates, gates, optimizes, fuses, filters and manages the physical representation of the logical model into a state estimation of the situation around the vehicle; this is known as Situation Awareness (SA); the implementation of this core is called SACore (Situation Awareness Core). And because the application framework is integrated with SACore, once the user configures the data model, the features and benefits of the application framework become automatically available to the developer as part of the decision process for cost-performance optimization.

The data-modeling framework of APAT enables a user to define a data model or version of SACore by using a series of graphical user interfaces (GUI). APAT and SACore provide functionality that physical databases cannot provide by dynamically translating the asynchronous data generated into a corresponding state estimation. Users can utilize the GUI to modify the data model by adjusting expected error, rate or core operation, and the system output is automatically adjusted to accommodate the changes. The APAT system and methods shields both the application developer and the sensor supplier from the complexities, limitations and costs of single sensor systems.

Therefore methods need to be developed to allow automotive system designers the ability to characterize numerous sensor types and sensor suppliers within a specific type as to the actual capability of the sensor in terms of measured variances in the reports. Second the methods need to allow the designers the freedom to place the sensor on the vehicle with other sensors of like type or different types; these may have coincident, mostly coincident, or non-coincident fields of view. Further these methods need to allow the designer the ability to specify tolerances of the dynamic system, such as target maneuver expectations. It would be desirable to the system designer if methods could be presented that allowed all system variables to be extracted into a single file allowing the designer the flexibility of changing any variable in a complex system of variables and structured filters without the tedious need of hand coding the changes. In an n-scalable system, wherein the number of sensors, and number of sensor reports are variable, the resulting identity matrix or unit matrix of size n is represented by the n-by-n square matrix, where n-by-n matrices are used to represent linear transformations from an n-dimensional vector space to itself. Defining and coding a 2-by 2 square matrix then changing the square matrix to a 3-by-3 or n-by-n is tedious and probably beyond the skill set of the automotive system designer, therefore methods are presented as the objects of the invention that allow rapid prototyping and auto-code generation for the development, modeling, implementation and testing of advanced automotive safety systems.

It is an objective of the invention to describe methods for rapidly defining or redefining an automotive multi-sensor data fusion system comprising at least one of a vehicle, sensors, a system model of expected behaviors of targets with consideration for system variables, system error and measurement tolerances. The underlying system is based on an n-scalable, asynchronous, measurement oriented, measurement to track, variable structure, interacting multiple model estimation filter, utilizing a nearest neighbor joint probabilistic data association filter using optimal routines, with two dynamic switchable data association filters in place of the optimal JPDA using sub-optimal routines including one of cheap JPDA and sub-optimal JPDA; the system is implemented with consideration for out-of-sequence measurements, a track management system and a reporting system based on polar coordinates and a method for executing a debiased conversion, translation and rotation into a uniform Cartesian Coordinate system.

Another object of the invention is to define the modeling framework including identifying the system variables by group, wherein the first group comprises sensor parameters and includes such parameters as the number of sensors in the system; the relationship of the sensor frames to the vehicle reference; the expected report limits; report outputs; 1-sigma covariance terms.

Another object of the invention is to define the second group of modeling variables as the target maneuver accelerations that will be acceptable in measurement reports, wherein the modeling environment is at least two dimensional, and wherein at least three models are anticipated and they comprise near constant velocity, cross range acceleration, and down range acceleration, and the values are in terms of expected acceleration g's of maneuver and these accelerations are introduced into the filter structure as noise values.

Another object of the invention is to describe a method for reducing processing complexity, when desired, by setting the number of filters implemented on any pairings of sensors, by identifying number of possibilities, with subsequent values set as noise for each option chosen.

Another object of the invention is to describe the filter setup comprising at least one of housekeeping in nature; values set that define the function of the model values that set the starting uncertainty covariance terms expected from each sensor with respect to the dimensional states identified which further defined down range and cross range values for position, acceleration and velocity.

Another object of the invention is to describe a system and methods for configuring a fully integrated automotive safety system. The system provides methods to configure fully integrated automotive advanced driver assistance systems comprising the steps of modeling the behavior of an automobile fitted with various sensors requiring access to many parameters describing the automobile, the sensors and how the sensors are mounted to the automobile.

Other features of the present invention will be apparent from the accompanying drawings and from the detailed description that follows.

Aspects and applications of the invention presented here are described below in the drawings and detailed description of the invention. Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. §112, ¶6. Thus, the use of the words "function," "means" or "step" in the Detailed Description or Description of the Drawings or claims is not intended to somehow indicate a desire to invoke the special provisions of 35 U.S.C. §112, ¶6, to define the invention. To the contrary, if the provisions of 35 U.S.C. §112, ¶6 are sought to be invoked to define the inventions, the claims will specifically and expressly state the exact phrases "means for" or "step for, and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ", if the claims also recite any structure, material or acts in support of that means or step, or that perform the recited function, then it is the clear intention of the inventors not to invoke the provisions of 35 U.S.C. §112, ¶6. Moreover, even if the provisions of 35 U.S.C. §112, ¶6 are invoked to define the claimed inventions, it is intended that the inventions not be limited only to the specific structure, material or acts that are described in the preferred embodiments, but in addition, include any and all structures, materials or acts that perform the claimed function as described in alternative embodiments or forms of the invention, or that are well known present or later-developed, equivalent structures, material or acts for performing the claimed function.

BRIEF DESCRIPTION OF THE DRAWINGS

A more complete understanding of the present invention may be derived by referring to the detailed description when considered in connection with the following illustrative figures. In the figures, like-reference numbers refer to like-elements or acts throughout the figures.

FIG. 3. Feasible joint association events for FIG. 2

FIG. 35. is an image showing a partial sensor model.

FIG. 36. is an image showing a partial car model.

FIG. 37. is an image showing a partial Matlab source file.

FIG. 38. is an image showing a partial ANSI C source file.

DETAILED DESCRIPTION

In the following description, and for the purposes of explanation, numerous specific details are set forth in order to provide a thorough understanding of the various aspects of the invention. It will be understood, however, by those skilled in the relevant arts, that the present invention may be practiced without these specific details. In other instances, known structures and devices are shown or discussed more generally in order to avoid obscuring the invention. In many cases, a description of the operation is sufficient to enable one to implement the various forms of the invention, particularly when the operation is to be implemented in software. It should be noted that there are many different and alternative configurations, devices and technologies to which the disclosed inventions may be applied. The full scope of the inventions is not limited to the examples that are described below.

In one application of the invention, a system and methods are presented to model fully integrated systems in an Algorithm Prototyping and Analysis and Test tool, hereafter referred to as APAT FIGS. 4-7. APAT models include both the deterministic variety, where the output is a point estimate, and the stochastic type; where some measure of uncertainty characterizes the model outputs whose behavior is non-deterministic in that a state does not fully determine its next state.

Figure 7:
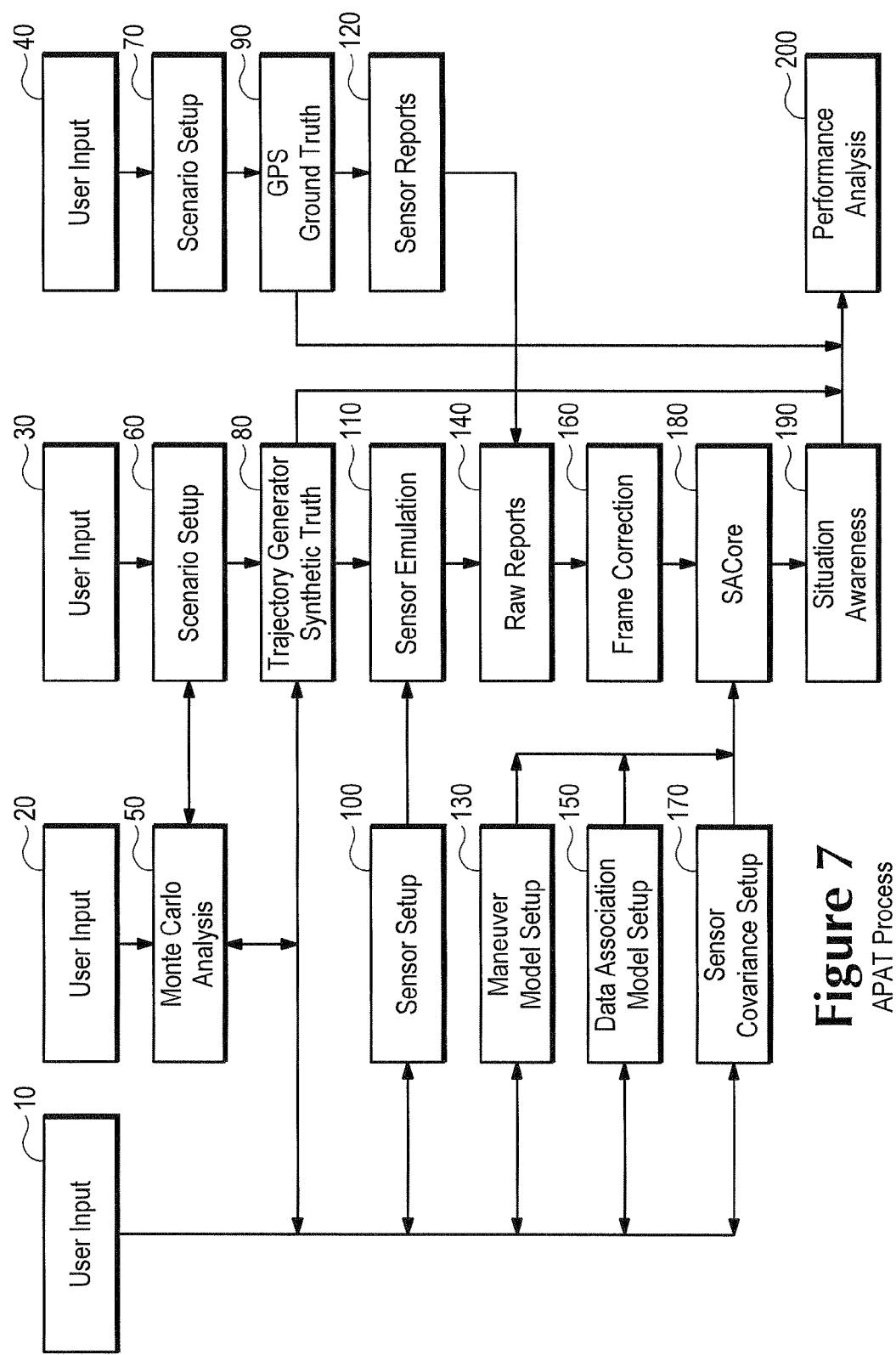
FIG. 7. APAT Process
Figure 8:
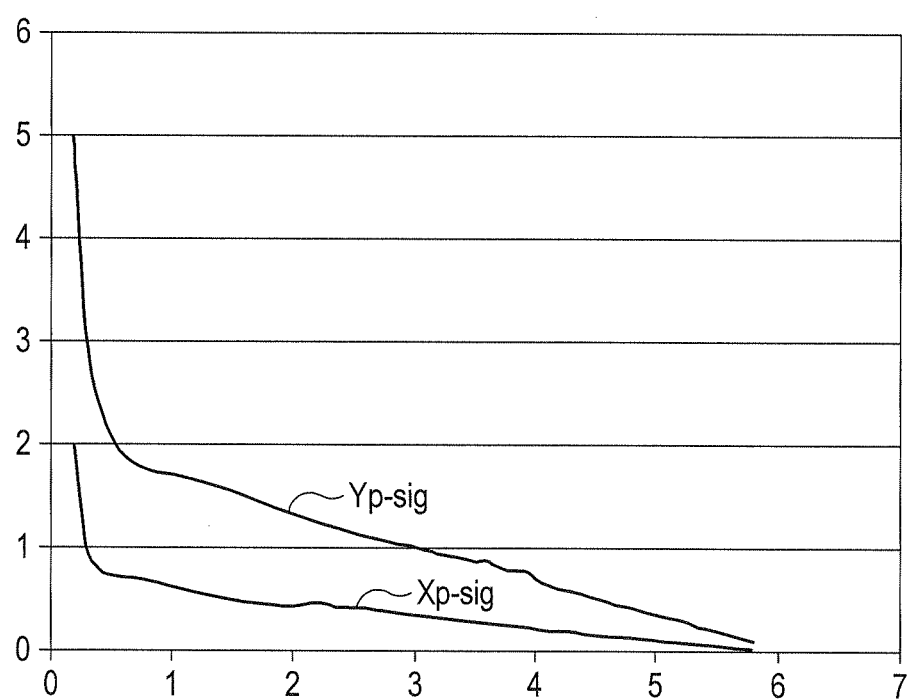
FIG. 8. Radar/Vision—10 Hz/0 Hz CrossRange & Down Range Error
Figure 9:
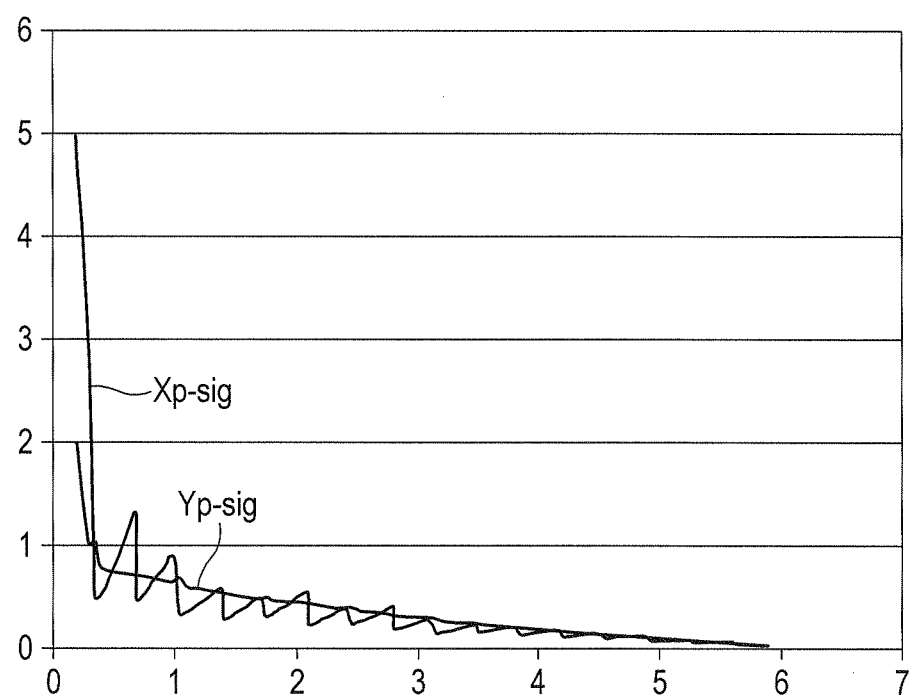
FIG. 9. Radar/Vision—10 Hz/3 Hz CrossRange & Down Range Error
Figure 10:
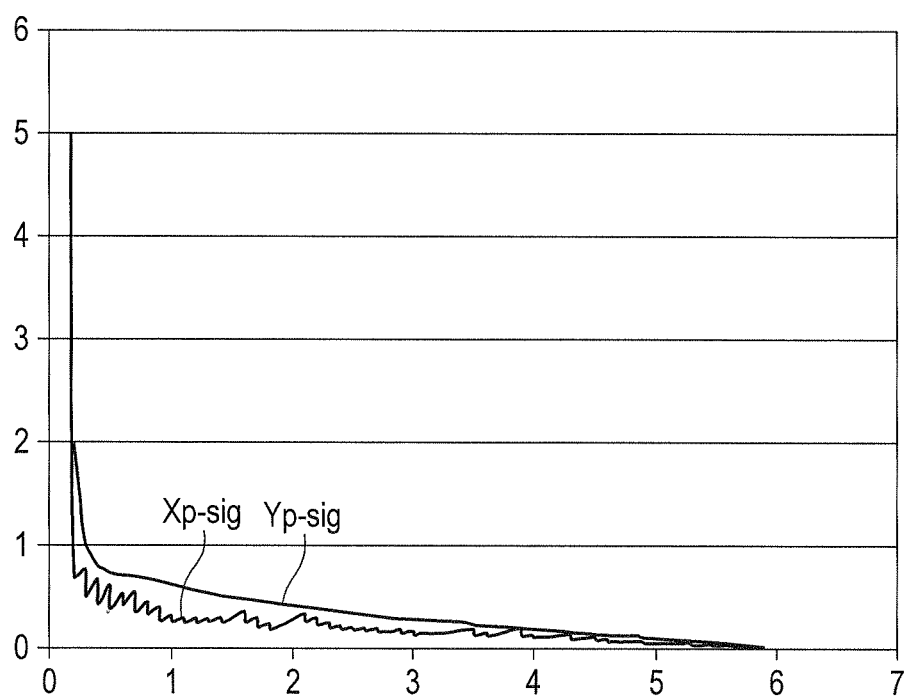
FIG. 10. Radar/Vision—10 Hz/10 Hz CrossRange & Down Range Error
Figure 11:
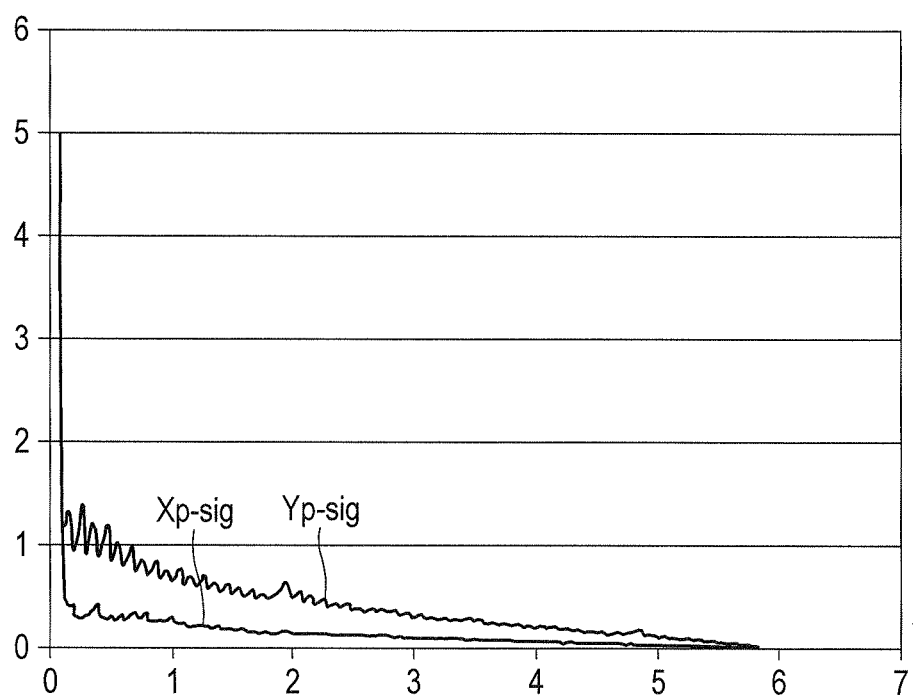
FIG. 11. Radar/Vision—10 Hz/25 Hz CrossRange & Down Range Error
Figure 12:
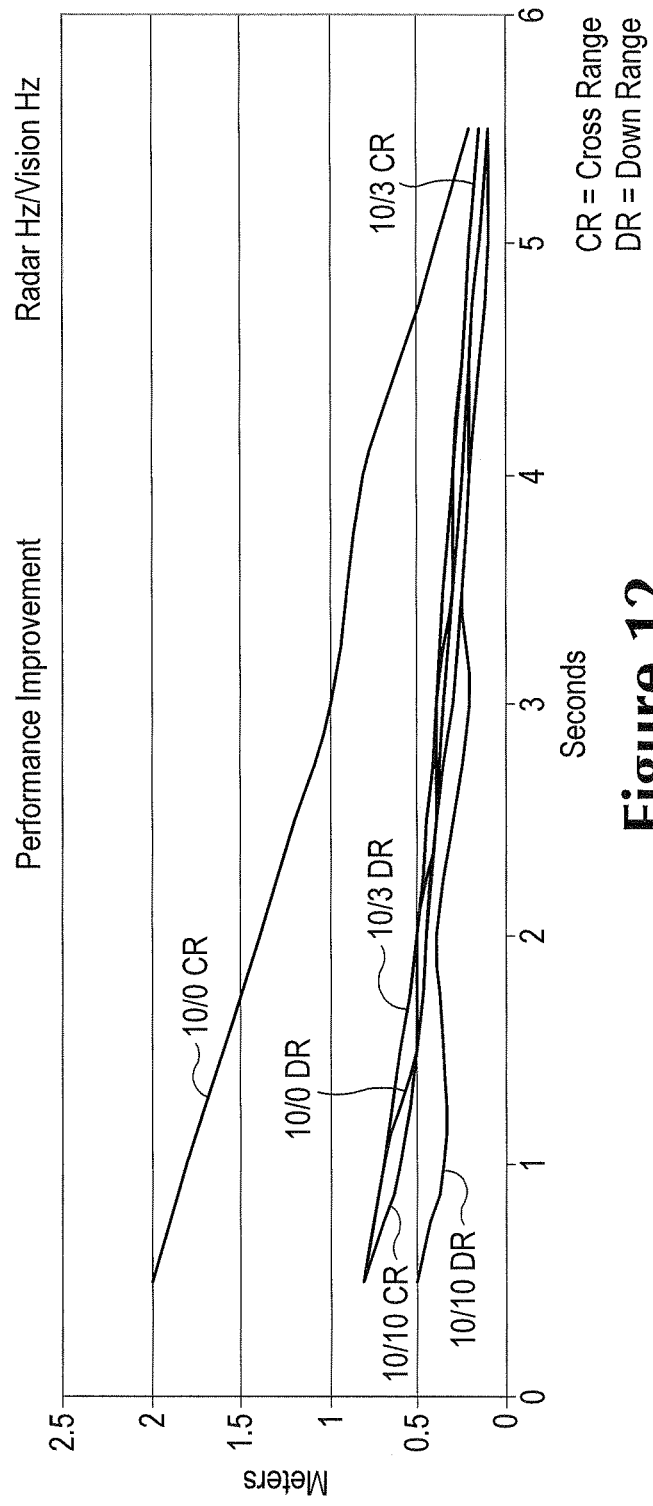
FIG. 12. Performance Improvements Aggregated
Figure 13:
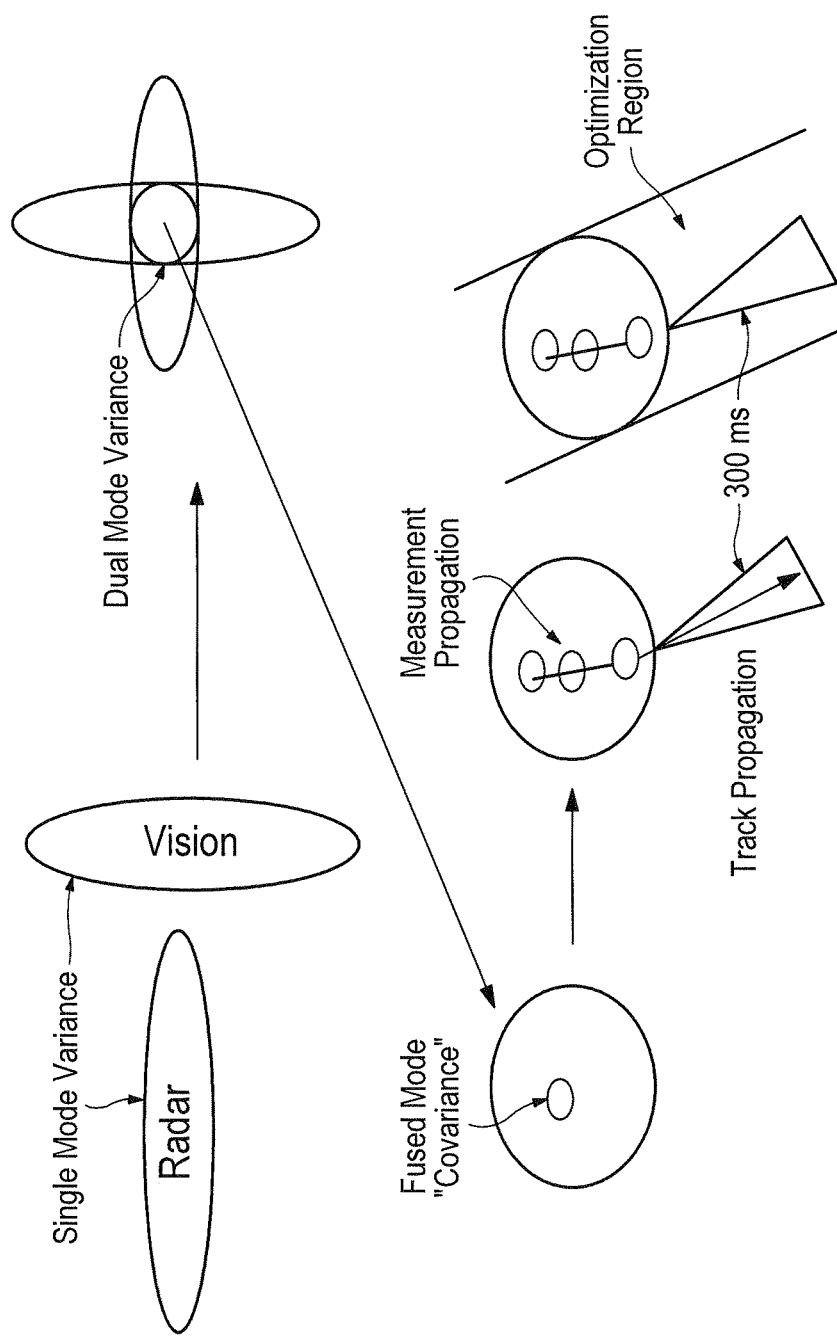
FIG. 13. Performance Improvement
Figure 14:
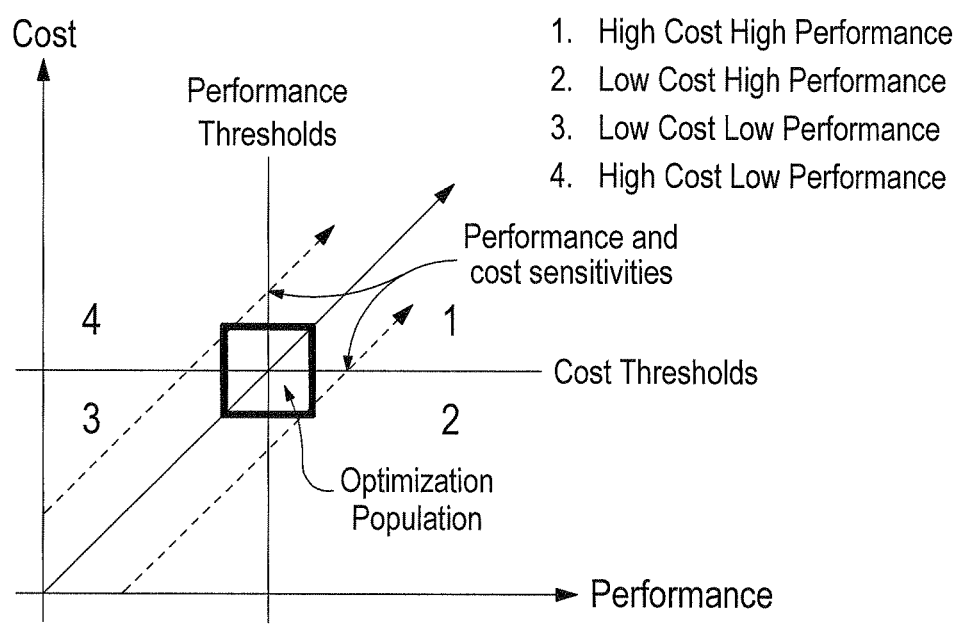
FIG. 14. Performance Optimization

With respect now to FIG. 7. APAT Process, this figure describes the system level implementation APAT. APAT is divided into four main parts;

User Interface (UI) and test setup (10-40; 100, 130, 150, 170);

Target Generation (TG);
   synthetic truth scenarios (60) for the controlled generation of true target trajectories (80); resulting in controlled synthetic sensor reports (110) with no error
   ground truth scenarios (70) for the controlled generation of ground truth target trajectories (90); resulting in controlled ground truth reports with known error Situation Awareness Core (SACore) (180) data aggregation engine (DA)

Performance Analysis (PA) (200) and Monte Carlo Analysis (50) UI and Test Setup:

Variables that can be set as fusion global parameters as referenced in the text below as <n>:
   <1-25> Set sensor parameters FIG. 7 (100)
   <26-40> Set filter noise values for target maneuver FIG. 7 (130)
   <41-94> Set filter operational parameters FIG. 7 (170)

Begin Variables That Can Be Set . . . <SetFusionGlobals>
   1. num_sensors=3;
   2. sensor_zaxis=zeros(1,num_sensors); % Z position of sensor(meters) with respect to center of vehicle 3. sensor_xaxis=zeros(1,num_sensors);% X position of sensor(meters) with respect to center of vehicle
4. sensor_xaxis=[0, 0, 0];
5. sensor_yaxis=zeros(1,num_sensors); % Y position of sensor(meters) with respect to center of vehicle
6. sensor_yaxis=[0, 0, 0];
7. sensor_boresight=zeros(1,num_sensors); % Angle of sensor centerline (°) with respect to vehicle X axis
8. sensor_boresight=[0, 0];
9. sensor_boresight_corr=zeros(1,num_sensors);% Boresight correction wrt sensor centerline(degrees)
10. range_max(1)=150;
11. range_max(2)=150;
12. range_max(3)=150,
13. angle_max(1)=20;
14. angle_max(2)=40;
15. angle_max(3)=20;
16. total_sensor_tracks(1)=5; FROM SENSOR
17. total_sensor_tracks(2)=5;
18. total_sensor_tracks(3)=5;
19. angle_sigma_sensor_deg(1)=2.0; COVARIANCE TERMS
20. angle_sigm_sensor_deg(2)=0.25;
21. angle_sigma_sensor_deg(3)=2.0;
22. r_sigma_sensor11=0.005; % range error as a percent of the range for relevant target
23. r_sigma_sensor(1)=0.01;% range error as a percent of the range
24. r_sigma_sensor(2)=0.10; % range error as a percent of the range
25. r_sigma_sensor(3)=0.01;% range error as a percent of the range
26. if filters==1
27. q(1,1)=
28. q(2,1)=0.5;
29. elseiffilters==2
30. q(1,1)=0.01;
31. q(1,2)=0.5;
32. q(2,1)=0.01;
33. q(2,2)=0.5;
34. else if filters==3
35. q(1,1)=0.01;
36. q(1,2)=0.5;
37. q(1,3)=0.01;
38. q(2,1)=0.01;
39. q(2,2)=0.01;
40. q(2,3)=0.5;
41. deg2 rad=pi/180;
42. rad2deg=180/pi;
43. pass_criteria=12;
44. filters=3
45. sensor_measurements=2; 2 dim pos
46. rejectmax(1)=3;
47. rejectmax(2)=2;
48. rejectmax(3)=3;
49. newtrack(1)=2;
50. newtrack(2)=2;
51. newtrack(3)=2;
52. states=6; 2 DIM OUTPUT, POS/VEL/ACCEL
53. sensor_track_length=14;
54. sensor_raw_number=15;
55. tent_track_length=8;
56. firm_tracks=0;
57. for i=1:num_sensors
58. firm_tracks=firm_tracks+total_sensor_tracks(i);
59. posx_sigma_init_sensor(1)=2.0; STARTING UNCERTAINTY INITIALIZING COVARIANCE TERM
60. posy_sigma_init_sensor(1)=5.0;
61. Rx(1)=posx_sigma_init_sensor(1)*posx_sigma_init_sensor(1);
62. Ry(1)=posy_sigma_init_sensor(1)*posy_sigma_init_sensor(1);
63. velx_sigma_init_sensor(1)=4.0;
64. vely_sigma_init_sensor(1)=4.0;
65. Rvx(1)=velx_sigma_init_sensor(1)*velx_sigma_init_sensor(1);
66. Rvy(1)=vely_sigma_init_sensor(1)*vely_sigma_init_sensor(1);
67. accx_sigma_init_sensor(1)=1.0;
68. accy_sigma_init_sensor(1)=1.0;
69. Rax(1)=accx_sigma_init_sensor(1)*accx_sigma_init_ sensor(1);
70. Ray(1)=accy_sigma_init_sensor(1)*accy_sigma_init_ sensor(1);
71. posx_sigma_init_sensor(2)=5.0;
72. posy_sigma_init_sensor(2)=1.5;
73. Rx(2)=posx_sigma_init_sensor(2)*posx_sigma_init_sensor(2);
74. Ry(2)=posy_sigma_init_sensor(2)*posy_sigma_init_sensor(2);
75. velx_sigma_init_sensor(2)=2.0;
76. vely_sigma_init_sensor(2)=2.0;
77. Rvx(2)=velx_sigma_init_sensor(2)*velx_sigma_init_sensor(2);
78. Rvy(2)=vely_sigma_init_sensor(2)*vely_sigma_init_sensor(2);
79. accx_sigma_init_sensor(2)=1.0;
80. accy_sigma_init_sensor(2)=1.0;
81. Rax(2)=accx_sigma_init_sensor(2)*accx_sigma_init_ sensor(2);
82. Ray(2)=accy_sigma_init_sensor(2)*accy_sigma_init_ sensor(2);
83. posx_sigma_init_sensor(3)=2.0;
84. posy_sigma_init_sensor(3)=5.0;
85. Rx(3)=posx_sigma_init_sensor(3)*posx_sigma_init_sensor(3);
86. Ry(3)=posy_sigma_init_sensor(3)*posy_sigma_init_sensor(3);
87. velx_sigma_init_sensor(3)=4.0;
88. vely_sigma_init_sensor(3)=4.0;
89. Rvx(3)=velx_sigma_init_sensor(3)*velx_sigma_init_sensor(3);
90. Rvy(3)=vely_sigma_init_sensor(3)*vely_sigma_init_sensor(3);
91. accx_sigma_init_sensor(3)=1.0;
92. accy_sigma_init_sensor(3)=1.0;
93. Rax(3)=accx_sigma_init_sensor(3)*accx_sigma_init_ sensor(3);
94. Ray(3)=accy_sigma_init_sensor(3)*accy_sigma_init_ sensor(3);
. . . End of variables that can be set Now with respect to the variables; sensor parameters above are those values (variables) that represent the desired sensor system to be modeled. They include such parameters as the number of sensors in the system <1>; the relationship of the sensor frames to the vehicle reference plane <2-9> for the subsequent translation and rotation of axes; the expected report limits in terms of down range (meters) and cross range (degrees) <10-15>; report outputs from the sensor interface in terms of the number of tracks expected to be report for each sensor <16-18>; 1-sigma (mean of tested actual population with 1 standard deviation) covariance terms for cross range and down range error and linear error expectations <19-25>. The sensor values set in <1-25> can be adjusted during the modeling process for performance optimization and analysis of the output.

As an example <19> sets the sensor 1 covariance term of angular accuracy as ±2° tested and measure over the range of the sensor, the value can be opened to an expected error of ±3° and run again and compared to the first; the value can be closed to an expected error of ±1° and run again and compared to the other two; or the value can be opened to an expected error of ±3° of sensor 1 and closed on sensor 2 <20> to an expected error of ±0.1° and run again and compared. This ability allows the user to choose and model hardware and sensor pairing scenarios against cost and capability at an integrated systems level, this will be discussed further below in the Performance Analysis section.

To those skilled in the art of targeting it is well known that it is impossible to model the absolute expected error of a maneuvering target, therefore an Interacting Multiple Model is implemented as discussed below. As modeling variables that can be set as inputs to the model run are the target maneuver accelerations willing to be accepted in measurement reports. A two dimensional environment is modeled, therefore anticipate three models: near constant velocity; cross range acceleration; and down range acceleration <26-40>. These q values are in terms of g's maneuver and are introduced into the IMM filter structure as noise values. Further, it is desired to not always model the most complex models, therefore the number of filters wished to be implemented can be set on any pairings of sensors, as an example <26, 29, 34> identify the three possibilities, with subsequent values set as noise for each option chosen. For the discussion below, the latter is selected to be described in detail as it represents the most complex case.

Now with respect to the SetFusionGlobals above and the SACore filter setup; the filter setup is identified as items <41-94>; some items are housekeeping in nature <41,42>; items <43-58> are values set as a function of the model described below. Items <59-94 set the starting uncertainty covariance terms expected from each sensor with respect the 2 dimensional states identified in <52>6 which defined down range and cross range values for position (2), acceleration (2) and velocity (2). As example, <59, 63, 67> set the expected error of the values of sensor 1 in terms of down range/cross range (x/y) position, velocity and acceleration measurements, the cases are:
    <59/60>; <2 meters/5 meters>
    <63/64>; <4 meters/sec/4 meters/sec>
    <67/68>; <1 meter/sec$^2$/1 meter/sec$^2$>
Sensor (2) and sensor (3) are represented in <71-94> in the same manner.

Target Generation (TG)/Simulation

The APAT/SACore state estimation system is based on efficient recursive filter techniques which estimate the state of a dynamic system from a series of incomplete and noisy measurements. As time progresses, a measurement is made and reported. This measurement must be within the expectation of the next measurement. Therefore, the Kalman filter is based on linear dynamical systems discretized in the time domain. They are modeled on a Markov chain built on linear operators perturbed by Gaussian noise. The state of the system is represented as a vector of real numbers. At each discrete time increment, a linear operator is applied to the state to generate the new state, with some noise mixed in, and optionally some information from the controls on the system if they are known. Then, another linear operator mixed with more noise generates the visible outputs from the hidden state. The Kalman filter may be regarded as analogous to the hidden Markov model, with the key difference that the hidden state variables are continuous (as opposed to being discrete in the hidden Markov model). Additionally, the hidden Markov model can represent an arbitrary distribution for the next value of the state variables, in contrast to the Gaussian noise model that is used for the Kalman filter. There is a strong duality between the equations of the Kalman Filter and those of the hidden Markov model. A review of this and other models is given in Roweis and Ghahramani (1999).

In order to use the Kalman filter to estimate the internal state of a process given only a sequence of noisy observations, one must model the process in accordance with the framework of the Kalman filter.

The scenario blocks (60, 70) represent the setup of controlled scenarios for either synthetic or controlled target measurements. These scenarios and trajectories represent absolute (80) or controlled (90) "truth" with respect to position, velocity and acceleration of the host vehicle and targets observed. Scenarios can include any kinematic scenario such as over taking targets, meeting targets, observing target behavior to include spawning and merging targets, etc. Each of the scenarios can further include conditions such as degraded environment, degraded sensor operation, clutter, skipped reports, or any host of non-linear or un-expected errors that can and do occur in the environment. The sensor output blocks FIG. 7 (110) or (120) are fed into the DA through block (140). Additional discussion for blocks (160, 180, 190) are described in the section below. A second file representing target truth are sent to (200) for the analysis of performance. SACore and Tracker FIG. 7. (180)

The instrument measurements are passed to the tracking and data fusion algorithms, which will attempt to produce tracks for each of the targets. Each time a track is altered (update, rate aid, track deletion etc.) it sends a track message to the performance analysis routines, which are used to compile statistics on the performance of the tracking algorithms. This is achieved by comparing the track messages with the target's true position, speed etc.

The SACore is the tracking and fusion filter for integrating multi-sensor data to improve the track file of target vehicles. The problem of accurate reporting of measurements on a target is made more difficult because of the presence of clutter and the fact that the target can maneuver with no prior information. The tracking and sensor data fusion filter consists of four main parts:

Interacting Multiple Model (IMM) Estimation Filter: To estimate the target state, position, velocity and possibly acceleration, a Kalman Filter can be used. The problem is, to accurately estimate the state, the model in the filter must accurately match the maneuvering of the target. Since the movement of the target is not known ahead of time, an accurate model cannot be designed so errors in the state estimation will occur. Adding process noise to model the target maneuvers or using a maneuver detector to adapt the filter has been used in the art, but detection delays and large estimation errors during maneuvers are still a problem. It is generally accepted that the Interacting Multiple Model (IMM) estimator provides superior tracking performance compared to a single Kalman Filter.

The IMM is based on using several models in parallel to estimate the maneuvering target's states. Each Kalman Filter, or another estimation filter, uses a different model for each maneuver, one models a constant velocity target, another models an acceleration in the longitudinal axis while another models an acceleration in the lateral axis. Switching between these models during each sample period is determined probabilistically. Unlike maneuver detection systems where only one filter model is used at a time, the IMM uses all filters. The overall state estimate output is a weighted combination of the estimates from the individual filters. The weighting is based on the likelihood that a filter model is the correct maneuvering target model.

The IMM estimator is a state estimation algorithm that uses Markovian switching coefficients. A system with these coefficients is described by r models, $M^1, M^2, \ldots, M^r$, and given probabilities of switching between these models. The event that model j ($M^j$) is in effect during the sampling period ending at time tk, $(t_{k-1}, t_k]$ will be denoted by $M^j(k)$. The dynamics and measurement for a linear system are given by $$x(k)=\Phi^j(k,k-1)x(k-1)+G^j(k,k-1)w^j(k-1), \quad (1)$$

and $$z(k)=H^j(k)x(k)+v^j(k), \quad (2)$$

where x(k) is the system state at time $t_k$, z(k) is the measurement vector at time $t_k$, $\Phi^j(k,k-1)$ is the state-transition matrix from time $t_{k-1}$ to time $t_k$ for $M^j(k)$, $G^j(k,k-1)$ is the noise input matrix, and $H^j(k)$ is the observation matrix for $M^j(k)$. The process noise vector $w^j(k-1)$ and the measurement noise vector $v^j(k)$ are mutually uncorrelated zero-mean white Gaussian processes with covariance matrices $Q^j(k-1)$ and $R^j(k)$ respectively.

The initial conditions for the system state under each model j are Gaussian random variables with mean $\bar{x}^j(0)$ and covariance $P^j(0)$. These prior statistics are assumed known, as also is $\mu^j(0)=Pr\{M^j(0)\}$, which is the initial probability of model j at $t_0$.

The model switching is governed by a finite-state Markov chain according to the probability $\pi_{ij}=Pr\{M^j(k)|M^i(k-1)\}$ of switching from $M^i(k-1)$ to $M^j(k)$. The model switching probabilities, $\pi_{ij}$, are assumed known and an example is $$\pi_{ij} = \begin{bmatrix} .95 & .05 \\ .05 & .95 \end{bmatrix}. \quad (3)$$

Figure 1:
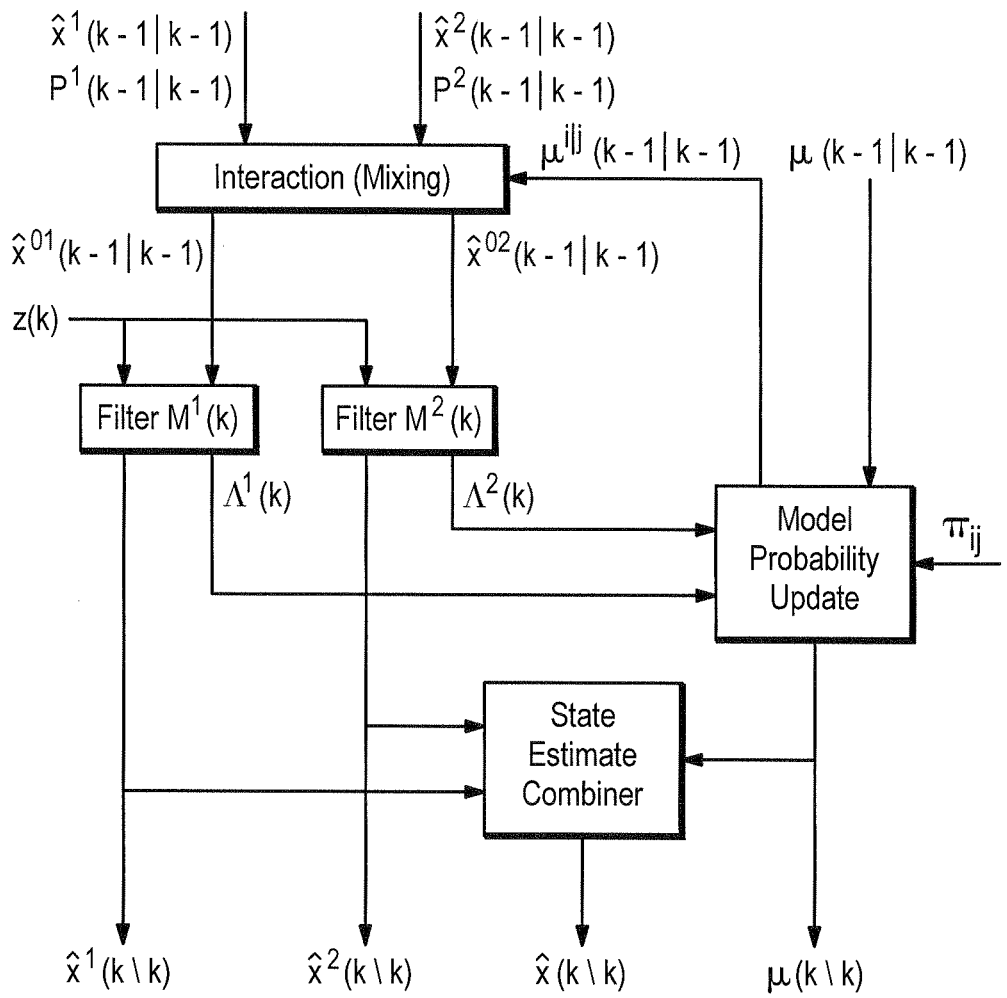
FIG. 1. Block diagram of the IMM for two APAT and SACore models

A block diagram of the IMM estimator with only two models, for simplicity, is shown in FIG. 1.

The inputs to the IMM estimator are $\hat{x}^1(k-1|k-1)$, $\hat{x}^2(k-1|k-1)$, $P^1(k-1|k-1)$, $P^2(k-1|k-1)$, and $\mu^{i|j}(k-1|k-1)$, all from the sampling period ending at $t_{k-1}$. Where $\hat{x}^1(k-1|k-1)$ is the state estimate from filter 1 at time $t_{k-1}$ using measurements from time $t_{k-1}$ and $P^1(k-1|k-1)$ is the corresponding state covariance matrix. Each of the filters use a different mixture of $\hat{x}^1(k-1|k-1)$ and $\hat{x}^2(k-1|k-1)$ for their input, For r models, this mixing allows the model-conditioned estimates in the current cycle to be computed using r filters rather than $r^2$ filters, which greatly decreases the computational burden. The inputs to the filters, $\hat{x}^{01}(k-1|k-1)$, $\hat{x}^{02}(k-1|k-1)$, and the corresponding covariance matrices are computed in the Interaction (Mixing) block. For the filter matched to $M^j(k)$, the inputs are $$\hat{x}^{0j}(k-1|k-1) = \sum_{i=1}^{r} \mu^{i|j}(k-1|k-1)\hat{x}^i(k-1|k-1) \quad (4)$$

$$P^{0j}(k-1|k-1) = \quad (5)$$
$$\sum_{i=1}^{r} \mu^{i|j}(k-1|k-1)\{P^i(k-1|k-1) + [\hat{x}^i(k-1|k-1) -$$
$$\hat{x}^{0j}(k-1|k-1)] * [\hat{x}^i(k-1|k-1) - \hat{x}^{0j}(k-1|k-1)]^T\},$$

where the conditional model probability is $$\mu^{i|j}(k-1|k-1)=Pr\{M^i(k-1)|M^j(k),Z_1^{k-1}\}$$

$$\mu^{i|j}(k-1|k-1) = \quad (6)$$
$$Pr\{M^i(k-1) | M^j(k), Z_1^{k-1}\} = \frac{1}{\mu^j(k|k-1)}\pi_{ij}\mu^i(k-1|k-1),$$

and the predicted model probability is $$\mu^j(k|k-1) = Pr\{M^j(k) | Z_1^{k-1}\} = \sum_{i=1}^{r} \pi_{ij}\mu^i(k-1|k-1). \quad (7)$$

Using the measurements, z(k), for the filter matched to $M^j(k)$, the updates are computed using the familiar Kalman Filter equations $$\hat{x}^j(k|k-1)=\Phi^j(k,k-1)\hat{x}^{0j}(k|k-1), \quad (8)$$

$$P^j(k|k-1)=\Phi^j(k,k-1)P^{0j}(k|k-1)[\Phi^j(k,k-1)]^T+G^j(k,k-1)$$
$$Q^j(k-1)[G(k,k-1)]^T, \quad (9)$$

$$v^j(k)=z(k)-H^j(k)\hat{x}^j(k|k-1), \quad (10)$$

$$S^j(k)=H^j(k)P^j(k|k-1)[H^j(k)]^T+R^j(k), \quad (11)$$

$$K^j(k)=P^j(k|k-1)[H^j(k)]^T[S^j(k)]^{-1}, \quad (12)$$

$$\hat{x}^j(k|k)=\hat{x}(k|k-1)+K^j(k)v^j(k), \quad (13)$$

$$P^j(k|k)=[I-K^j(k)H^j(k)]P^j(k|k-1), \quad (14)$$

where $\hat{x}^j(k|k-1)$ is the predicted state estimate under $M^j(k)$, $P^j(k|k-1)$ is the corresponding prediction covariance, $v^j(k)$ is the residual, $S^j(k)$ is the residual covariance matrix, $K^j(k)$ is the Kalman gain matrix, $\hat{x}^j(k|k)$ is the updated state estimate under $M^j(k)$, and $P^j(k|k)$ is the updated covariance matrix.

The likelihood of the filter matched to $M^j(k)$ is defined by $\Lambda^j(k)=f[z(k)|M^j(k),Z_1^{k-1}]$, where $f[\bullet|\bullet]$ denotes a conditional density. Using the assumption of Gaussian statistics, the filter residual and the residual covariance, the likelihood is $$\Lambda^j(k) = \frac{1}{\sqrt{\det[2\pi S^j(k)]}} \exp\left\{-\frac{1}{2}[v^j(k)]^T [S^j(k)]^{-1} v^j(k)\right\}. \quad (15)$$

The probability for $M^j(k)$ is $$\mu^j(k|k) = Pr\{M^j(k)|Z_1^k\} = \frac{1}{c}\mu^j(k|k-1)\Lambda^j(k), \quad (16)$$

where the normalization factor c is $$c = \sum_{j=1}^{r}\mu^i(k|k-1)\Lambda^i(k). \quad (17)$$

These computations are performed in the Model Probability Update block.

Finally the combined state estimate $\hat{x}(k|k)$ and the corresponding state error covariance for the IMM are given by $$\hat{x}(k|k) = \sum_{j=1}^{r}\mu^j(k|k)\hat{x}^j(k|k), \quad (18)$$

$$P(k|k) = \quad (19)$$
$$\sum_{j=1}^{r}\mu^j(k|k)\{P^j(k|k) + [\hat{x}^j(k|k)-\hat{x}(k|k)][\hat{x}^j(k|k)-\hat{x}(k|k)]^T\}.$$

The final state estimate, $\hat{x}(k|k)$, is the best estimate of the target state and $P(k|k)$ is the error covariance matrix for this optimal state estimate.

Nearest Neighbor Joint Probabilistic Data Association Filter: This section deals with the problem of taking a target measurement from a sensor and either associating it to an existing track, possibly rejecting the measurement because it is clutter, or sending it to the track management process to start a new track.

The process is to first define a validation region for each track and to identify all sensor measurements that fall within that region. For the two-dimensional case the validation region for a track is constructed around the predicted measurement for the track. Using the previous track state, the predicted measurement is computed by propagating this state to the time of the next measurement. This predicted measurement is the center of the validation region. If the measurement falls within this validation region, then it is considered as a candidate for association to the track; otherwise, it is rejected.

The predicted measurement $\hat{z}(k|k-1)$ is $$\hat{z}(k|k-1)=H(k)\hat{x}(k|k-1), \quad (20)$$

where $$\hat{x}(k|k-1)=\Phi(k,k-1)\hat{x}(k-1|k-1). \quad (21)$$

The residual, $v(k)$, is the difference between the actual measurement, $z(k)$, and the predicted measurement and is $$v(k)=z(k)-\hat{z}(k|k-1)=z(k)-H(k)\hat{x}(k|k-1). \quad (22)$$

The residual covariance $S(k)$ is $$S(k)=H(k)P(k|k-1)H^T(k)+R(k). \quad (23)$$

The residual statistics are Gaussian with zero-mean and the M-dimensional residual density $f(v(k))$ is $$f(v(k)) = \frac{1}{\sqrt{\det[2\pi S(k)]}}\exp\left\{-\frac{1}{2}d^2\right\}, \quad (24)$$

where the normalized (squared) distance $d^2$ is defined as $$d^2=v^T(k)S^{-1}(k)v(k). \quad (25)$$

The normalized distance $d^2$ is a chi-square variant, $\chi_M^2$, with M degrees of freedom.

A measurement will be in the validation region if $$[\rho-\hat{z}(k|k-1)]^T S^{-1}(k)[\rho-\hat{z}(k|k-1)] \leq g^2, \quad (26)$$

where g is the threshold that insures that the measurement falls in the validation region with a probability of $P_G$. The threshold g is referred to as the number of sigmas or standard deviations for the gate, and g is determined from a $\chi_M^2$ table.

Figure 2:
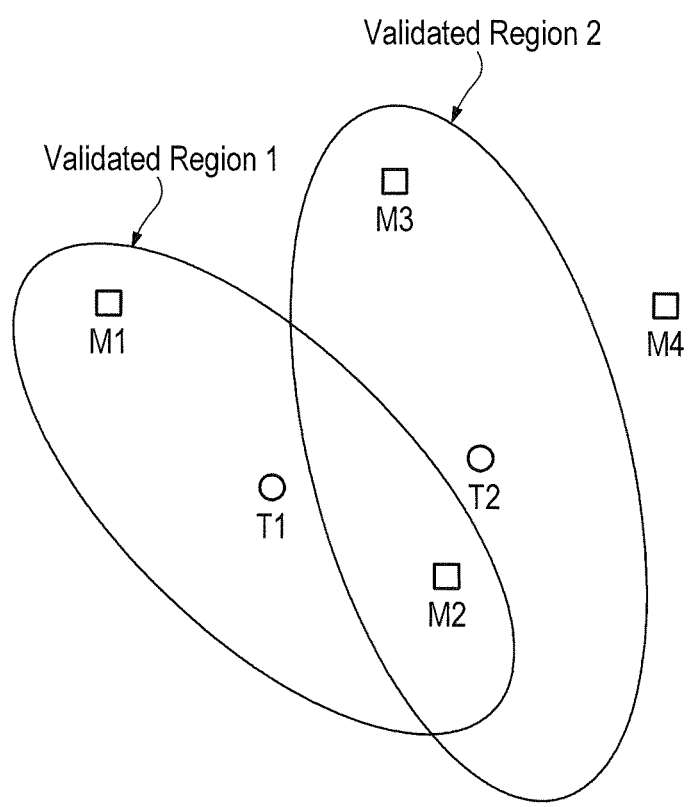
FIG. 2. Validation region for two tracks and five measurements
Figure 4:
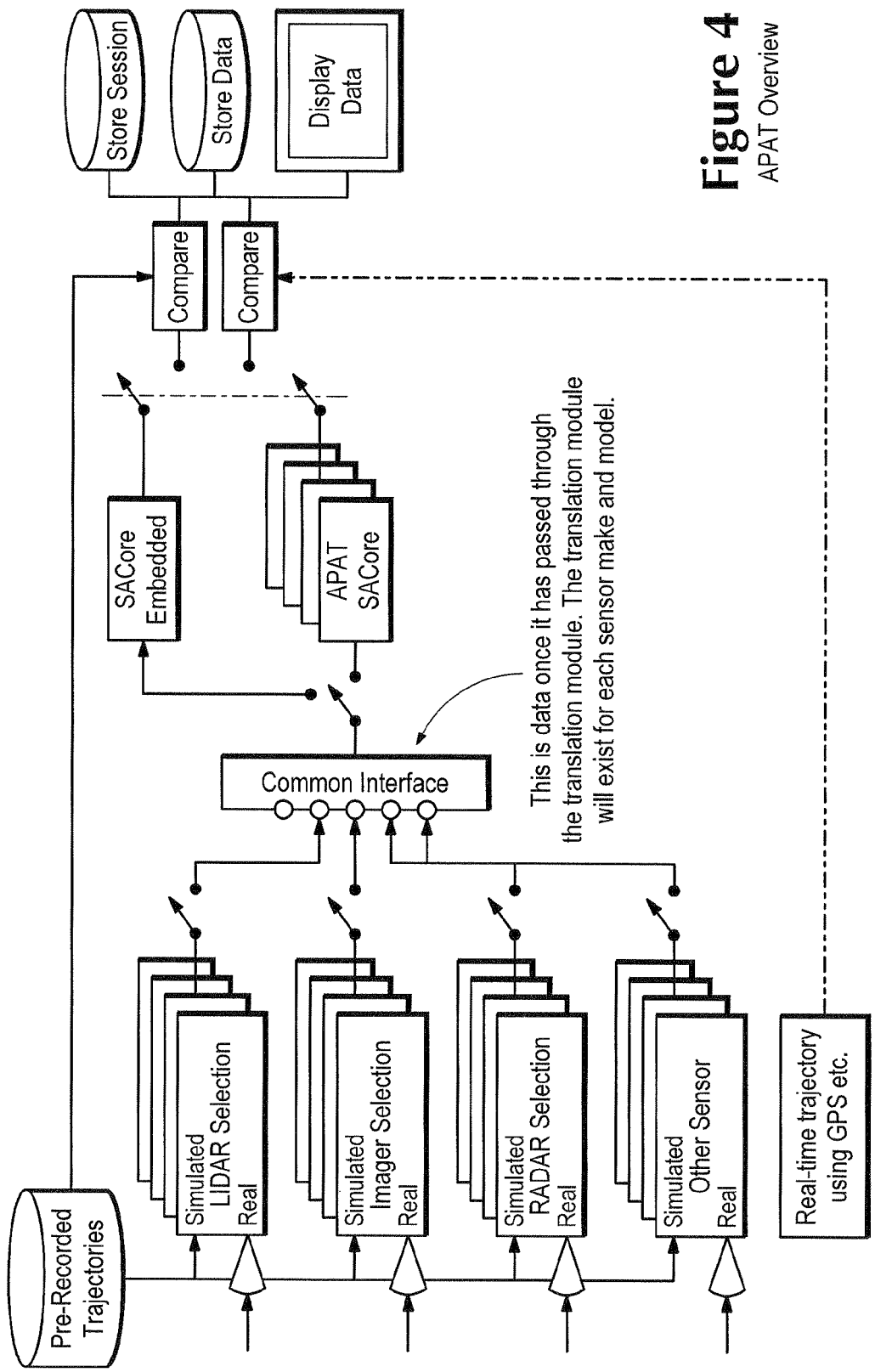
FIG. 4. APAT Overview
Figure 5A:
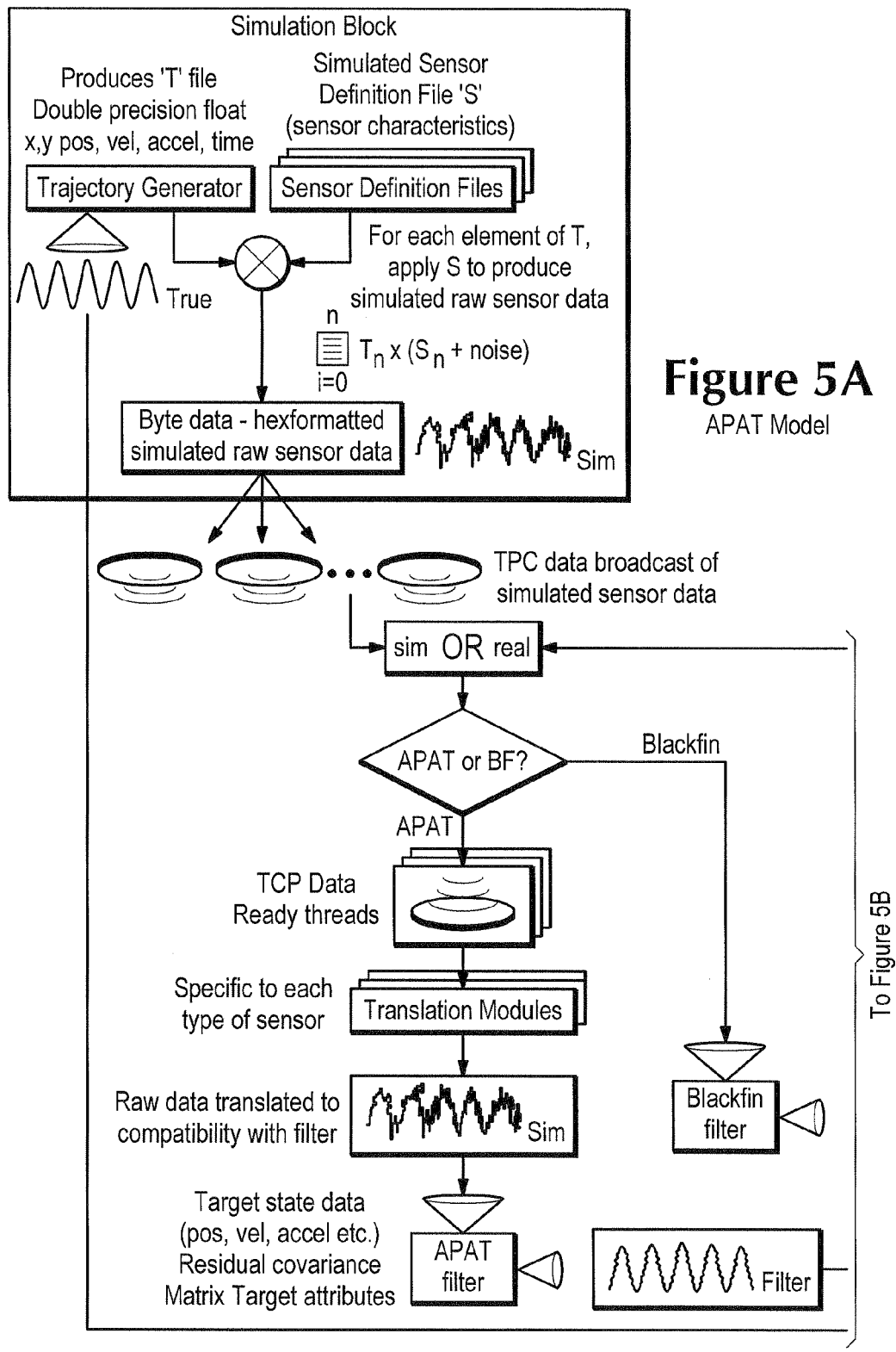
FIG. 5. APAT Model
Figure 5B:
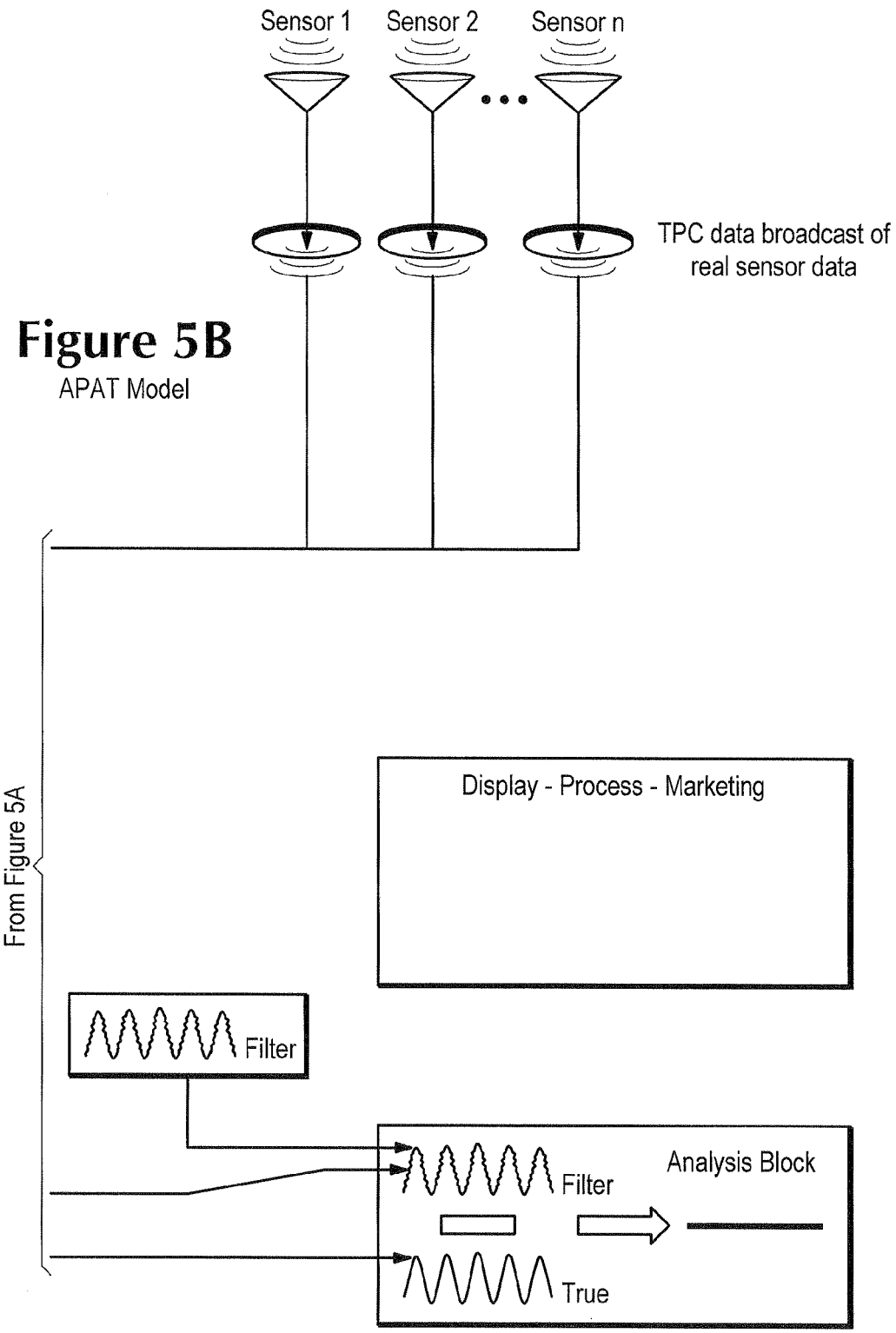
Figure 6:
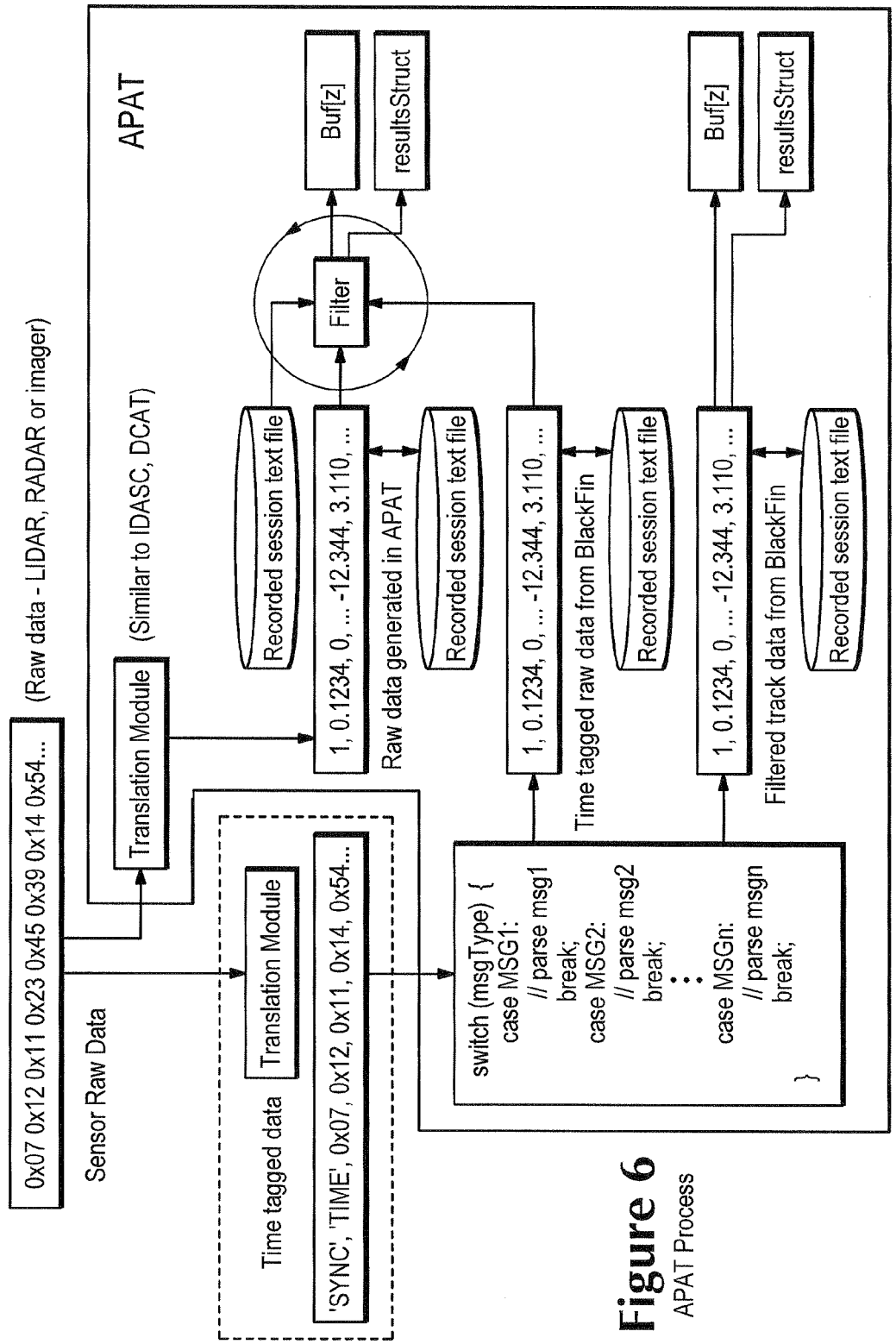
FIG. 6. APAT Process

FIG. 2 shows an example of two elliptical validation regions for a system with two tracks and four measurements. T1 and T2 are the centers of validated regions 1 and 2 respectively and represent the predicted measurements for tracks 1 and 2. Measurements M1 and M2 are valid measurements for track 1 while measurements M2 and M3 are valid measurements for track 2. Measurement M4 is not a valid measurement for either track. In both cases there is more than one measurement valid for each track and a procedure is needed to determine which measurements will be used to update the track state.

To save computation time, a coarse gating procedure of testing individual components of the residual vector may be used using rectangular gates. That is, a measurement $z(k)$ falls inside the coarse gate region provided that $$|z_i(k)-\hat{z}_i(k|k-1)|\leq g\sqrt{S_{ii}(k)}, \quad (27)$$

for each $i=1, \ldots, M$, where $z_i(k)$ and $\hat{z}_i(k|k-1)$ are the components of $z(k)$ and $\hat{z}(k|k-1)$, respectively, and $S_{ii}(k)$ is the $i^{th}$ variance in the residual covariance matrix. The rectangular gating eliminates unlikely measurements-to-track pairing and the ellipsoidal gating is used for the measurements that fall in the rectangular gates.

The data association filter that is used for V2.1 is the nearest-neighbor joint probabilistic data association filter (NNJPDAF). To help explain what the NNJPDAF is, the probabilistic data association filter (PDAF) for the single target case will be discussed first. Next the more complex joint probabilistic data association filter (JPDAF), which is used for multiple targets, will be discussed, and then the nearest-neighbor JPDA.

The PDAF is a Bayesian approach that computes the probability that each measurement in a track's validation region is the correct measurement and the probability that none of the validated measurements is the correct measurement. The non-parametric version of the filter will be used since it does not require prior knowledge of the special density of the clutter.

For m measurements falling inside the validation region at time $t_k$, the probability that the $j^{th}$ validated measurement $z_j(k)$ is target originated, denoted $\beta_j$, is $$\beta_j = \frac{e_j}{b+\sum_{i=1}^{m}e_i} \quad (j=1,\ldots,m), \quad (28)$$

while the probability that none of the measurements is target originated, denoted by $\beta_0$, is $$\beta_0 = \frac{b}{b + \sum_{l=1}^{m} e_l}. \quad (29)$$

The term $e_j$ is given by $$e_j = \exp\left\{-\frac{1}{2} v_j^T(k) S^{-1} v_j(k)\right\}, \quad (30)$$

where $v_j(k)$ is the residual for the $j^{th}$ validated measurement and $S(k)$ is the residual covariance for the measurements. The term b is given by $$b = \frac{m}{V} \sqrt{\det[2\pi S(k)]} \frac{1 - P_D P_G}{P_D}, \quad (31)$$

where V is the hypervolume of the validated region at $t_k$, $P_D$ is the detection probability (assumed known), and $P_G$ is the probability of the target originated measurement falling inside the validated region (usually set to at least 0.95). The term b accounts for the possibility that none of the validated measurements is target originated and that the target-originated measurement was not detected, or fell outside of the validated region.

The state in the PDAF is updated using all of the measurements and the combined residual $v(k)$ as follows:

$$\hat{x}(k|k) = \hat{x}(k|k-1) + K(k)v(k), \quad (32)$$

$$v(k) = \sum_{j=1}^{m} \beta_j v_j(k), \quad (33)$$

and $v_j(k)$ is the residual for the $j^{th}$ validated measurement, $$v_j(k) = z_j(k) - H(k)\hat{x}(k|k-1). \quad (34)$$

The updated covariance is given by $$P(k|k) = \beta_0 P(k|k-1) + [1-\beta_0] P^C(k) + \tilde{P}(k), \quad (35)$$

where $$P^C(k) = P(k|k-1) - K(k)S(k)K^T(k), \quad (36)$$

and $$\tilde{P}(k) = K(k) \left[ \sum_{j=1}^{m} \beta_j v_j(k) v_j^T(k) - v(k) v^T(k) \right] K^T(k). \quad (37)$$

To extend to the multi-target case, the JPDAF is used. First all feasible joint association events $\theta$ in the current scan are determined. A feasible event is a set of non-conflicting validated measurement-to-track pairings in which a measurement can originate from only one source, and at most one measurement can originate from a target. Any number of measurements can originate from clutter. Table 1 lists the eight feasible joint association events $\theta$ for FIG. 2. The $\theta_{tj}$'s are the single events making up a joint event $\theta$. $\theta_{tj}$ denotes a single event that measurement j (j=1, . . . , m) originated from target t (t=1, . . . , N), where m is the total number of measurements in the current scan, N is the total number of targets, and t=0 indicates that the measurement is a clutter detection. In the above example m=3 and N=2. For example, the joint event $\theta$=7 is made up of $\theta_{11}$ (T1 originates M1), $\theta_{02}$ (M2 originates from clutter), and $\theta_{23}$ (T2 originates from M3). The binary target detection indicator $\delta_t$ for target t (t=1, . . . , N) has a value of one if a measurement is assigned to target t in $\theta$, and it is zero otherwise. The binary measurement association indicator $\tau_j$ for measurement j has a value of one if measurement j is assigned to a target t (t=1, . . . , N) in $\theta$, and is zero otherwise. The quantity $\phi$ is the number of measurements originating from clutter in $\theta$.

The joint association event probabilities are given by $$Pr\{\theta | Z_1^k\} = \frac{\gamma(\theta)}{c}, \quad (38)$$

where the normalized constant c is $$c = \sum_{\theta} \gamma(\theta), \quad (39)$$

where $$\gamma(\theta) = \frac{\phi!}{V^\phi} \prod_{j=1}^{m} \left(\Lambda_{t_j j}\right)^{\tau_j} \prod_{t=1}^{N} \left\{ (P_D^t)^{\delta_t} (1 - P_D^t)^{1-\delta_t} \right\}, \quad (40)$$

and V is the volume of the surveillance region.

The marginal probability of target t (t=0, N) originating the measurement j, denoted $\beta_{tj}$, is obtained by summing over all feasible joint events $\theta$ in which the single event $\theta_{tj}$ occurs, and is given by $$\beta_{tj} = Pr\{\theta_{tj} | Z_1^k\} = \sum_{\theta: \theta_{tj} \in \theta} Pr\{\theta | Z_1^k\}. \quad (41)$$

Once the marginal association probabilities $\beta_{tj}$ are computed, they are used in equations (32) to (37) to update the state for target t.

For the above example, the normalized constant c is the sum of the eight $\gamma$'s in Table 1 and is given by $$c P_D^2 (\Lambda_{11}\Lambda_{22} + \Lambda_{11}\Lambda_{23} + \Lambda_{12}\Lambda_{23})V + 2!P_D(1-P_D)(\Lambda_{11} + \Lambda_{12} + \Lambda_{22} + \Lambda_{23})/V^2 + 3!(1-P_D)^2/V^3 \quad (42)$$

The eight joint association probabilities $Pr\{\theta | Z_1^k\}$ are computed by dividing the $\gamma$'s in Table 1 by c. The marginal association probabilities, $\beta_{tj}$'s are then computed using equation (41). As an example, the marginal association probabilities for T1 are $$\beta_{11} = Pr\{\theta_{11} | Z_1^k\} = Pr\{\theta = 2 | Z_1^k\} + Pr\{\theta = 6 | Z_1^k\} + Pr\{\theta = 7 | Z_1^k\} \quad (43)$$

$$= 1/c\{2!P_D(1-P_D)\Lambda_{11})/V^2 + P_D^2 \Lambda_{11}\Lambda_{22} + \Lambda_{11}\Lambda_{23})V\},$$

$$\beta_{12} = Pr\{\theta_{12}|Z_1^k\} = Pr\{\theta=3|Z_1^k\} + Pr\{\theta=8|Z_1^k\} \quad (44)$$

$$= 1/c\{2!P_D(1-P_D)\Lambda_{12})/V^2 + P_D^2\Lambda_{12}\Lambda_{23}/V\},$$

$$\beta_{13} = Pr\{\theta_{13}|Z_1^k\} = 0, \quad (45)$$

where $\beta_{13}=0$ because $\theta_{13}$ does not occur in any of the eight joint events $\theta$; that is, M3 is not validated by T1 in FIG. 2. To obtain the probability $\beta_{10}$ of no measurement originating from T1, all joint events in which no measurements are assigned to T1 (i.e., joint events in which $\delta_1=0$) are obtained from Table 1. These joint events are $\theta=1, 4, 5$, so that $$\beta_{10} = Pr\{\theta=1|Z_1^k\} + Pr\{\theta=4|Z_1^k\} + Pr\{\theta=5|Z_1^k\}. \quad (46)$$

Since $\Sigma_j \beta_{tj} = \Sigma_\theta Pr\{\theta|Z_1^k\} = 1$ for each target t, $\beta_{t0}$ can be computed more easily using $$\beta_{t0} = 1 - \sum_{j=1}^{m} \beta_{tj}. \quad (47)$$

In particular, $\beta_{t0}$ is given by $$\beta_{10} 32\ 1 - (\beta_{11} + \beta_{12} + \beta_{13}). \quad (48)$$

The marginal association probabilities for target T2 can be found in a similar manner.

The technique described above to compute the marginal association probabilities, $\beta_{tj}$'s, can only be used when there are few tracks and/or measurements because of the large amount of computation time required. With large numbers of tracks and measurements, a suboptimal method must be used. Two techniques are described in [1]. They are the Cheap JPDA and the Suboptimal JPDA and both techniques, along with the optimal JPDA, are programmed into this filter version. The choice as to which technique to use can be determined at the beginning of the filter run.

The cheap JPDA was developed by Fitzgerald [4]. The probability $\beta_{tj}$ of track t associating with measurement j is approximated by $$\beta_{tj} = \frac{\Lambda_{tj}}{T_t + M_j - \Lambda_{tj} + B}. \quad (49)$$

The quantity $T_t$ is the sum of all likelihoods for target t, which is given by $$T_t = \sum_{j=1}^{m} \Lambda_{tj} \quad (50)$$

and $M_j$, which is the sum of all likelihoods for measurement j, is $$M_j = \sum_{t=1}^{N} \Lambda_{tj} \quad (51)$$

The quantity B is a bias to account for clutter and for non-unity probability of detection. Also $$\beta_{t0} = \frac{B}{T_t + B} \quad (52)$$

For the example in FIG. 2, the quantities $M_j$ (j=1, 2, 3) and $T_t$ (t=1,2) are given by, $$M_1 = \Lambda_{11} \quad T_1 = \Lambda_{11} - \Lambda_{12}$$

$$M_2 = \Lambda_{12} + \Lambda_{22} \quad T_2 = \Lambda_{22} + \Lambda_{23}$$

$$M_3 = \Lambda_{23} \quad (53)$$

The association probabilities for T1 are $$\beta_{10} = \frac{B}{T_1 + B} = \frac{B}{\Lambda_{11} + \Lambda_{12} + B} \quad (54)$$

$$\beta_{11} = \frac{\Lambda_{11}}{T_1 + M_1 - \Lambda_{11} + B} = \frac{\Lambda_{11}}{\Lambda_{11} + \Lambda_{12} + B} \quad (55)$$

$$\beta_{12} = \frac{\Lambda_{12}}{T_1 + M_2 - \Lambda_{12} + B} = \frac{\Lambda_{12}}{\Lambda_{11} + \Lambda_{12} + \Lambda_{22} + B} \quad (56)$$

$$\beta_{13} = \frac{\Lambda_{13}}{T_1 + M_3 - \Lambda_{13} + B} = 0 \quad (57)$$

The association probabilities for T2 can be found in a similar manner. Fitzgerald stated that when clutter was significant, a fixed value of B was adequate. Otherwise he found that a value of B=0 gave satisfactory performance.

Although the cheap JPDA is easy to implement and requires much less computational resources, Roecker and Phillis [2] documented some defects in the cheap JPDA. For example, the association probabilities for a given track may not add up to 1. They showed that this may cause a target track to be drawn off by a nearby target track or a nearby false track. To remove some of these defects, the Suboptimal JPDA was developed by Roecker and Phillis [2].

The concept of partial joint events were introduced by Roecker and Phillis to develop the suboptimal JPDA. A partial joint event considers at most two track-to-measurement pairings. That is, a partial joint event consists of (at most) two single events. Also, it assumes the probability of detection for each track is near unity so that all of the targets are detected and all of the joint events have the same number of measurements assigned to clutter. The computational requirement is more than the cheap JPDA, but less than the optimal JPDA.

The association probabilities in the suboptimal JPDA are computed using the following steps:
1. For each track t, form $A_t$, which is the list of all indices of the validated measurements for track t.
2. For each measurement j, form $C_j$, which is the list of indices of the tracks which validate measurement j.
3. For each track t, form the union of all track index lists from all of the measurements that are validated by track t while excluding the index of track t.
This list of track indices, denoted by $L_t$, is given by $$L_t = \bigcup_{j \in A_t} C_j - \{t\}. \quad (58)$$

4. The probability $\beta_{tj}$ of track t associating with measurement j is given by $$\beta_{tj} = \frac{D_{tj}}{B + \sum_{l \in A_t} D_{tl}}, \quad (59)$$

where $\phi$ is a bias to account for clutter density and $$D_{tj} = \Lambda_{tj} \quad \text{if } L_t = \phi \quad (60)$$

$$D_{tj} = \Lambda_{tj} \sum_{s \in L_t} N_{sj} \quad \text{if } L_t \neq \phi$$

where $\phi$ is the empty set, and $$N_{sj} = \max_{k \in A_s, k \neq j} \{\Lambda_{sk}\}. \quad (61)$$

The probability of no measurements originating from track t is $$\beta_{t0} = \frac{B}{B + \sum_{l \in A_t} D_{tl}}. \quad (62)$$

For the example in FIG. 2, the lists of validated measurements for each track are $A_1=\{1,2\}$ and $A_2=\{2,3\}$, and the list of tracks validating each measurement are $C_1=\{1\}$, $C_{21}=\{1,2\}$ and $C_{31}=\{2\}$. Here T1, M1, etc, are denoted by 1. The track lists $L_1$ and $L_2$ are $L_1=\{2\}$ and $L_2=\{1\}$. The association probabilities for T1 are computed below. A similar procedure can be used to compute the probabilities for T2. The $N_{sj}$'s needed in these computations are obtained using (61).

$$N_{21} = \max_{k \in A_2, k \neq 1} \{\Lambda_{2k}\} = \max\{\Lambda_{22}, \Lambda_{23}\} \quad (63)$$

$$N_{22} = \max_{k \in A_2, k \neq 2} \{\Lambda_{2k}\} = \Lambda_{23} \quad (64)$$

$$N_{23} = \max_{k \in A_2, k \neq 3} \{\Lambda_{2k}\} = \Lambda_{22} \quad (65)$$

Equation (60) is then used to compute the $D_{tj}$'s:

$$D_{11} = \Lambda_{11} \sum_{s \in L_1} N_{s1} = \Lambda_{11} N_{21} = \Lambda_{11} \max\{\Lambda_{22}, \Lambda_{23}\} \quad (66)$$

$$D_{12} = \Lambda_{12} \sum_{s \in L_1} N_{s2} = \Lambda_{12} N_{22} = \Lambda_{12} \Lambda_{23} \quad (67)$$

$$D_{13} = \Lambda_{13} \sum_{s \in L_1} N_{s3} = \Lambda_{13} N_{23} = \Lambda_{13} \Lambda_{22} = 0 \quad (68)$$

Finally, (59) and (62) are used to compute the probabilities for T1:

$$\beta_{10} = \frac{B}{B + \sum_{l \in A_{1t}} D_{1l}} = \frac{B}{\Lambda_{11} \max\{\Lambda_{22}, \Lambda_{23}\} + \Lambda_{12} \Lambda_{23} + B} \quad (69)$$

$$\beta_{11} = \frac{D_{11}}{B + \sum_{l \in A_{1t}} D_{1l}} = \frac{\Lambda_{11} \max\{\Lambda_{22}, \Lambda_{23}\}}{\Lambda_{11} \max\{\Lambda_{22}, \Lambda_{23}\} + \Lambda_{12} \Lambda_{23} + B} \quad (70)$$

$$\beta_{12} = \frac{D_{12}}{B + \sum_{l \in A_{1t}} D_{1l}} = \frac{\Lambda_{12} \Lambda_{23}}{\Lambda_{11} \max\{\Lambda_{22}, \Lambda_{23}\} + \Lambda_{12} \Lambda_{23} + B} \quad (71)$$

$$\beta_{13} = \frac{D_{13}}{B + \sum_{l \in A_{1t}} D_{1l}} = 0. \quad (72)$$

To reduce the number of computations required, the nearest-neighbor JPDAF is used instead of the optimal JPDAF. Instead of using equations (32) to (37) to compute the state estimate and covariance matrix, the NNJPDAF looks for the maximum value of $\beta_{tj}$ for each measurement-track pair. The corresponding measurement is then used to update the corresponding track. If the maximum $\beta_{tj}$ corresponds to track 0, which is clutter, no track is updated. When a track is updated by a measurement, both the track and measurement are no longer used. The procedure is repeated until all associations have been made.

Out-of-Sequence-Measurements (OOSM): It is very possible that when the measurements are received by the filter from multiple sensors that the measurements do not arrive in the proper time sequence. One reason that this may occur is that the time delay in getting the data from different sensors is not the same. Another reason, and it is probably the major one, is that if the sensor process time, time from obtaining the raw data to the time the sensor data is transmitted, is subtracted from the sensor time, lower frequency sensors will appear out of sequence. Subtracting the process time may be necessary to get the actual time the measurement is valid.

The above techniques are valid for measurements that are in sequence. Different techniques can be used to handle the OOSM. One is to hold the sensor measurements in a buffer and when the OOSM arrives then process it and the stored measurements in the proper sequence. The problem with this technique is that the current track data can get old and is not properly updated until the OOSM arrives. Another technique is to run the filter as if there are no OOSMs which will keep the track data current and then if an OOSM arrives, go back to the OOSM's time and reprocess the filter tracks from this time forward using the OOSM and any measurements after the OOSM. The problem with this technique is that a lot of data must be stored so that the filter can be restarted from the OOSM time and it takes a lot of process time. The technique used in this filter is to run the filter normally with all current data measurements and store only the track covariance matrices at each measurement time. Then when an OOSM arrives, propagate the track state and covariance back in time to the OOSM time, verify its association to a track and then perform the update with the OOSM. Next propagate this updated track state and covariance matrix to the current time.

The procedure is described in FIGS. [5], [6] and [7]. The algorithm to compute the current state and covariance terms using the OOSM is divided into seven steps 1. State Retrodiction (propagating the state backwards in time to the OOSM time)
2. Measurement Retrodiction 3. Mode Likelihood Functions
4. Data Association
5. State Update within each Filter Model
6. Update of the Current Mode Probabilities
7. Update of the Current Combined Estimate and Covariance State Retrodiction: The state in each model i of the IMM, i=1, . . . , r, is retrodicted to the time τ of the OOSM, denoted in discrete time as κ. The time τ is l steps lagged, i.e., $t_{k-l} < \tau = t_\kappa < t_{k-l+1}$, where $t_k$ is the current time. The retrodiction of the state $x^i$ of model i to κ from k is $$\hat{x}^i(\kappa|k) = F^i(\kappa|k)\hat{x}^i(k|k) \quad (73)$$

where $F^i(\kappa|k)$ is the backward transition matrix of mode i to κ from k. The covariances associated with the state retrodiction are calculated as follows. The covariance of the cumulative effect of the process noise to k from κ in mode i is $$P_{vv}^i(k,\kappa|k) = Q^i(k,\kappa) \quad (74)$$

For a piecewise constant Wiener process acceleration model, or Discrete Wiener Process Acceleration (DWPA) model, the covariance of the process noise multiplied by the gain matrix Γ is $$Q^i(k,\kappa) = \Gamma \tilde{q} \Gamma^T = \begin{bmatrix} \frac{1}{4}T^4 & \frac{1}{2}T^3 & \frac{1}{2}T^2 \\ \frac{1}{2}T^3 & T^2 & T \\ \frac{1}{2}T^2 & T & 1 \end{bmatrix} \sigma_v^2 \quad (75)$$

with $T = t_k - t_\kappa = t_k - \tau$ and $\sigma_v^2$ the covariance of the process noise.

The cross-covariance between the state at k and the process noise to k from κ in mode i is $$P_{xv}^i(k,\kappa|k) = Q^i(k,\kappa) - P^i(k|k-1)S^{*i}(k)^- Q^i(k|\kappa) \quad (76)$$

where $$S^{*i}(k)^{-1} = P^i(k|k-1)^{-1} P^i(k|k-1)^{-1} P^i(k|k) P^i(k|k-1)^{-1} \quad (77)$$

Equation (77) is the key to reducing the l-step lag OOSM problem to the 1-step lag problem while keeping the solution nearly optimal. $S^{*i}(k)$ is the covariance of the "equivalent measurement" at k that summarizes, for model i, all the measurements from k−l+1 to k. To compute this it is necessary to have stored past state covariances $P^i(k-l|k-l)$ for calculation of $P^i(k|k-1)$ for l up to a maximum delay $l_{max}$. To compute $P^i(k|k-1)$:

$$P^i(k|k-1) = P^i(k|k-l) = F^i(k|k-l)P^i(k-l|k-l)F^i(k|k-l)^T + Q(k|k-l) \quad (78)$$

where $F^i(k|k-l)$ is the state transition matrix from k−l to k and $Q(k|k-l)$ is the noise contribution as calculated in (75) with $T = t_k - t_{k-l}$. The covariance for the state retrodiction is $$P^i(\kappa|k) = F^i(\kappa|k)[P^i(k|k) + P_{vv}^i(k,\kappa|k) - P_{xv}^i(k,\kappa|k) - P_{xv}^i(k,\kappa|k)^T]F^i(\kappa,k)^T \quad (79)$$

Measurement Retrodiction: The retrodicted measurement $\hat{z}^i(\kappa|k)$ for filter model i of the IMM estimator is calculated based on (73) for each of the r filter models. The retrodicted OOSM for model i is $$\hat{z}^i(\kappa|k) = H\hat{x}^i(\kappa|k) \quad (80)$$

The corresponding covariance of the innovation is $$S^i(\kappa|k) = HP^i(\kappa|k)H^T + R(\kappa) \quad (81)$$

Mode Likelihood Functions: The likelihood function of each mode at time κ is evaluated based on the OOSM and the corresponding retrodiction from the current time. The likelihood function of mode i based on the OOSM from time τ is $$\Lambda_i(\kappa) = \quad (82)$$
$$|2\pi S^i(\kappa|k)|^{-1/2} \exp\left\{-\frac{1}{2}[z(\kappa) - \hat{z}^i(\kappa)]^T S^i(\kappa|k)^{-1}[z(\kappa) - \hat{z}^i(\kappa|k)]\right\}$$

The resulting vector consisting of all the likelihood functions of the system modes i=1, . . . , r in the IMM estimator at time κ as $$\Lambda(\kappa) = [\Lambda_1(\kappa), \ldots, \Lambda_r(\kappa)]^T \quad (83)$$

Data Association: To perform the data association for an OOSM, it is required to have the IMM estimator's overall likelihood function at time κ. For this the mode-conditioned likelihood functions (82) are used, which rely on the mode-conditioned retrodicted measurement and its covariance, and the retrodicted mode probabilities from the current time k to κ. The mode probabilities at time k (before the OOSM) are given by the vector $$\mu(k|k) = \mu(k, Z^k) = [\mu_1(k|k), \ldots, \mu_r(k|k)]^T \quad (84)$$

where $Z^k$ is the cumulative data at k (not including the OOSM z(κ)) and $$\mu_i(k|k) = Pr\{M(k) = i|Z^k\} \quad (85)$$

Let $\Pi_{ij}(k_2, k_1)$ be the Markov chain transition probability matrix between the modes to time $t_{k_2}$ from time $t_{k_1}$. The elements of this transition matrix are $$\Pi_{ij}(k_2, k_1) = Pr\{M(k_2) = j | m(k_1) = i\} \quad (86)$$

And the mode probability vector evolves according to $$\mu(k_2|k) = \Pi(k_2, k_1)^T \mu(k_1|k) \quad (87)$$

The transition probability matrix to time $t_{k_2}$ from time $t_{k_1}$ is $$\prod(k_2, k_1) = \frac{1}{\lambda_1 + \lambda_2}\begin{bmatrix} \lambda_2 + \lambda_1 e^{-(\lambda_1+\lambda_2)T} & \lambda_1 - \lambda_1 e^{-(\lambda_1+\lambda_2)T} \\ \lambda_2 - \lambda_2 e^{-(\lambda_1+\lambda_2)T} & \lambda_1 + \lambda_2 e^{-(\lambda_1+\lambda_2)T} \end{bmatrix} \quad (88)$$

where $T = |t_{k_2} - t_{k_1}|$ and $$\frac{1}{\lambda_1}$$

and $$\frac{1}{\lambda_2}$$

are the sojourn times in modes 1 and 2. Therefore, the retrodicted mode probability vector to κ from k is $$\mu(\kappa|k) = \Pi(\kappa|k)^T \mu(k|k) \quad (89)$$

The IMM estimator's overall likelihood function for the OOSM is $$\Lambda_{IMM}(\kappa) = \sum_{i=1}^{r} \Lambda_i(\kappa)\mu_i(\kappa|k) = \Lambda(\kappa)^T \mu(\kappa|k) \quad (90)$$

where $\Lambda_i(\kappa)$ are given in (82) and $\mu_i(\kappa|k)$ follows from (89). This is to be used in the data association to select the delayed measurements to be used in the track update.

State Update within each Filter Model: This shows the update of the state at the current time $t_k$ in each model of the IMM using the selected OOSM. The covariance between the state at k and this measurement is calculated as $$P_{xz}^i(k,\kappa|k) = [P^i(k|k) - P_{xv}^i(k,\kappa|k)]F^i(\kappa|k)^T H^T. \quad (91)$$

The filter gain used for the update is $$W^i(k,\kappa) = P_{xz}^i(k,\kappa|k) S^i(\kappa)^{-1} \quad (92)$$

Then update of the most recent state estimate $\hat{x}(k|k)$ with the OOSM $z(\kappa)$ is given by $$\hat{x}^i(k|Z^k, z(\kappa)) = \hat{x}^i(k|Z^\kappa) = \hat{x}^i(k|\kappa) \quad (93)$$
$$= \hat{x}^i(k|k) + W^i(k,\kappa)[z(\kappa) - \hat{z}^i(\kappa|k)]$$

where the predicted OOSM is given in (80) and the gain is given in (92). The filter-calculated covariance for the updated state estimate is $$P^i(k|\kappa) = P^i(k|k) - P_{xz}^i(k,\kappa|k) S^i(\kappa)^T P_{xz}^i(k,\kappa|k)^T \quad (94)$$

Update of the Current Mode Probabilities: This shows how the mode probabilities are updated at the current time. The conditional mode probabilities at time k (before the OOSM), given by the vector $$\mu(k|k) = [\mu_1(k|k), \ldots, \mu_r(k|k)]^T \quad (95)$$

are to be updated with the OOSM into $$\mu(k|\kappa) = [\mu_1(k|\kappa), \ldots, \mu_r(k|\kappa)]^T \quad (96)$$

according to $$\mu_i(k|\kappa) = \frac{1}{c}\left[\sum_{j=1}^{r} \Lambda_j(\kappa) \prod_{ij}(\kappa,k)\right]\mu_i(k|k) \quad (97)$$

where the normalized constant is $$c = \sum_{l=1}^{r}\sum_{j=1}^{r} \Lambda_j(\kappa)\prod_{ij}(\kappa,k)\mu_l(k|k). \quad (98)$$

Update of the Current Combined Estimate and Covariance: Finally the new combined estimate, after the OOSM, is $$\hat{x}(k|\kappa) = \sum_{j=1}^{r} \hat{x}^j(k|\kappa)\mu_j(k|\kappa) \quad (99)$$

and its covariance is $$P(k|\kappa) = \Sigma\mu_j(k|\kappa)\{P^j(k|\kappa) + [\hat{x}^j(k|\kappa) - \hat{x}(k|\kappa)] \times [\hat{x}^j(k|\kappa) - \hat{x}(k|\kappa)]^T\} \quad (100)$$

Track Management: A procedure is needed to determine when to initiate a new track and when to drop a track that is no longer being detected by the sensors. Under normal operations, measurements from the sensors are assigned to tracks and are used to update the tracks. If a new measurement is reported by a sensor and it is not associated to an existing track, it may be used to start a new tentative track.

To become a tentative track a sensor must report the same measurement for X number of consecutive scans. The value of X will be determined from real time tests, but initially it is set to 2. If during the next sensor scan the sensor again reports the measurement for the tentative track, the tentative track now becomes a firm track and can be updated by any sensor measurement. If during the next sensor scan the sensor does not report a measurement that corresponds to the tentative track, the tentative track is dropped.

A new firm track is given the lowest integer that has not already been assigned to a firm track. For example, if there are three fun tracks present that have been assigned numbers 1, 2, and 3 then the next firm track will be assigned number 4. If there are three tracks present and they are assigned numbers 1, 4, and 7 then the next firm track will be assigned number 2.

Another function of the Track Management process is to determine if an existing track should be dropped. The Track Management process keeps track of which sensor updates the firm tracks. If all sensors do not update a firm track for at least Y scans, then the firm track is dropped. The value of Y will be determined from real time tests, but initially it is set to 2 for optical sensors and 3 for ranging sensors. As long as one sensor is updating a firm track it will not be dropped.

Sensor Data Conversion: The sensors usually report their target measurements in a polar reference frame, range and azimuth or bearing. The tracking estimator usually computes its Firm Target File in a Cartesian reference frame because it is easier to understand and visualize. Therefore, the sensor data must be converted to the Cartesian reference frame before it is used by the tracking filter.

The standard conversion from the polar to the Cartesian reference frame is:

$$x_m = r_m \cos\theta_m \text{ and } y_m = r_m \sin\theta_m, \quad (101)$$

where $r_m$ and $\theta_m$ are the range and bearing, respectively, of the sensor target in the polar reference frame and $x_m$ and $y_m$ are the downrange and cross range coordinates, respectively, in the converted Cartesian reference frame. However, when dealing with the statistics of the measurements, mean and variance, one cannot use the above equations to transform from the polar to the Cartesian frames. The uncertainty in the range and the bearing is not a perfect ellipsoid so there needs to be debiased correction terms subtracted from (101) to get a better value for the downrange and cross range measurements and their variances.

The following equations give the debiased conversion from a polar coordinate frame to a Cartesian reference frame:

$$x^{dc} = r_m \cos\theta_m - E[\tilde{x}|r_m,\kappa_m], \quad (102)$$

$$y^{dc} = r_m \sin\theta_m - E[\tilde{y}|r_m,\theta_m], \quad (103)$$

where
$x^{dc}$ and $y^{dc}$ are the final downrange and cross range debiased conversion coordinates of the sensor target and $$E[\tilde{x}|r_m,\theta m] = r_m \cos\theta_m(e^{-\sigma\theta^2} - e^{-\sigma\theta^2/2}) \quad (104)$$

$$E[\tilde{y}|r_m,\theta_m] = r_m \sin\theta_m(e^{-\sigma\theta^2} - e^{-\sigma\theta^2/2}). \quad (105)$$

The covariance matrix, $R_a$, for the downrange and cross range coordinates are $$R_a^{11} = \text{var}(\tilde{x}|r_m, \theta_m) = r_m^2 e^{-2\sigma_\theta^2}[\cos^2\theta_m(\cos h2\sigma_\theta^2 - \cos h\sigma_\theta^2) + \sin^2\theta_m(\sin h2\sigma_\theta^2 - \sin h\sigma_\theta^2)] + \sigma_r^2 e^{-2\sigma_\theta^2}] \cos^2\theta_m(2\cos h2\sigma_\theta^2 - \cos h\sigma_\theta^2) + \sin^2\theta_m(2\sin h2\sigma_\theta^2 - \sin h\sigma_\theta^2)], \quad (106)$$

$$R_a^{22} = \text{var}(\tilde{y}|r_m, \theta_m) = r_m^2 e^{-2\sigma_\theta^2}[\sin^2\theta_m(\cos h2\sigma_\theta^2 - \cos h\sigma_\theta^2) + \cos^2\theta_m(\sin h2\sigma_\theta^2 - \sin h\sigma_\theta^2)] + \sigma_r^2 e^{-2\sigma_\theta^2}[\sin^2\theta_m(2\cos h2\sigma_\theta^2 - \cos h\sigma_\theta^2) + \cos^2\theta_m(2\sin h2\sigma_\theta^2 - \sin h\sigma_\theta^2)], \quad (107)$$

$$R_a^{12} = \text{cov}(\tilde{x}, \tilde{y}|r_m, \theta_m) = \sin\theta_m \cos\theta_m e^{-4\sigma_\theta^2}[\sigma_r^2 + (r_m^2 + \sigma_r^2)(1 - e^{\sigma_\theta^2})], \quad (108)$$

where $\sigma_r^2$ and $\sigma_\theta^2$ are the variances of the range and bearing, respectively, in the sensor polar reference frame.

Performance Improvement Analysis

Figure 15:
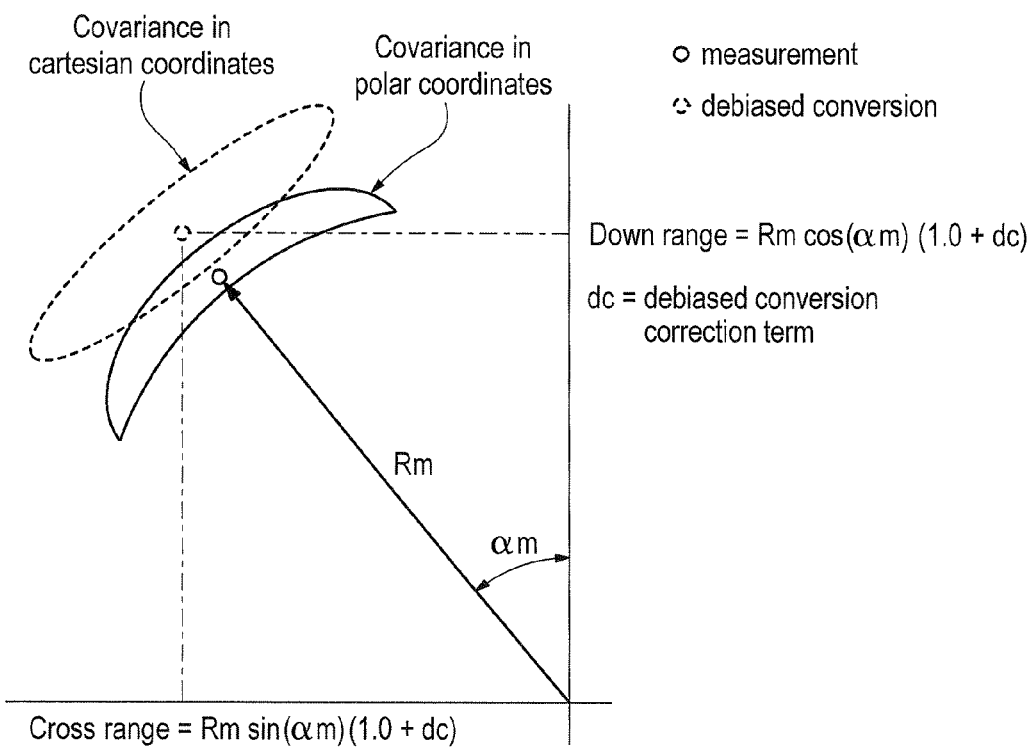
FIG. 15.

FIG. 15. A sensor that provides range, r, and angle, θ, can be converted to the Cartesian coordinates of down range, x, and cross range, y, by using x=r cos(θ) and y=r sin(θ). However, r=rt+re and θ=θt+θe, where rt stands for true range and re stands for the range error. The same applies to the angle. This means that the down range measurement, xm, and the cross range measurement, ym, are as follows:

$$xm = xt + xe = (rt+re)\cos(\theta t+\theta e) \text{ and } ym = yt + ye = (rt+re)\sin(\theta t+\theta e).$$

Expanding these out can give you the error means and covariances, however, it requires knowing the true range, rt, and angle, θt, which are not known. Therefore, the expected values and covariances must be computed based on the measure values of range and angle and not the true values. When this is done the expected value, mean, and covariance of the down range error, xe, and cross range error, ye, give a correction terms for the range and angle terms.

Figure 16:
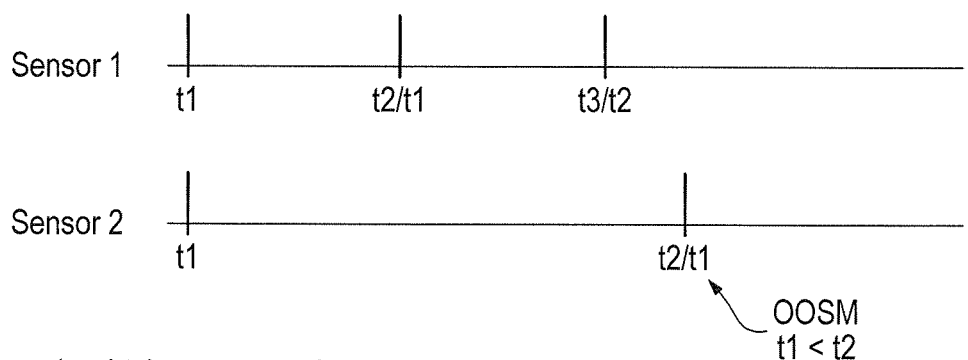

FIG. 16. Assume you have two sensors that take different time intervals to process the raw data. In the slide sensor 1 could be a radar sensor that process the raw data faster and, therefore, has a faster output rate. Sensor 2 could be an optical sensor that takes longer to process the raw data.

Both sensors get the raw data at time t1. Sensor 1 takes the time from t1 to t2 to process its data and then sends it to the filter. Since the process time is known, a time tag can then be applied to the data which was received at t2 with the time t1 which is more accurately the time of the data. For the data received from sensor 1 at t3, the time tag of t2 is given. This is a way to compensate for the sensor latency. Now look at sensor 2 which takes a longer time to process its data than sensor 1. When the data packet arrives at time t2 it is actually given the time stamp of t1 since that more accurately reflects the time of the data. You can see that this will cause a sequence problem if the data rates of the sensors are not the same. Sensor 2's data at its time t2 is tagged as t1 which comes earlier in real time than sensor 1's data at t3 that is tagged as t2. This data is now out of sequence because the filter has processes data from sensor 1 for time t2 and now it gets data from sensor 2 with a time tag of t1. This is where the filter's OOSM (out-of-sequence-measurements) algorithms come into play.

Figure 17:
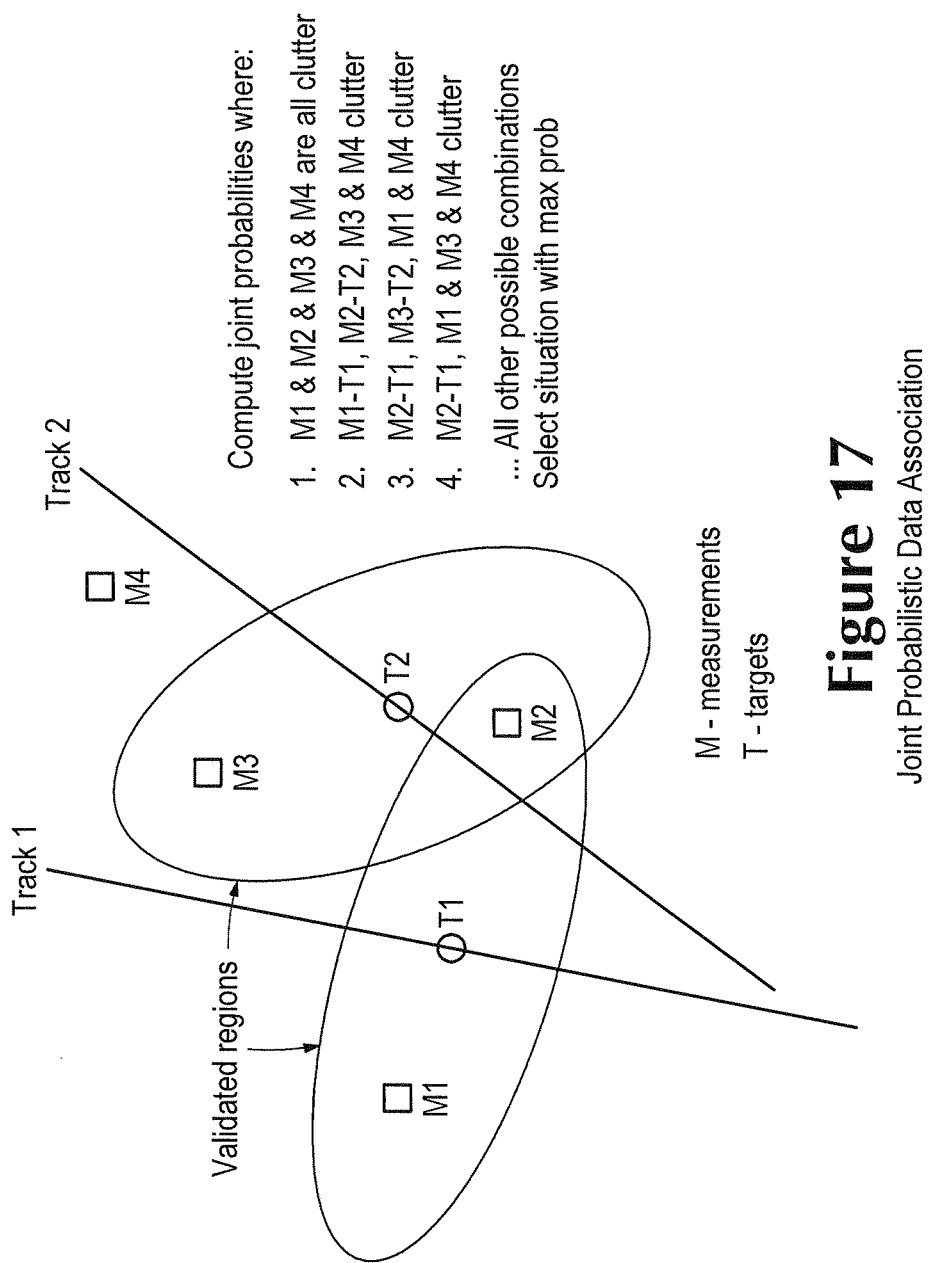

FIG. 17 JPDA is a technique to deal with the problem of taking measurement data and either associating it with an existing track, rejecting it because it may be clutter, or possibly starting a new track. A validation region is generated for each track about the predicted measurement point and all measurements that fall in these regions are considered. The probabilities for all possible combinations of valid measurements to tracks are computed and the highest probabilities are used to match up the measurements and tracks. Presently this approach is used, which is the nearest-neighbor JPDA filter instead of the true optimal JPDA filter which requires more computations.

Figure 18:
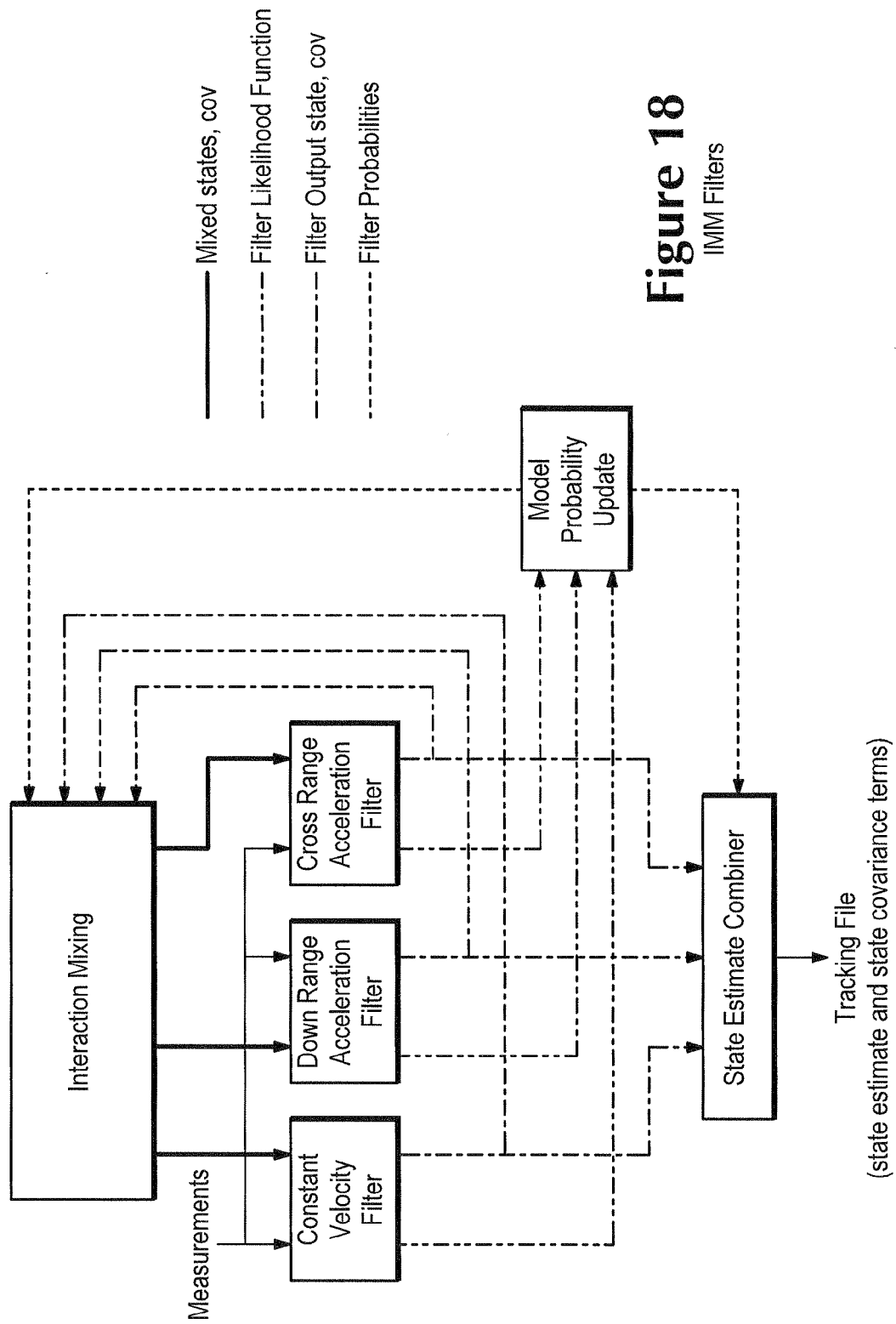

FIG. 18. Instead of one Kalman Filter to estimate the position, velocity and acceleration of the targets, three filters are proposed, a constant velocity filter, down range acceleration filter, and a cross range acceleration filter. All three filters run at the same time and their outputs are weighted based on what the IMM thinks is the best filter for the trajectory. This allows the constant velocity filter to estimate the target trajectory when the target is not accelerating, the down range acceleration filter to estimate the trajectory when the target is accelerating straight ahead, and the cross range filter to estimate the trajectory when the target is in a turn. Since the best filter is operating during its part of the trajectory, the estimate errors are smaller. Also if the target is accelerating straight ahead and turning, then both the down range and cross range filters may be equally heavily weighted.

Figure 19:
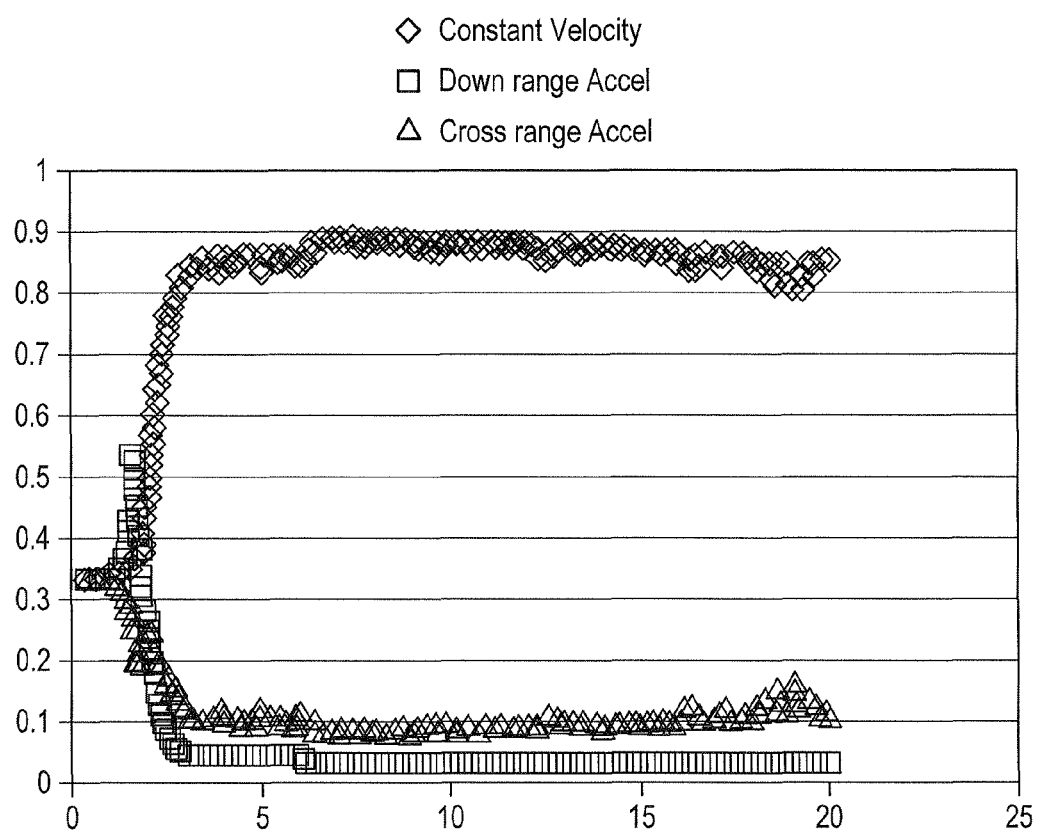

FIG. 19. The IMM filters starts off with all three filters (constant velocity, down range acceleration, and cross range acceleration) weighted equally. The IMM switching soon determines that the target is moving at a constant velocity and weights this filter much heavier than the two acceleration filters.

Figure 20:
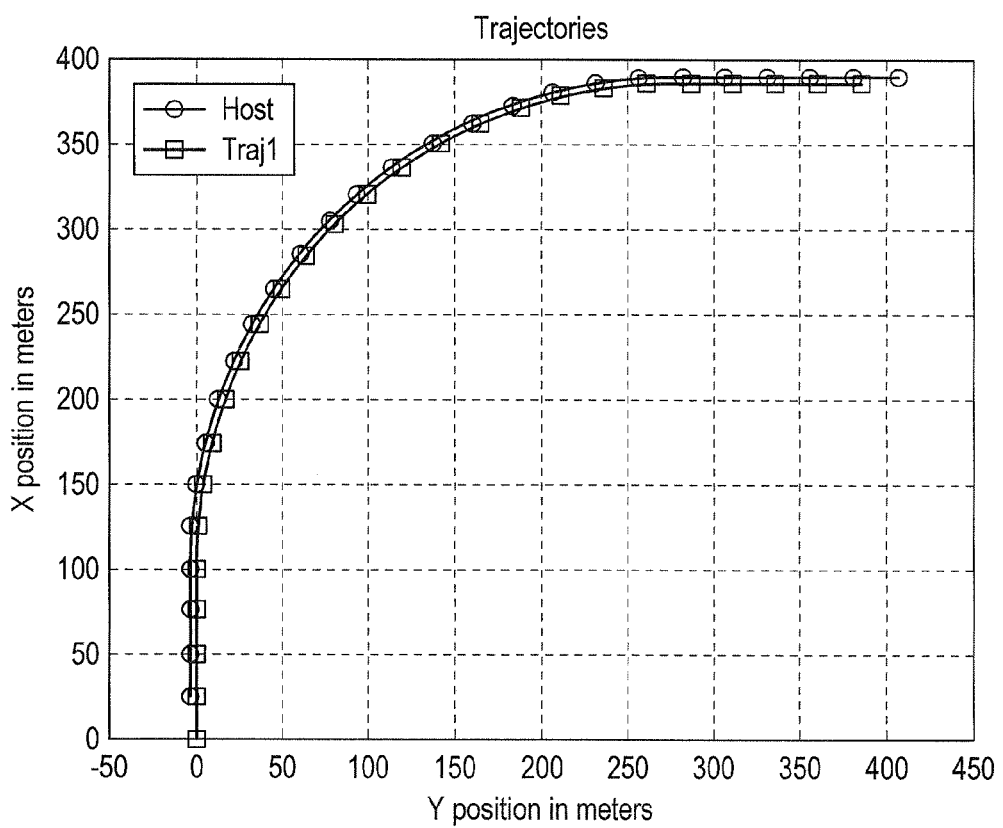

FIG. 20. In this trajectory both vehicles perform a 90 degree constant rate turn to the right. However, the target vehicle is about 25 meters ahead of the host vehicle and one lane to the left so it starts the turn earlier. The start on the plots indicates the starting position.

Figure 21:
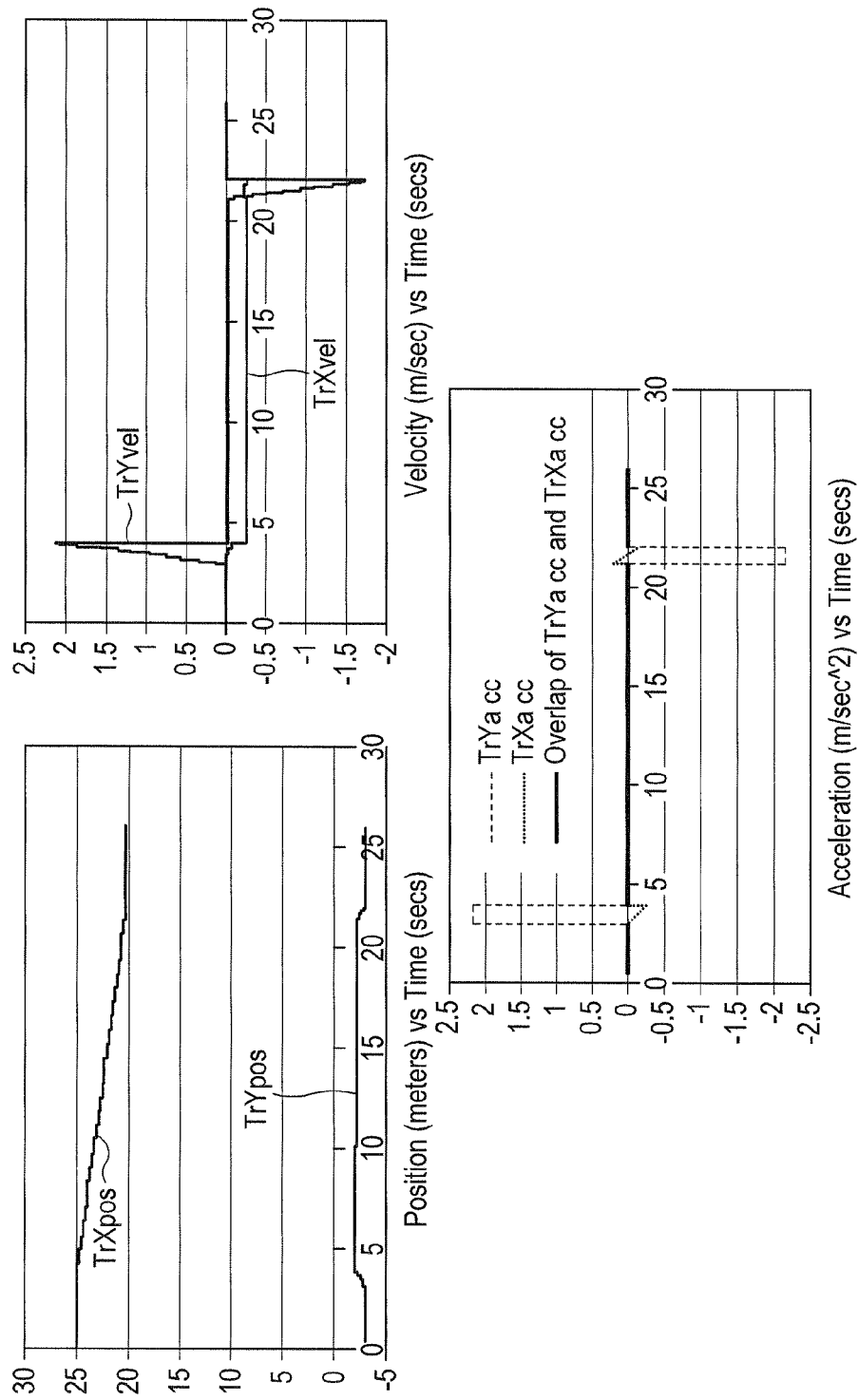

FIG. 21. These show the relative position, velocity and acceleration of the target vehicle to the host vehicle. Note the acceleration curve which shows the lateral acceleration due to the turning of the vehicles. The spikes occur due to one vehicle turning while the other is not.

Figure 22:
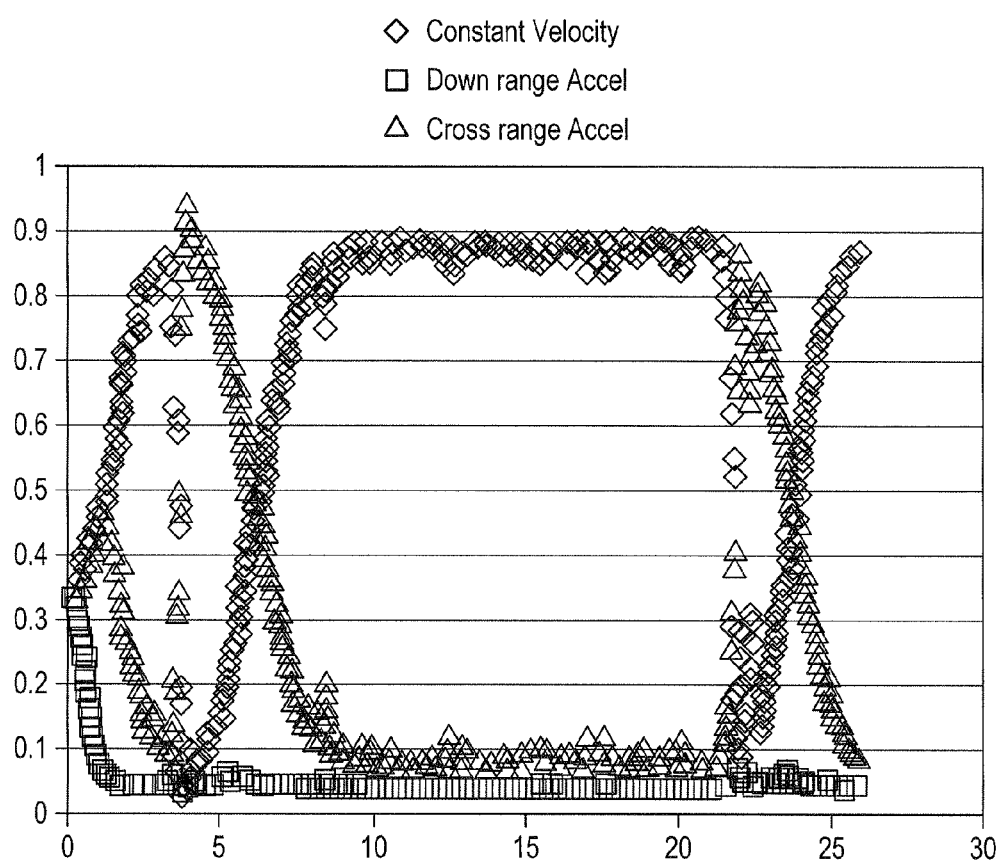

FIG. 22. This shows that again initially the three filters start off equally, but when one vehicle turns and the other does not, the filter that looks for cross range acceleration filter is weighted much heavier during the acceleration spike, but decreases gradually after the spike.

FIG. 23. Typical radar values expected

FIG. 24. Typical maneuver scenario

Figure 25:
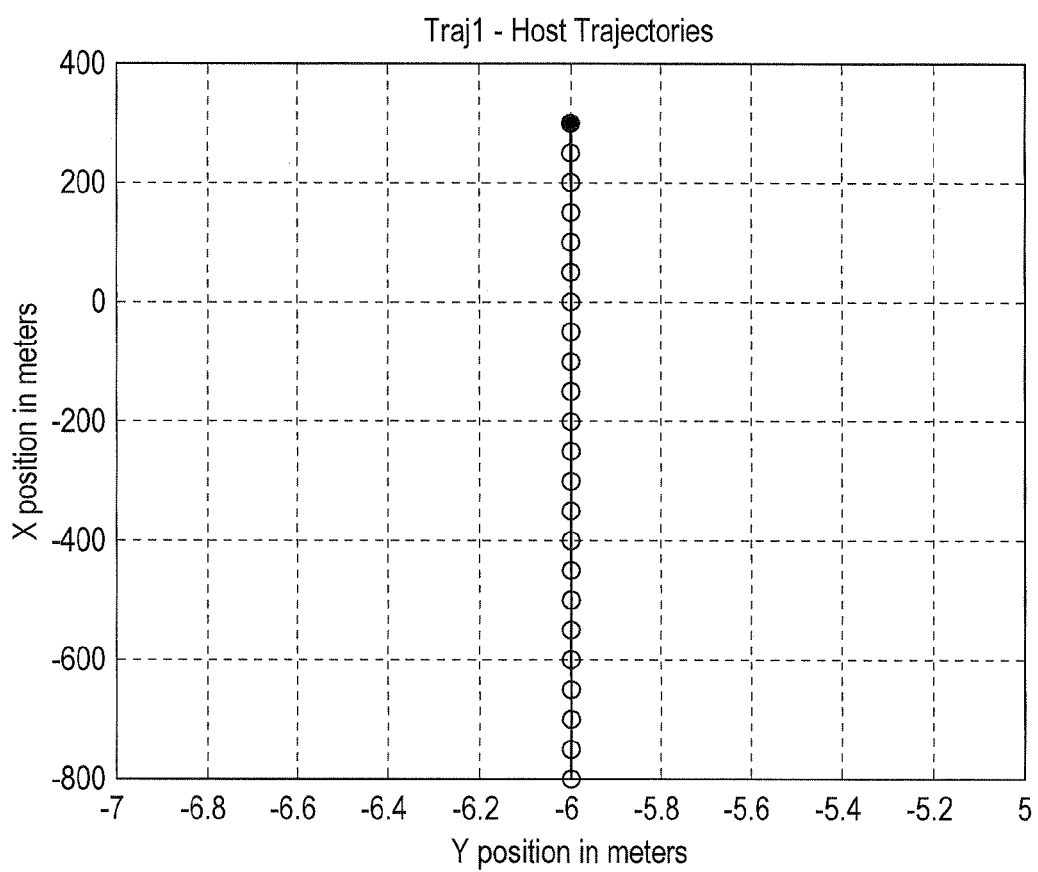

FIG. 25. This shows the relative position of the target vehicle with respect to the host vehicle. The relative velocity is −50 m/sec in the X axis and 0 in the Y axis.

Figure 26:
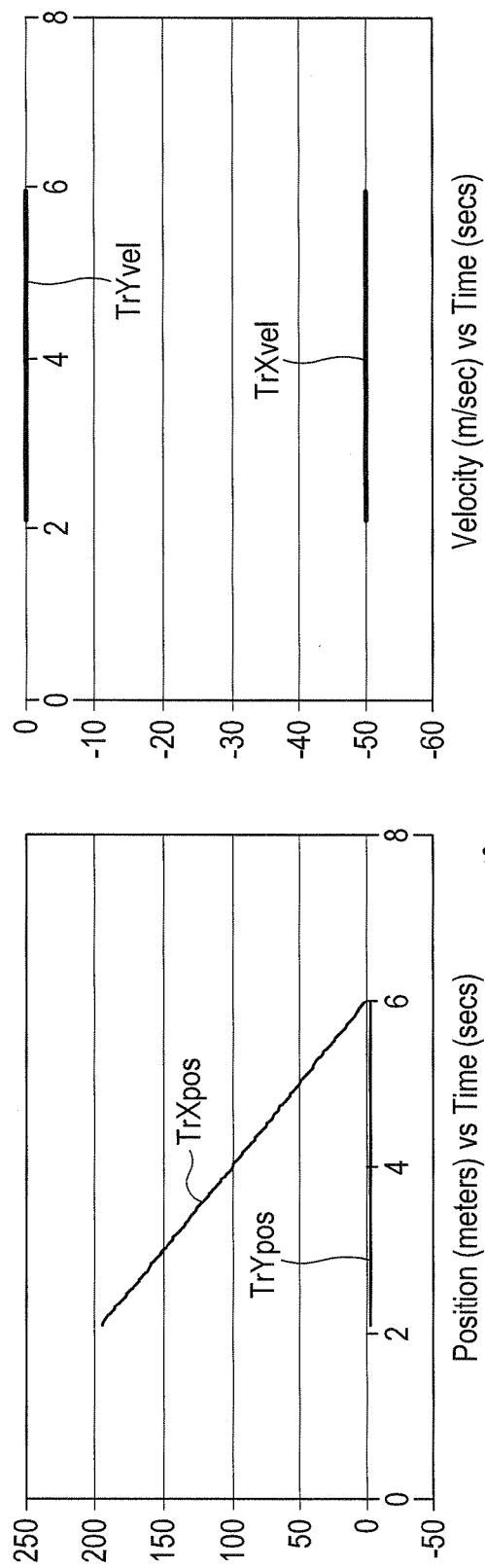

FIG. 26. This shows the relative position and velocity charts for the X (down range) and Y (cross range) axes.

Figure 27:
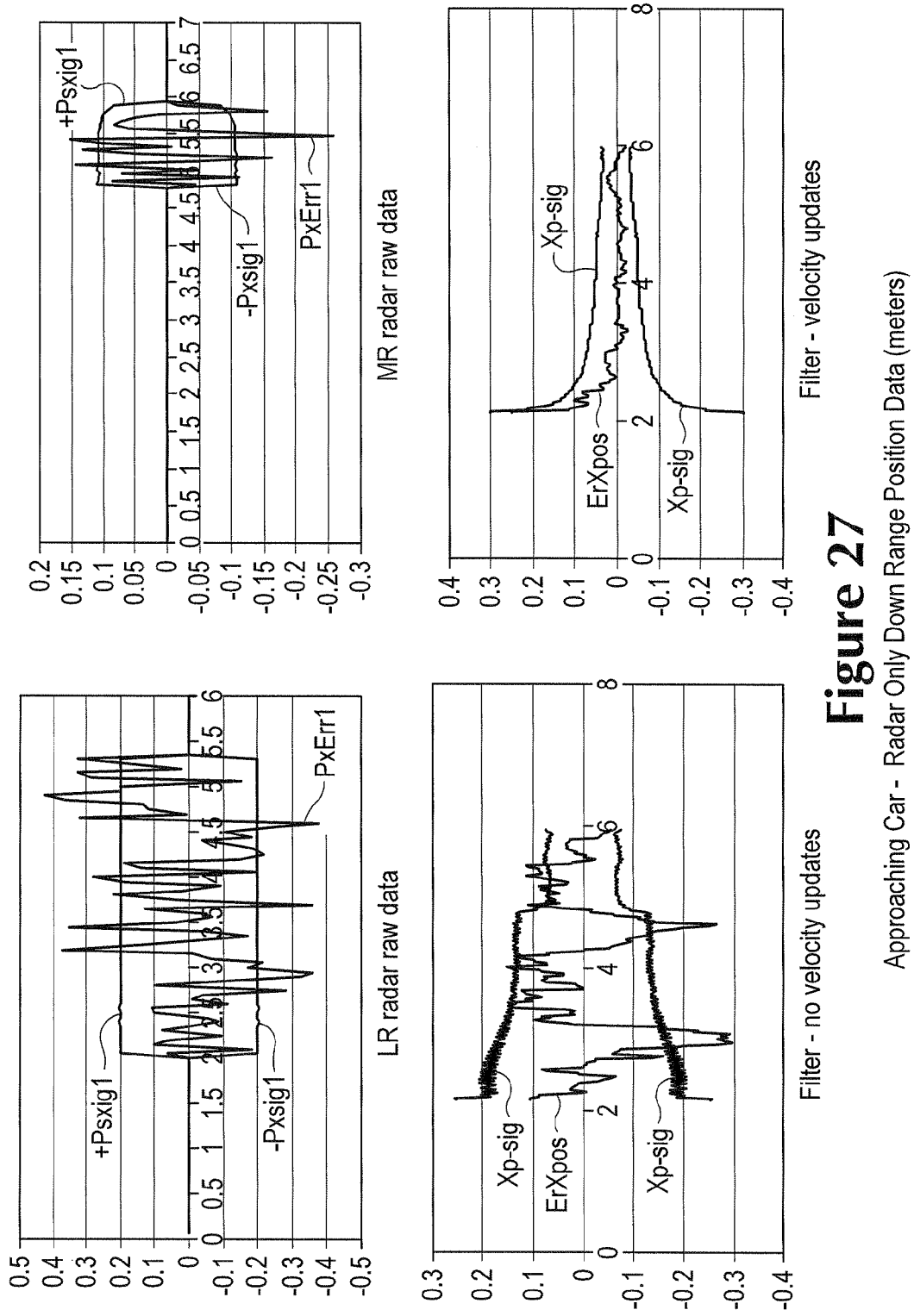

FIG. 27. Using the long range and medium range sensor characteristic data shown in slide 12 raw sensor data is generated. The upper left plot shows the error in the generated down range position for the long range radar and the upper right plots shows the error for the medium range radar. The magenta and yellow lines show the 1-sigma standard deviation values for the noisy data. The maximum range and horizontal FOV determines the start and stop times of the plots.

The bottom plots show the improvement in the position data using the sensor fusion filter. The bottom left plot shows the result of the fusion filter using only position updates. The bottom tight plot uses position and velocity, range-rate, updates. The magenta lines are the true errors since the true track is known. The blue and yellow lines give the filter 1-sigma standard deviation values of the filter error. The decrease in these uncertainty curves for the no velocity update plot is a result of the medium range radar coming into play at about 4.6 seconds. The small bump up after this drop is due to the long range radar dropping out due to FOV. If range-rate updates are available, then the medium range radar does not improve the performance much as shown in the bottom right plot.

Properly tuning the filter should improve the results since the true error points outside the 1-sigma curves are much less than 32%.

Figure 28:
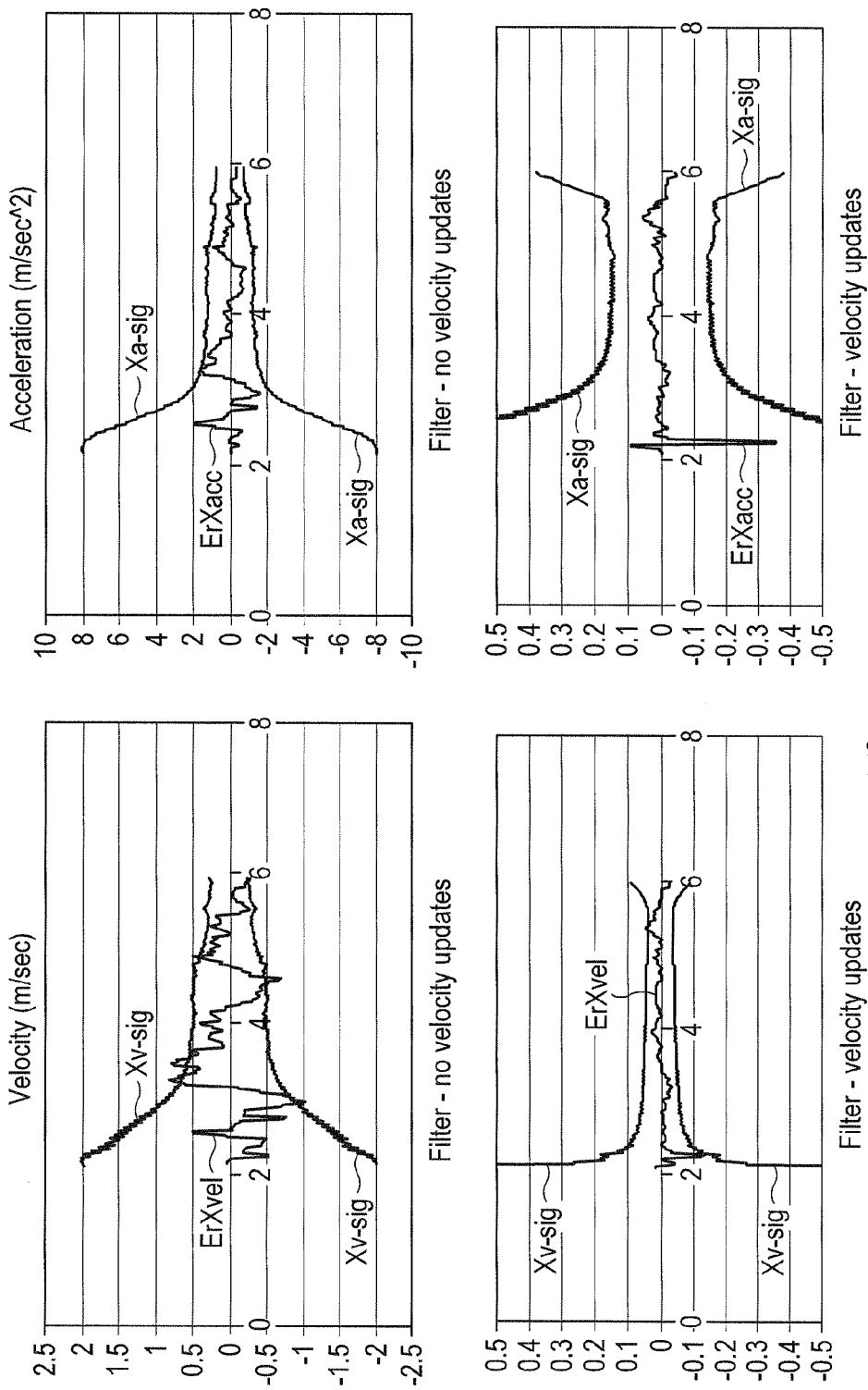

FIG. 28. These plots show the filter down range velocity and acceleration error plots when not using velocity updates and when using velocity updates. Again it shows that the filter is not optimally tuned and with tuning the performance should improve slightly.

The increased values of the uncertainty curves when velocity data is used are a result of the long range radar dropping out due to the target reaching its FOV limits.

Figure 29:
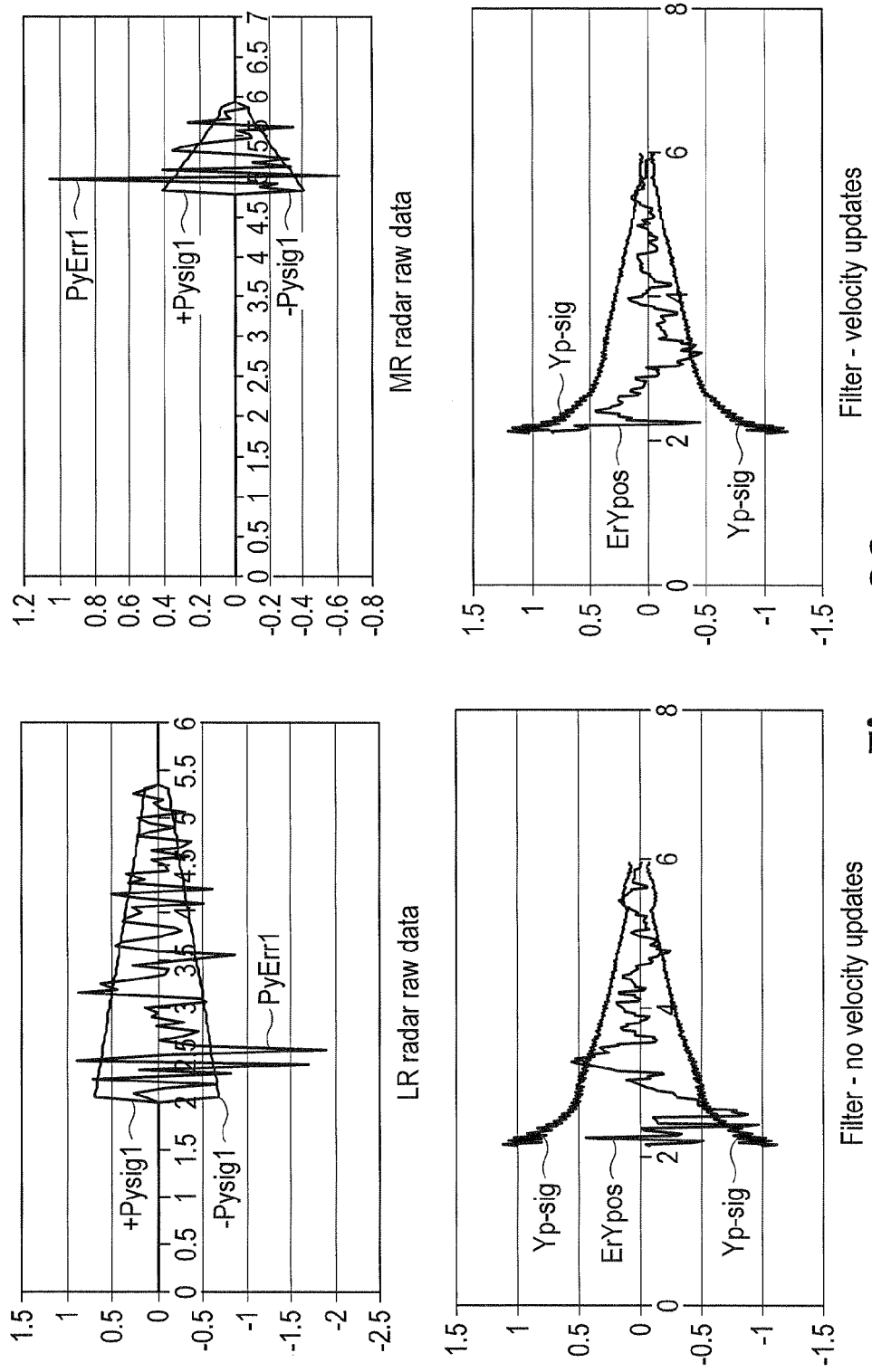

FIG. 29. This shows the same data as slide 17 except this is for the cross range position instead of the down range position. The decrease in the uncertainty curves is a result of the fact that the cross range errors is equal to the range times the angle uncertainty. As the target approaches the host, the range decreases, and therefore, the cross range error decreases.

The small bump up in the filter—no velocity updates uncertainty curves is a result of the long rang radar dropping out due to the FOV restriction.

Figure 30:
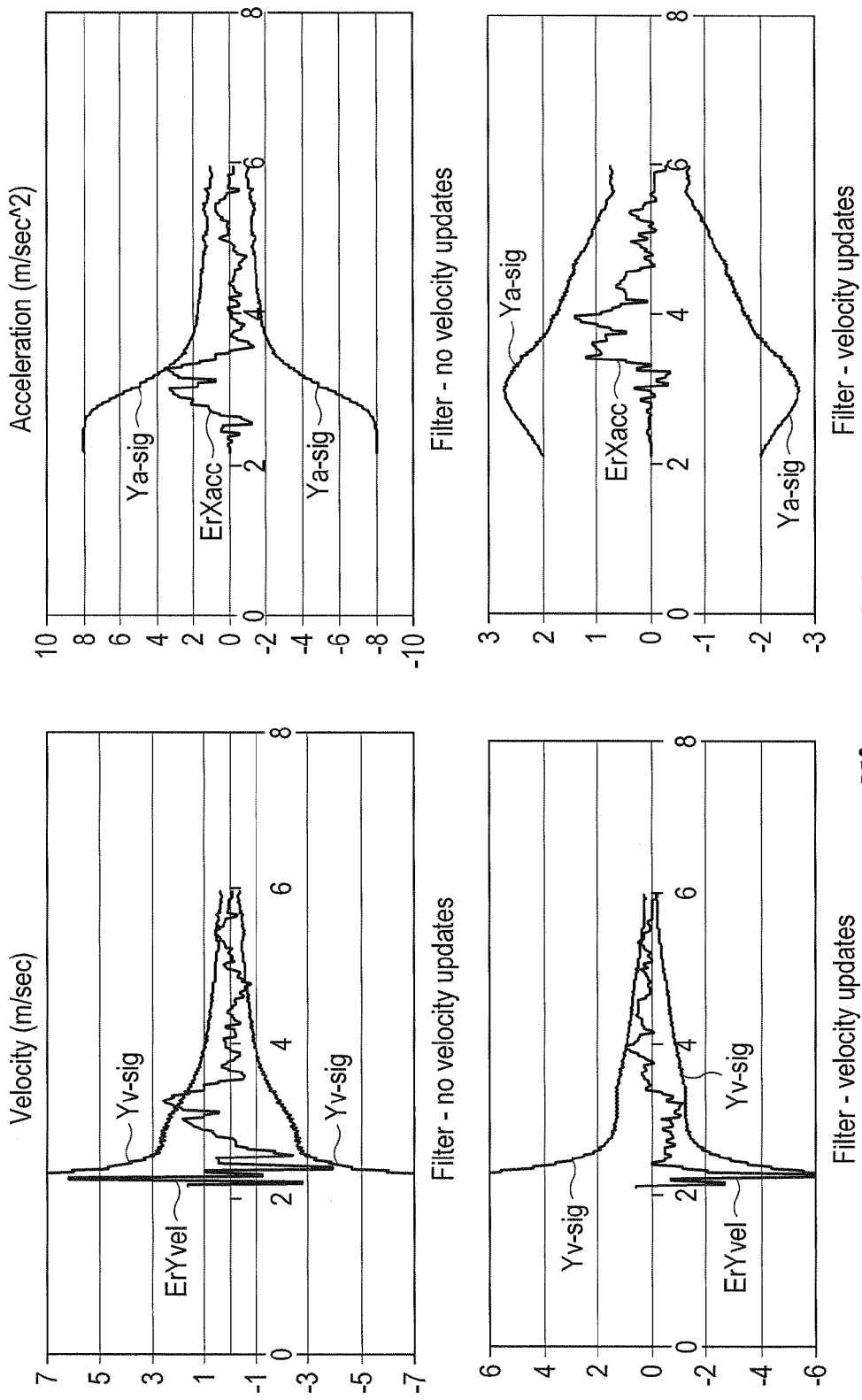
-FIG. 30. Performance Predictions

FIG. 30. This shows the same as slide 18 except for the cross range values instead of the down range values. The bump up in the bottom right plot is because the inventors did not have the initial covariance values large enough for the acceleration.

Configuration Tool Suite

Figure 31:
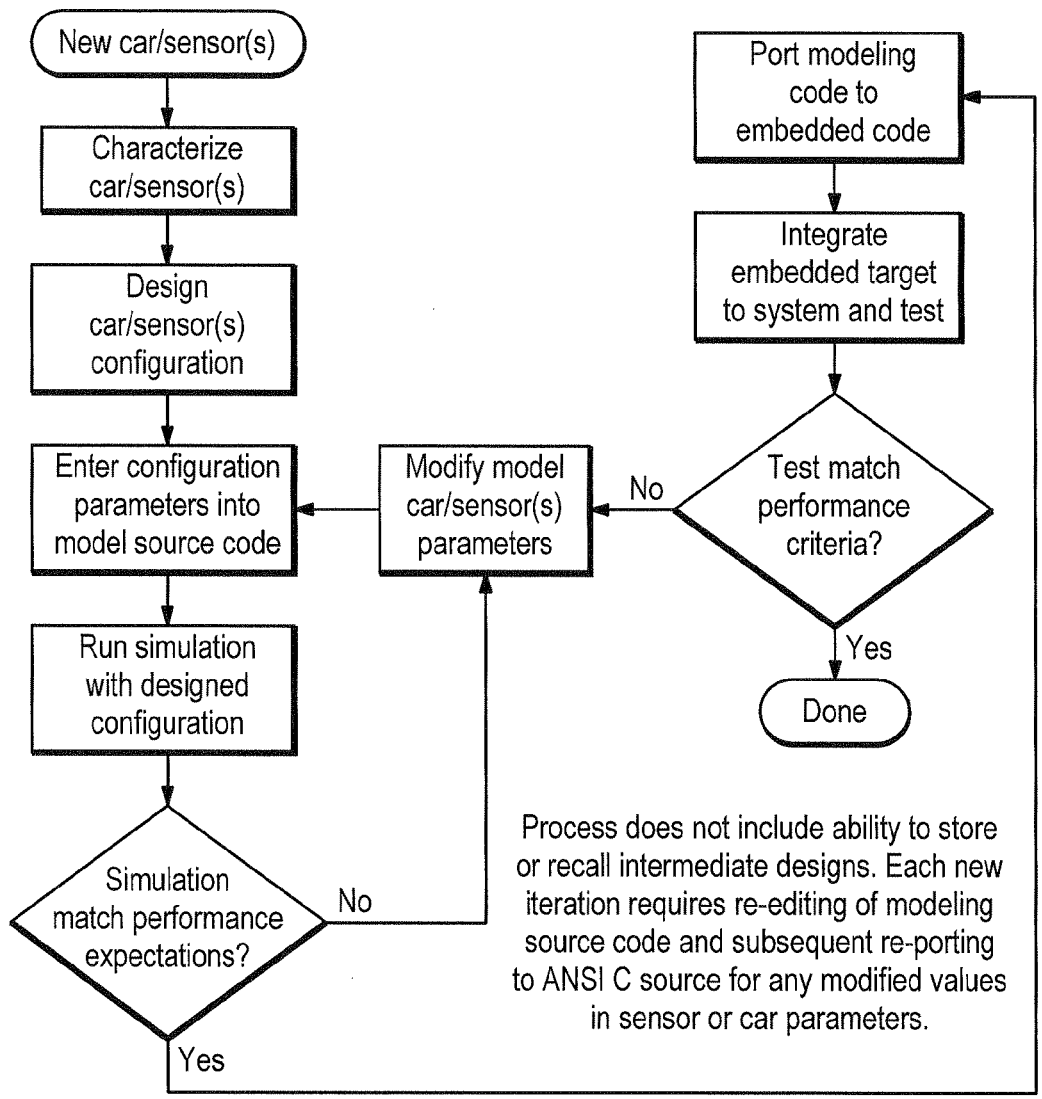
FIG. 31. is a diagram showing a typical design process to configure a car with new sensors.
Figure 32:
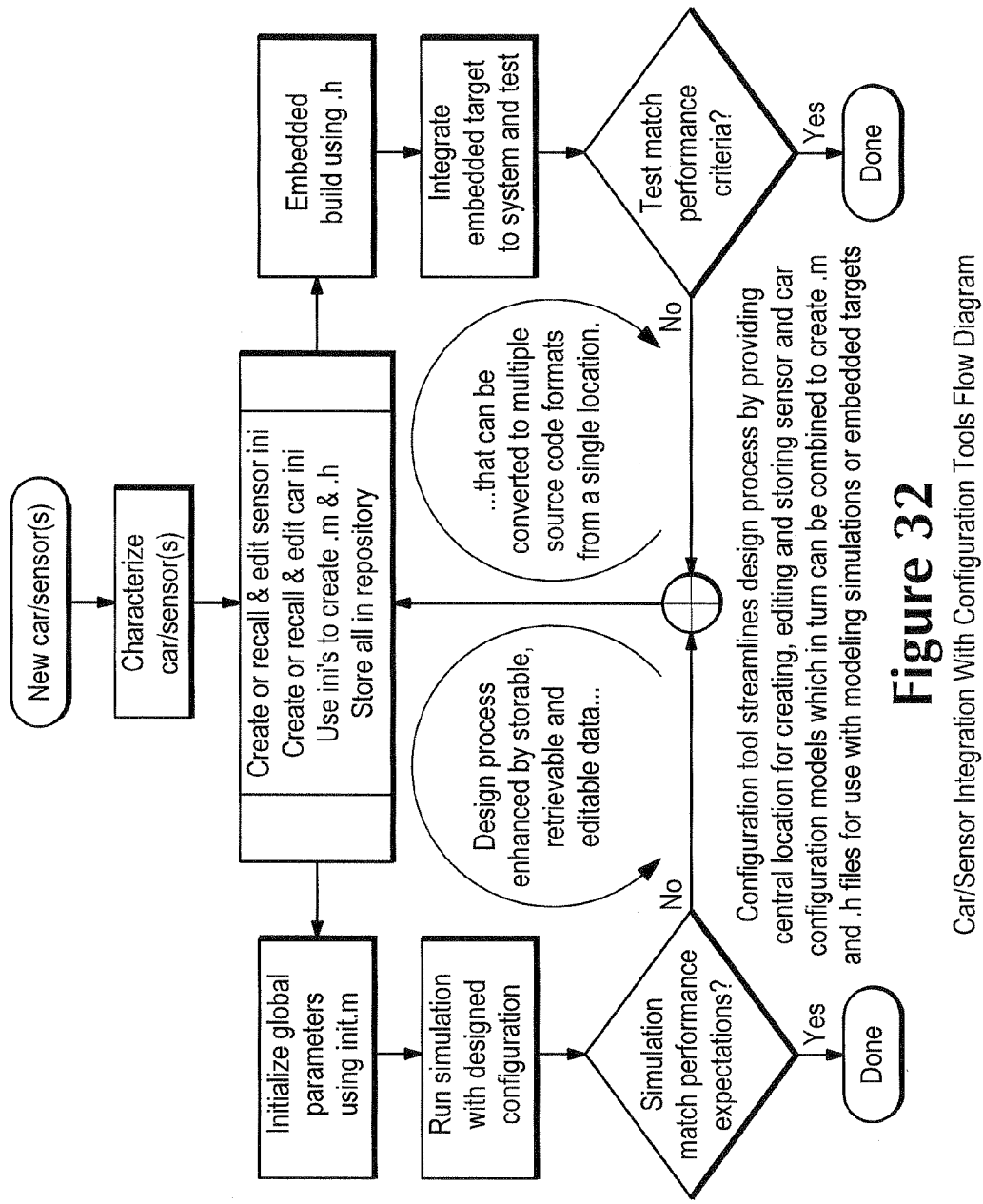
FIG. 32. is a diagram showing a design cycle to configure a car with sensors using the configuration tool.

In one application of the invention we present a system and methods to configure the input variables of a fully integrated automotive advanced driver assistance system as described below. The process comprising the steps of modeling the behavior of an automobile fitted with various sensors and requires access to many parameters describing the automobile, the sensors and how the sensors are mounted to the automobile. Typical car/sensor modeling may include parameters such as the following:

Geometry and physical parameters of the automobile
  Length
  Width
  Height
  Wheel location
  Number of sensors
  Location of each sensor on automobile
Navigation sensor (GPS device/mapping data)
Inertial sensor (gyros, accelerometers, IMUs)
Target sensor (RADAR, LIDAR, InfraRed, Imager)
  Sensor ID (manufacture, model, version, . . . )
  Number of accuracy levels per sensor
  Range and timing specifications per sensor
    Maximum tracked targets
    Data frame rate
    Data time lag
    Maximum range to target
    Maximum range rate
    Maximum angle (field of view)
    Maximum angle rate
    Width of target
    Height of target
  Initialization values per sensor
    Target X position, velocity, acceleration
    Target Y position, velocity, acceleration
  Sensor error characteristics
    Range sigma
    Range rate sigma
    Angle sigma
    Angle rate sigma
  Bus type
    Ethernet
    CAN
    Flexray During the initial phases of characterizing a new sensor, or determining the best location for installation onto a vehicle, it is common for the parameter values used in modeling the sensor or configuration to change. During the design phase of an automobile-sensor configuration, parameter values describing the car or a sensor will require optimization. The models using the parameter values must therefore be updated with the new values before simulations can resume. During the course of design, this cycle of optimization and simulation may occur several times, requiring many iterations of tedious and time consuming attention to detail as optimized parameter values are edited directly into modeling and simulation source code. (See FIG. 31).

Host Configuration Tool Suite

The Configuration Tool Suite is a family of configurable software programs that run on a standard desktop computer within the Windows operating system. The software is comprised of one top level Win32 based program including an executable and a user interface, one dynamically loaded library automatically loaded at startup, and at least one, but possibly several other modules, each with its own user interface, that can be installed and run concurrently by a user during a design session. The configuration of the top level executable, or Host Program, refers to the type and number of loadable modules that are installed at any one time. Together, the executable and the loadable modules provide a set of tools enabling engineers to complete the design and testing phases of automotive sensor configurations quicker and more efficiently. This disclosure will discuss process, methods and technology related specifically to the top level executable portion of the tool suite.

Host Program

The executable portion of the tool suite or Host Program is essentially a model development module server. Although it can run without having a module installed, it does not become useful as a design or simulation tool without at least one module being loaded. At startup the executable program is comprised simply of a user interface, memory management and module management routines. Default behavior for the executable at start up, is to configure the Suite as it was at the end of the previous session. If for instance, during a previous session the user exited the application with only a Source Code Generator module installed, then the application will initialize itself upon the next session start-up by installing only the Source Code Generator. Memory management is an inherent feature of the executable. Although not directly accessible by the user, it plays an important role in allowing loadable modules to be installed and uninstalled during a runtime session without adversely affecting the executable. Memory management enables the executable to dynamically allocate and de-allocate memory. The only limit to how much memory can be allocated is determined by the physical memory available on the computer running the program.

User Interface

The user interface performs three primary functions: Access to module management functions, viewing the current configuration and exiting the program. Each feature is accessed through point and click mouse events. Each feature is available from the start of a session. The module management menu will reflect the current configuration of the executable at the time of start up.

Memory Management

Memory management is an inherent feature of the executable. Although not directly accessible by the user, it plays an important role in allowing loadable modules to be installed and uninstalled during a runtime session without adversely affecting the executable. Memory management enables the executable to dynamically allocate and de-allocate memory. The only limit to how much memory can be allocated is determined by the physical memory available on the computer running the program.

Module Management

Module management routines are included in the executable program and are specifically designed to perform all the tasks associated with loadable modules; identifying, authenticating, installing, uninstalling & reporting are among these tasks. A pull down menu is the interface item used to identify and select a module for installation and to uninstall a module. Authentication and reporting are performed without additional intervention from the user as an internal module management process. Corresponding .ini files exist for each valid module and contain information necessary in describing the module to the configuration tool.

Plug-In Modules

Modules designed for use with the Configuration Tool Suite are portable executable programs and will not run stand-alone. Each is designed as a plug-in module having a unique set of features and capabilities to provide the design or test engineer with the ability to streamline tasks associated with automobiles/sensor configuration. Although individual modules cannot be executed as a stand-alone program, once launched, individual modules will behave in an autonomous fashion. All the functionality of a module is contained within its own user interface, menus and other controls necessary to perform its specific tasks.

Vehicular Configuration Tool Suite Program

The Configuration Tool Suite is a family of configurable software programs that run on a standard desktop computer within the Windows operating system. The software is comprised of one top level Win32 based program including an executable and a user interface, one dynamically loaded library automatically loaded at startup, and at least one, but possibly several other modules, each with its own user interface, that can be installed and run concurrently by a user during a design session. The configuration of the top level executable, or Host Program, refers to the type and number of loadable modules that are installed at any one time. Together, the executable and the loadable modules provide a set of tools enabling engineers to complete the design and testing phases of automotive sensor configurations quicker and more efficiently. This disclosure will discuss process, methods and technology related specifically to a vehicle model development module.

Car Configuration Module

Figure 34:
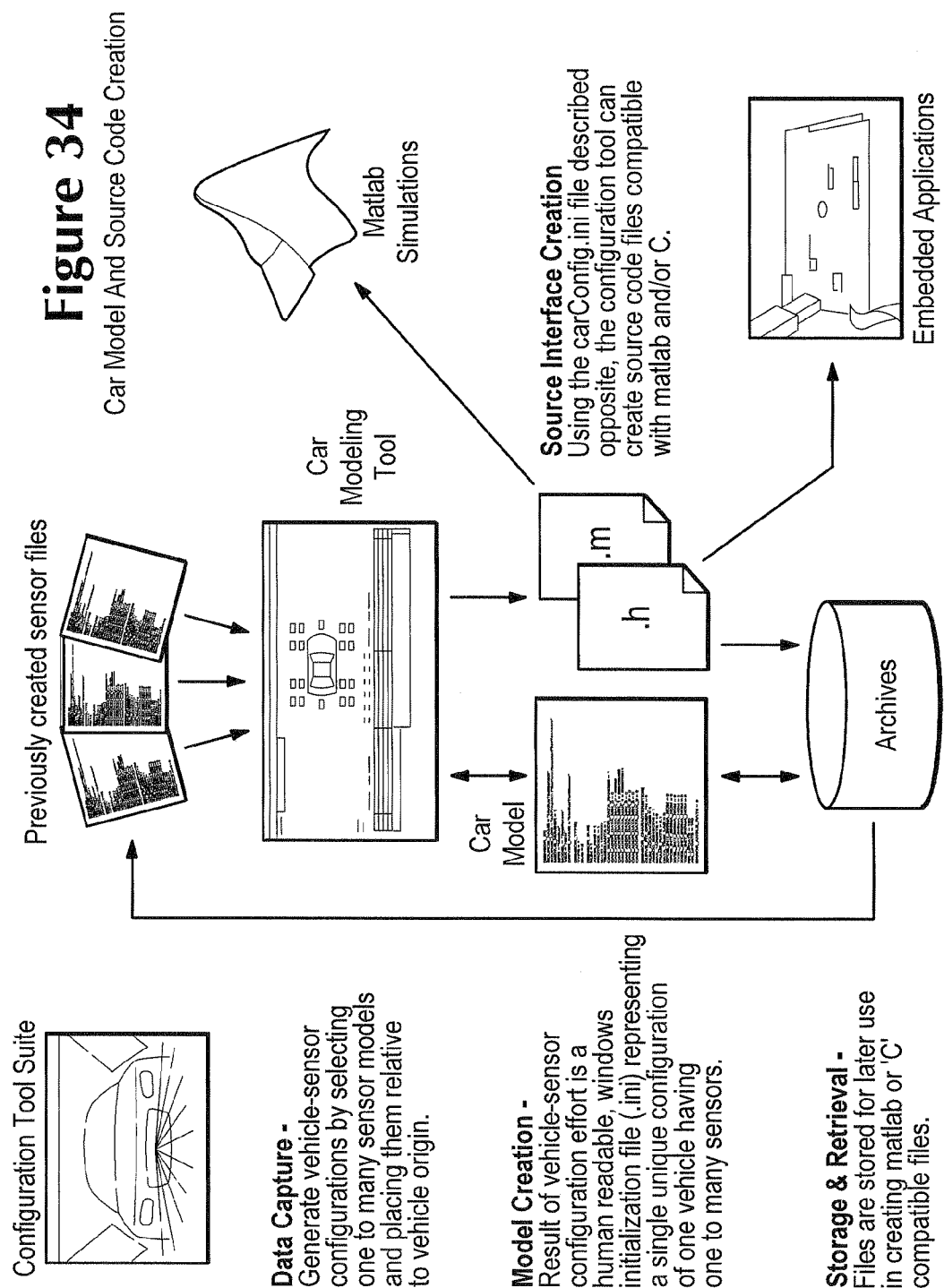
Figure 39:
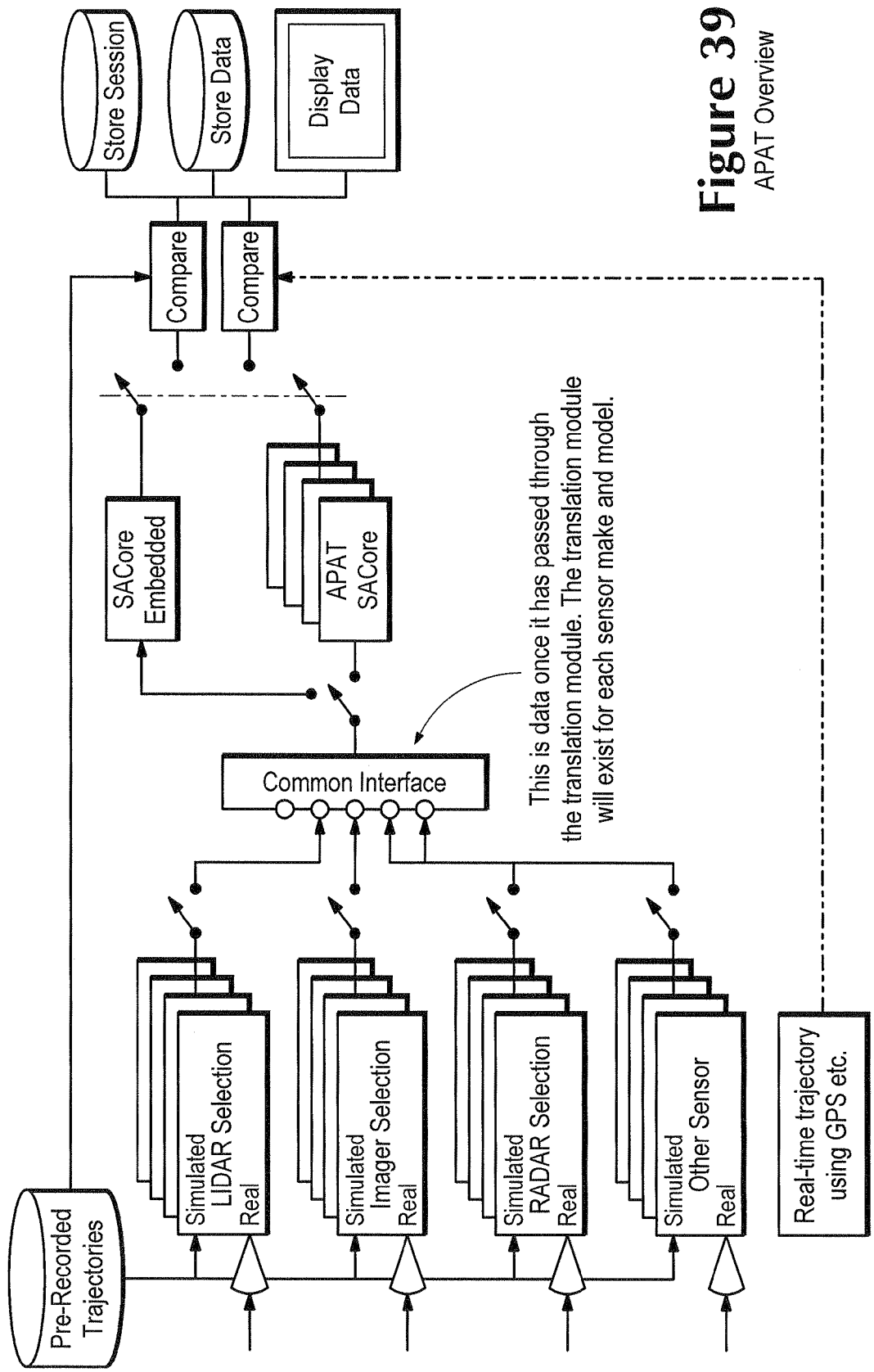
FIG. 39.-42. Describes the APAT Process
Figure 40A:
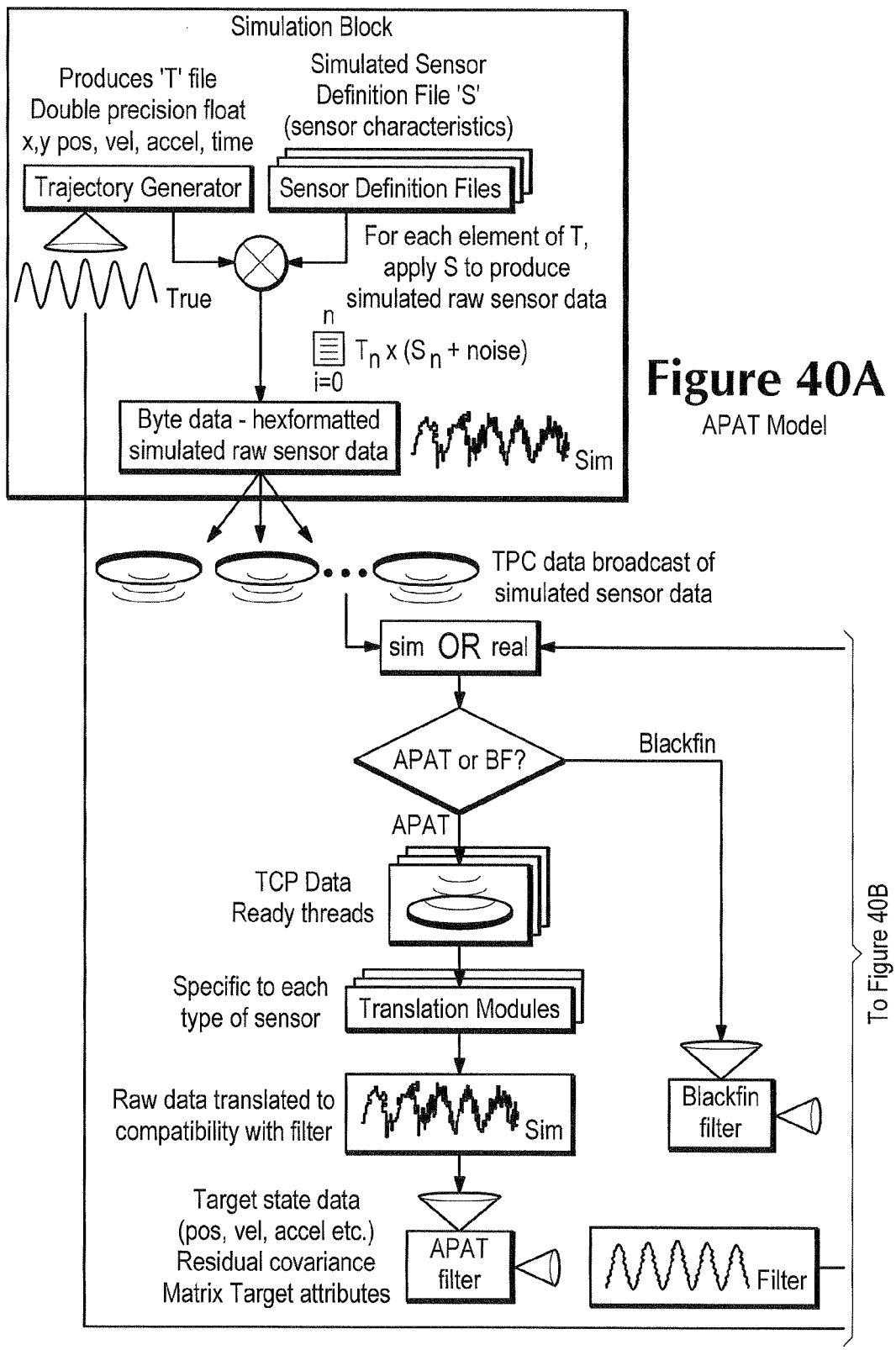
Figure 40B:
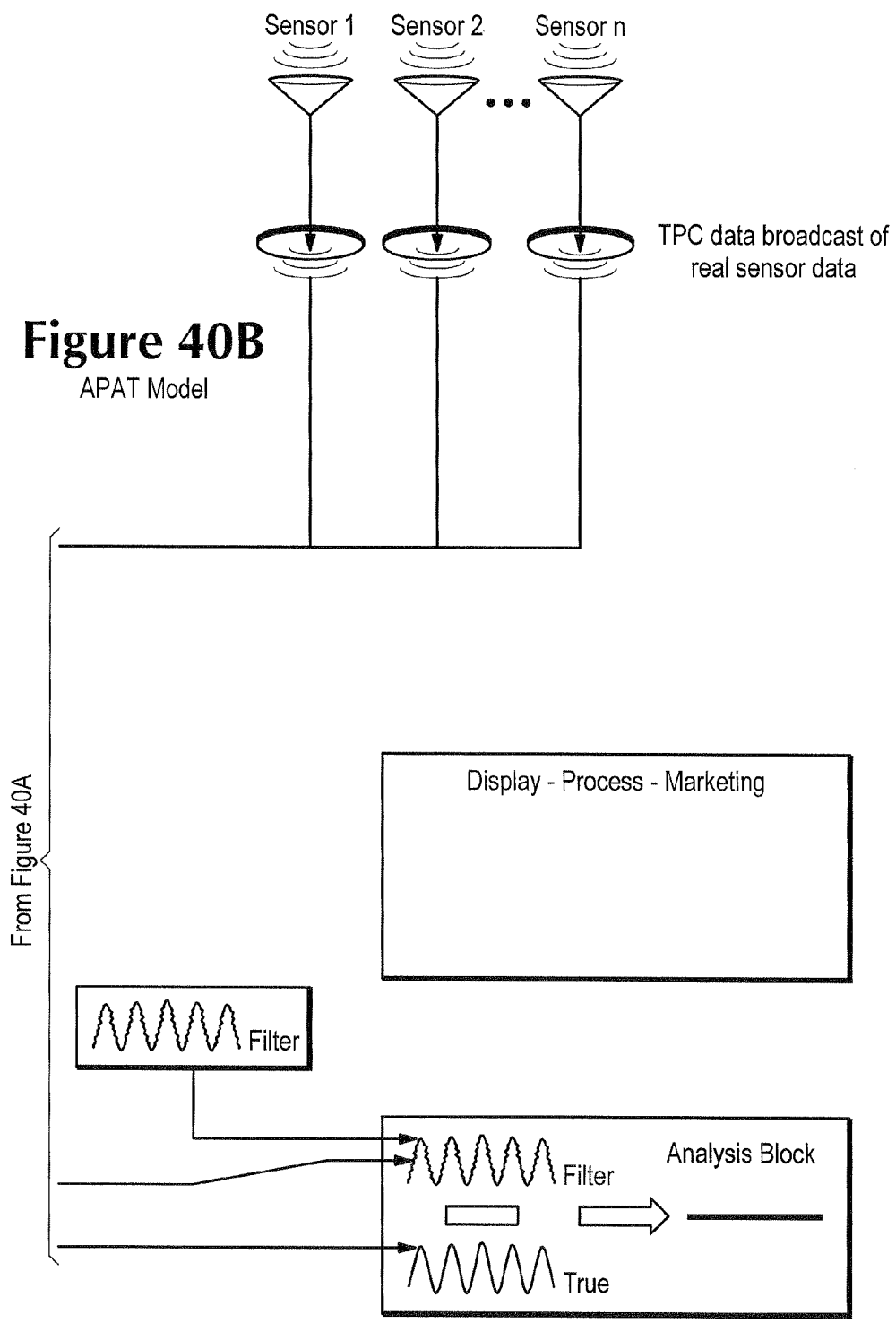
Figure 41:
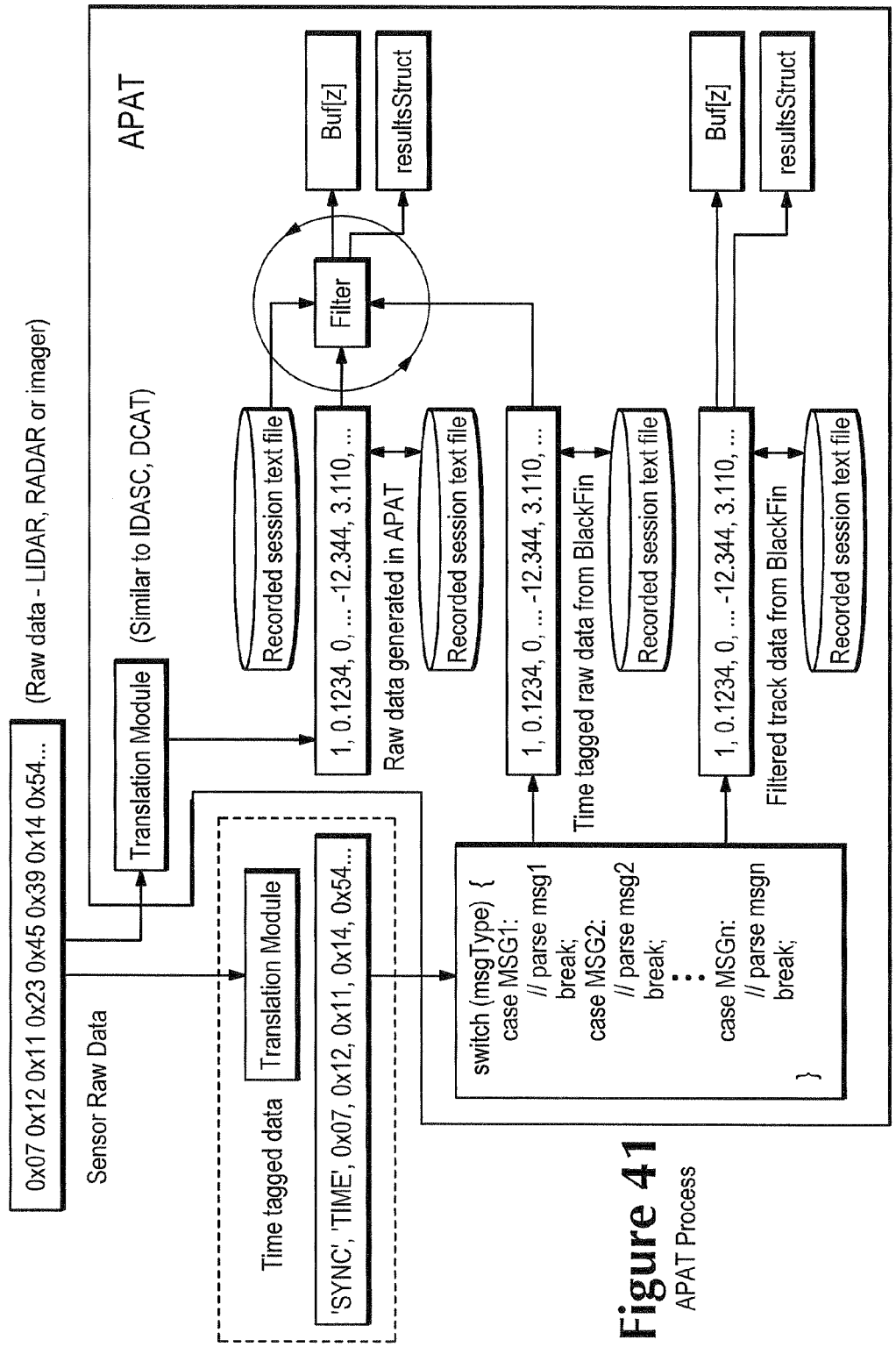
Figure 42:
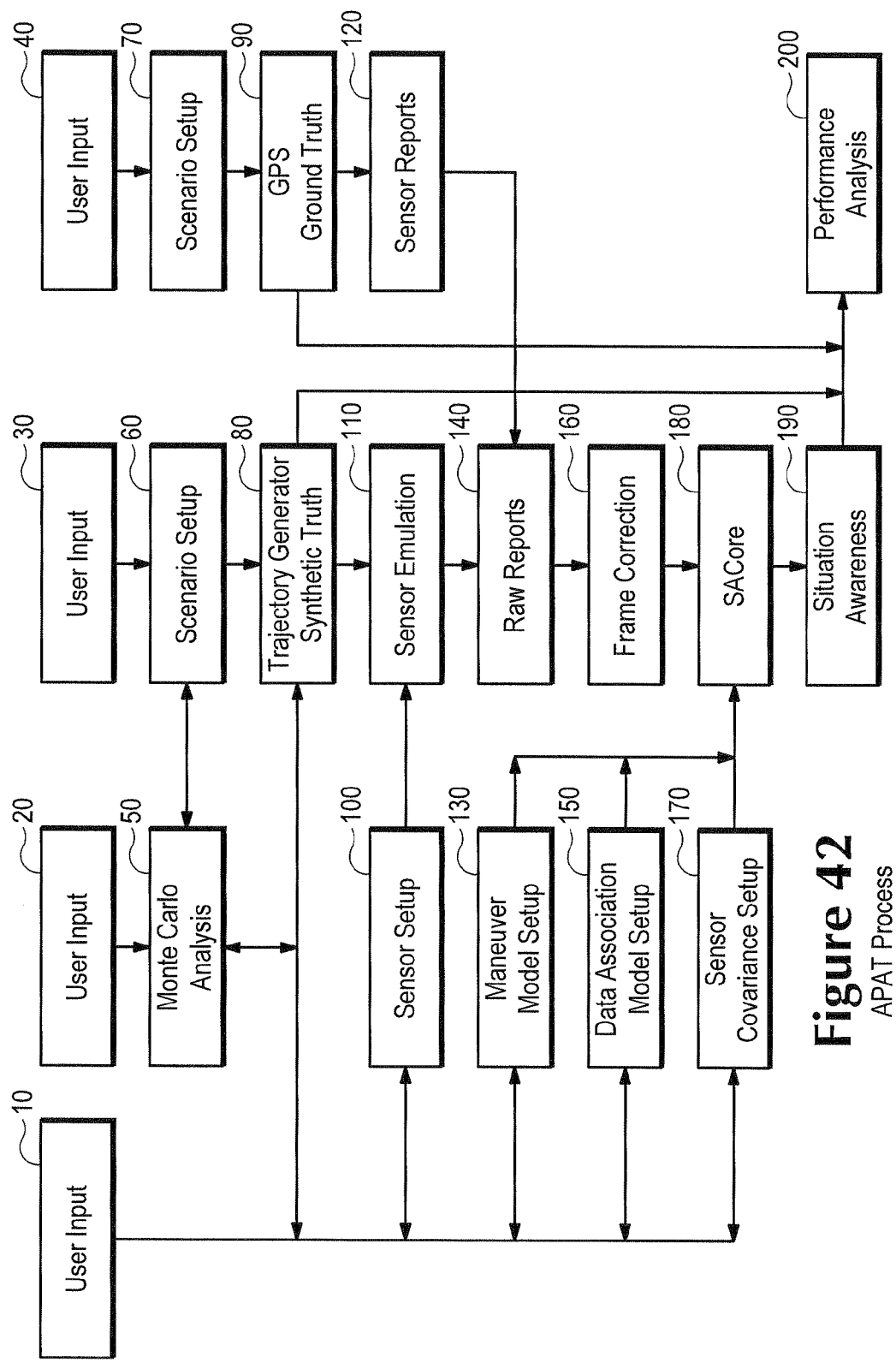

The method and process of capturing and integrating the physical parameters of a car with one too many sensor models is the purpose of the Car Configuration Module. This module is designed to meet these goals by performing three primary tasks: data capture, model creation and Storage/Retrieval of models. (See FIG. 34)

Data Capture

The Car Configuration Module assists the user in capturing the physical measurements and sensor configuration of a car. The car configuration module is designed to guide the data entry process. Automobile parameters such as width, length, height, and wheel base must be entered along with the number and type(s) of sensors including their location and orientation with respect to the car's physical origin. The car configuration module includes pull down menus to assist in sensor selection. The menus are defaulted to a sensor archive location, but can easily be changed to display sensors from other locations on the file system. Once the number and type of sensors have been selected, the user can place them in the desired location on the car using the graphic layout at the top of the car configuration dialog panel. Fine adjustments to placement can be made using the coordinate and orientation text boxes for each sensor.

Note: the default origin of the car (x=0, y=0 z=0) is set to the front center of the front bumper, level with the ground. This however is an arbitrary location set by the default values for car dimensions. The origin can be set to any point in 3 dimensional space by the values entered for the physical dimensions of the car. Therefore the origin does not have to reside within the boundaries describing the car.

Model Creation for a Vehicle

Saving the session results in a file referred to as a car configuration model. (See FIG. 36) This model contains a complete description of the car and the type, location and orientation of its installed sensors. The sensors referenced in the car configuration model are simply pointers to sensor models and are used to access the sensor file from their archived location. Contents are organized into a standardized format called a windows initialization file where the parameters are organized into groups by named sections, and within sections each parameter value is assigned a tag. This structure and organization has many desirable qualities: it is human and machine readable, has a standardized interface with other application software and provides ease of error checking.

Storage & Retrieval

If defaults are used during the save process, the car model will be stored in a protected location referred to as the car model archive. The filename is derived from one of the entries made by the user during data capture. Although location and filename are defaulted, either of these values can be changed by the user during the save process. It is noteworthy that car models are stored as Windows Initialization files having an ".ini" file extension. Although the .ini file type is a human readable text file, car models stored in the car model archive are not accessible except through components of the Configuration Tool Suite. If access to a car model is desired using any other application or text editor, it must be stored in a location other than the archive. These limitations are intended to assist in maintaining the structural integrity (content and fotuiat) of the sensor model for compatibility with use from other design modules. For example, car models can be re-loaded into the Car Configuration Tool for viewing, editing and re-archiving. However, archiving a car model can only be done through the Car Configuration Tool.

Sensor Configuration Tool Suite Host Program

The Configuration Tool Suite is a family of configurable software programs that run on a standard desktop computer within the Windows operating system. The software is comprised of one top level Win32 based program including an executable and a user interface, one dynamically loaded library automatically loaded at startup, and at least one, but possibly several other modules, each with its own user interface, that can be installed and run concurrently by a user during a design session. The configuration of the top level executable, or Host Program, refers to the type and number of loadable modules that are installed at any one time. Together, the executable and the loadable modules provide a set of tools enabling engineers to complete the design and testing phases of automotive sensor configurations quicker and more efficiently. This disclosure will discuss process, methods and technology related specifically to a sensor model development module.

Sensor Modeling Tool [Module]

Figure 33:
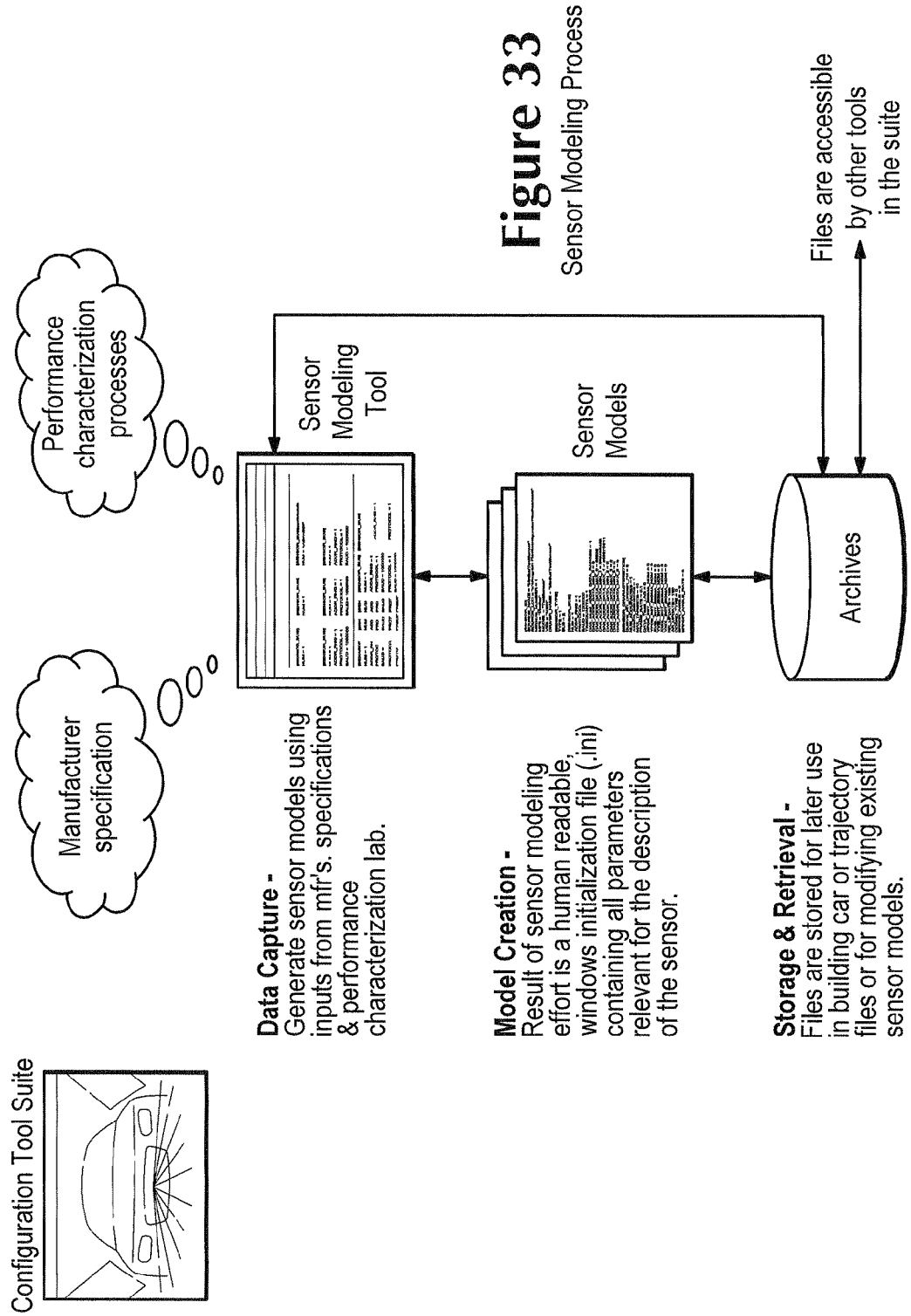
FIG. 33. is an Illustration showing the process of creating and storing a sensor configuration INI file FIG. 34. is an Illustration showing the process of creating and storing a car configuration INI file, and the creation of source code for simulation software such as ANSI C or MATLAB.

The goal of the Sensor Modeling Tool is to capture and prepare data parameters representing a fully characterized sensor for use in modeling activities. It is designed to meet these goals by performing three primary tasks: sensor data capture, sensor model creation and Storage/Retrieval of sensor models. There are two primary sources for the data used to create a sensor model: manufacturer specifications and performance characterization processes. (See FIG. 33)

Data Capture

Rather than entering parameters describing a fully characterized sensor directly into modeling software, or into the source code for an embedded target, they are first captured into the Sensor Configuration Tool. This tool contains data entry dialogs that will steer the data entry process step-by-step. The interface will channel and direct the user's inputs based on a few key initial selections, through the use of pull-down menus, context dependant tabbed panels, visual prompts, and type-specific entry boxes, (e.g. text or numeric) thereby limiting the data entry options to only those items relevant to the type of sensor or type of data bus. Concurrently running check routines are also employed to check data as it is entered for context, limits or missing information and when appropriate, direct the user's attention to specific invalid entries. Although the data entered in some fields may be of a valid type, the context may be incorrect with respect to surrounding data. For that reason additional error checking will be performed when attempting to save a file. If errors exist, the user will be visually directed to each errant field to make the indicated corrections until all data fields contain valid entries. Once data capture is complete, the tool will allow the information to be saved.

Model Creation for a Sensor

The process of saving will result in a file referred to as a sensor model. (see FIG. 35) The sensor model is a complete description of the sensor containing all relevant parameters. The contents of the sensor model are simply those parameters entered by the user during data entry. Contents are organized into a standardized format called a windows initialization file where the parameters are organized into groups by named sections, and within sections each parameter value is assigned a tag. This structure and organization has many desirable qualities: it is human and machine readable, has a standardized interface with other application software and provides ease of error checking. Sensor models are key elements to both the Car Configuration and Scenario Generator tools and will therefore have a direct effect on the results of modeling efforts using files generated by these tools.

Storage & Retrieval

If defaults are used during the save process, the sensor model will be stored in a protected location referred to as the sensor model archive. The filename is derived from one of the entries made by the user during data capture. Although location and filename are defaulted, either of these values can be changed by the user during the save process. It is noteworthy that sensor models are stored as Windows Initialization files having an ".ini" file extension. And although the .ini file type is a human readable text file, sensor models stored in the sensor model archive are not accessible except through components of the Configuration Tool Suite. If access to a sensor model is desired using any other application or text editor, it must be stored in a location other than the archive. These limitations are intended to assist in maintaining the structural integrity (content and format) of the sensor model for compatibility with use from other design modules. For example, sensor models can be re-loaded into the Sensor Configuration Tool for viewing, editing and re-archiving. However, archiving a sensor model can only be done through the Sensor Configuration Tool.

Code Generation Configuration Tool Suite

The Configuration Tool Suite is a family of configurable software programs that run on a standard desktop computer within the Windows operating system. The software is comprised of one top level Win32 based program including an executable and a user interface, one dynamically loaded library automatically loaded at startup, and at least one, but possibly several other modules, each with its own user interface, that can be installed and run concurrently by a user during a design session. The configuration of the top level executable, or Host Program, refers to the type and number of loadable modules that are installed at any one time. Together, the executable and the loadable modules provide a set of tools enabling engineers to complete the design and testing phases of automotive sensor configurations quicker and more efficiently. This disclosure will discuss process, methods and technology related specifically to a source code generation module.

Source Code Module

Sensor and car models created using Configuration Tool Suite are windows initialization files, created for the purpose of storing and retrieving models of configuration data useful in car-sensor modeling in a human readable form. Although Windows initialization files serve well in this capacity, the data they contain are not readily accessible by the application environments used in modeling and simulation. The Source Code Module therefore is a utility that will convert the data included in the .ini files into files native to modeling and simulation tools such as Matlab and ANSI C. At the time of conversion, data is read from a car model .ini file, and from each sensor .ini file pointed to within the car model into the conversion utility. The data is then formatted and written to a file in the syntax of the requested language, such as Matlab or ANSI C. Converted files can be stored in a location of the user's choice, and re-accessed at any time. (See FIGS. 37 & 38) The source code module is scalable and can be configured to include translators for other languages.

Matlab Code Generator

The lists of parameters and values necessary to describe a particular car-sensor configuration to a Matlab simulation are all contained in a model file and must be converted to syntax compatible with Matlab. The method of conversion is performed by a process similar to lexical generation. A complete file will contain a header section, declaration section and an assignment section.

The first section written is the header section. The header section is not required for Matlab syntax, however is used to provide configuration information. The code generator will create strings of text representing the file creation time and date. Additionally, the strings containing source of model files used to create the Matlab file are listed. Each of these is written to the Matlab file as comments, included just after the header section is a single line of Matlab code.

The declaration section contains a function declaration, and each parameter in the model. The first line written in this section is the function declaration. This is simply a hook that allows the Matlab simulator a method to access the information that will be contained in this file. The remainder of the declaration section including its contents and its syntax is preexisting in a header file exactly as it will be written to the Matlab file. This static format is possible because the list of parameters in this section is stable and will not change unless the model requirements in the Matlab simulation change. This section is written just below the function declaration, line by line to the target Matlab file. Each parameter is declared as a global variable.

Next, the assignment section is written. Because the values of the parameters will change often, this section cannot be reproduced in the same way the declaration section is. The purpose of the assignment section is to initialize each declared variable. Within the Source Code Generator, the initialization values and each corresponding variable are read into a data structure designed to contain exactly those parameters. Each parameter listed is an array containing a list of values. The number of values in the list is determined by the number of sensors installed in that model. The algorithms used to read, foiniat and write this section therefore employ recursive routines as necessary to produce each parameter array. Once this section is written, the file is complete.

ANSI C Source Code Generator

The lists of parameters and values necessary to describe a particular car-sensor configuration to an ANSI C simulation are all contained in a model file and must be converted to syntax compatible with ANSI C. The method of conversion is performed by a combination of processes including lexical generation, data type conversions, file characterization and depiction. Using these techniques, a complete file will be created containing a header section, declaration section and an assignment section.

The first section written to the ANSI C file is the header section. The header section is a commented section of text, not required to comply with ANSI C syntax, and is used to provide information on the content of the file. The code generator will create strings of text representing the file creation time and date along with the strings containing a list of model files used in creating the ANSI C file.

The declaration section contains many types of variable definitions including #define, #pragma, typedef, enum, char, static int, and typedef struct. The contents of this section pre-exist in a template called sample.h included in the Configuration Tools directories. The template contains some of the content of an actual project header file and contains the variable definitions and structure definitions necessary to define and create the subject model. A section of the template is read line-by-line into memory, and then written line-by-line to the target file, preserving the syntax of the text exactly. Once all of the declarations are made, values assignments are made.

The last structure to be declared in this section is CT_VEHICLE. The members of this data structure represent all of the previously defined structures and variables in the file, and therefore represent all parameters necessary to fully describe the model being converted. With the creation of this data structure, the items written to the declaration section are an exact re-production of the data structures used in the modeling modules to contain all model parameters.

Assignment is accomplished by reading data through a pointer to the data structure byte by byte, and writing these values out as initialization elements to a new variable declared as:

BYTE variable [sizeof (CT_VEHICLE)]={ ... };

Where "sizeof (CT_VEHICLE)" is the number of bytes contained in CT_VEHICLE.

Where " ... " represents sizeof (CT_VEHICLE) comma delimited data elements, each one (1) byte in size. This statement concludes the contents of the ANSI C header file.

By including contents of this header file, into an ANSI C program, an entire structure, identical to the one described above can be defined and initialized with the model parameter values. Access to the parameter values is accomplished as shown below;

```
#include "header.h"
CT_VEHICLE *new_struct; //CT_VEHICLE fully defined in header.h
some_Junction {
...
    new_struct=(CT_VEHICLE *) variable;
...
}
```

In this ANSI C code section, all of the contents of header.h are included. A new copy of CT_VEHICLE is declared as new_struct and new_struct is initialized by setting it equal to the contents of variable, type cast to (CT_VEHICLE *).

The systems described above can use dedicated processor systems, micro controllers, programmable logic devices, or microprocessors that perform some or all of the operations. Some of the operations described above may be implemented in software and other operations may be implemented in hardware.

For the sake of convenience, the operations are described as various interconnected functional blocks or distinct software modules. This is not necessary, however, and there may be cases where these functional blocks or modules are equivalently aggregated into a single logic device, program or operation with unclear boundaries. In any event, the functional blocks and software modules or described features can be implemented by themselves, or in combination with other operations in either hardware or software.

Having described and illustrated the principles of the invention in a preferred embodiment thereof, it should be apparent that the invention may be modified in arrangement and detail without departing from such principles. Claim is made to all modifications and variation coming within the spirit and scope of the following claims.

The invention claimed is:

1. A model development system to guide creation and integration of models used in automotive simulation algorithms, comprising:
  a computer with an executable program, wherein the executable program comprises at least one of:
    a. a scalable top level application including a user interface,
    b. a module manager enabling at least one of installing modules, uninstalling modules and viewing current module configuration,
    c. memory management;
  software modules comprising at least one of a vehicle modeling module, a sensor modeling module, a scenario generation module, and automatic source code generation, wherein the software modules are collocated with and accessible to the top level application.

2. The system according to claim 1 wherein the models used in automotive simulation algorithms comprise one of a machine readable file and human readable file.

3. The system according to claim 1 wherein the models used in automotive simulation algorithms comprise parameters used for vehicle safety systems.

4. The system according to claim 3 wherein the automotive simulation algorithms comprise at least one of, spatial alignment, temporal alignment, track association, clutter rejection, target vehicle kinematics, host vehicle kinematics, error analysis, and covariance term generation.

5. The system according to claim 1 wherein the models used in automotive simulation algorithms comprise at least one of parameters describing an automotive vehicle, parameters describing an automotive sensor, parameters describing a simulated driving scenario, and wherein parameters are arranged in hierarchical lists of tag value pairs.

6. The system according to claim 1 wherein the model development system comprises at least one of conversion of sensor parameters into a sensor model, conversion of vehicle parameters into a vehicle model, and conversion of scenario parameters into a scenario model.

7. The system according to claim 1 wherein the model development system includes procedures in the executable program that directs a user through the steps necessary to create simulation models, wherein steps comprise at least one of inputting specification data, retrieving specification data, processing specification data, generating discrete models, and generating compound models from multiples of discrete models.

8. The system according to claim 1 wherein the creation and integration of models comprises the logical set of steps contained in the executable program necessary to process specification data into a model comprising at least one of combining one or more discrete parameters to form a model, combining two or more discrete models to form a complex model and combining one or more discrete and or complex models to create a scenario and wherein the models include at least one of sensor models, automotive models and scenario models.

* * * * *